United States Patent
Shimoda et al.

(10) Patent No.: US 9,896,546 B2
(45) Date of Patent: Feb. 20, 2018

(54) RESIN COMPOSITION, LAYERED PRODUCT, MULTILAYER PRINTED WIRING BOARD, MULTILAYER FLEXIBLE WIRING BOARD AND MANUFACTURING METHOD OF THE SAME

(71) Applicant: ASAHI KASEI E-MATERIALS CORPORATION, Tokyo (JP)

(72) Inventors: Koichiro Shimoda, Tokyo (JP); Yasuhito Iizuka, Tokyo (JP); Masaki Yamamoto, Tokyo (JP); Yoro Sasaki, Tokyo (JP); Hiroaki Adachi, Maebashi (JP); Shuji Kashiwagi, Nagoya (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 286 days.

(21) Appl. No.: 14/373,218

(22) PCT Filed: Jan. 18, 2013

(86) PCT No.: PCT/JP2013/050978
§ 371 (c)(1),
(2) Date: Jul. 18, 2014

(87) PCT Pub. No.: WO2013/108890
PCT Pub. Date: Jul. 25, 2013

(65) Prior Publication Data
US 2015/0027754 A1  Jan. 29, 2015

(30) Foreign Application Priority Data

Jan. 20, 2012 (JP) ................ 2012-010515
Mar. 27, 2012 (JP) ................ 2012-071172
Nov. 16, 2012 (JP) ................ 2012-252578

(51) Int. Cl.
| | |
|---|---|
| C08G 73/10 | (2006.01) |
| C08K 5/353 | (2006.01) |
| C08L 79/08 | (2006.01) |
| B32B 27/28 | (2006.01) |
| C08G 18/58 | (2006.01) |
| C08G 18/61 | (2006.01) |
| C08G 18/73 | (2006.01) |
| H05K 1/03 | (2006.01) |
| H05K 3/46 | (2006.01) |
| H05K 1/02 | (2006.01) |
| H05K 1/11 | (2006.01) |
| H05K 3/00 | (2006.01) |
| H05K 3/42 | (2006.01) |

(52) U.S. Cl.
CPC ........ C08G 73/1075 (2013.01); B32B 27/281 (2013.01); C08G 18/58 (2013.01); C08G 18/61 (2013.01); C08G 18/73 (2013.01); C08G 73/106 (2013.01); C08G 73/1042 (2013.01); C08G 73/1053 (2013.01); C08G 73/1071 (2013.01); C08K 5/353 (2013.01); C08L 79/08 (2013.01); H05K 1/0201 (2013.01); H05K 1/0298 (2013.01); H05K 1/0346 (2013.01); H05K 1/115 (2013.01); H05K 1/118 (2013.01); H05K 3/0064 (2013.01); H05K 3/4655 (2013.01); H05K 1/0393 (2013.01); H05K 3/427 (2013.01); H05K 2201/0154 (2013.01); H05K 2201/051 (2013.01); Y10T 428/31681 (2015.04); Y10T 428/31721 (2015.04)

(58) Field of Classification Search
CPC ................................. C08G 73/1075
See application file for complete search history.

(56) References Cited

U.S. PATENT DOCUMENTS

| | | | |
|---|---|---|---|
| 6,372,859 B1 | 4/2002 | Sakata et al. | |
| 6,596,893 B2 | 7/2003 | Nakacho et al. | |
| (Continued) | | | |

FOREIGN PATENT DOCUMENTS

| | | |
|---|---|---|
| JP | 10-330616 A | 12/1998 |
| JP | 11-246777 A | 9/1999 |
| | (Continued) | |

OTHER PUBLICATIONS

International Search Report issued in PCT/JP2013/050978, dated Apr. 23, 2013.
International Preliminary Report on Patentability and English translation of Written Opinion dated Jul. 31, 2014, in PCT International Application No. PCT/JP2013/050978.

*Primary Examiner* — Megan McCulley
(74) *Attorney, Agent, or Firm* — Birch, Stewart, Kolasch & Birch, LLP

(57) ABSTRACT

A resin composition containing (A) a polyimide having acidic functional groups and (B) a compound having functional groups that react with the acidic functional groups, where (a) a solution rate in 3 mass % aqueous sodium hydroxide at 45° C. is 0.95 or more after a heat history of 90° C. for 10 minutes with the solution rate before the heat history assumed to be 1, (b) the solution rate in 3 mass % aqueous sodium hydroxide at 45° C. ranges from 0.001 μm/sec to 0.02 μm/sec after the heat history of 180° C. for 60 minutes, (c) a bleed-out amount is 50 mg/m$^2$ or less in storing at 40° C. for 2 weeks after the heat history of 180° C. for 60 minutes, and (d) a thermogravimetric decrease at 260° C. is 2.0% or less in measuring on a temperature rising condition of 10° C./min from 40° C. by thermogravimetric analysis (TG). When a multilayer flexible wiring board is manufactured using the resin composition, it is possible to obtain the resin layer excellent in alkali processability, embeddability in press, heat resistance, bendability, insulation reliability, and adhesion to the conductive layer.

21 Claims, 5 Drawing Sheets

(56) References Cited

U.S. PATENT DOCUMENTS

| | | |
|---|---|---|
| 7,682,691 B2 | 3/2010 | Akaho et al. |
| 7,754,803 B2 | 7/2010 | Fujiwara et al. |
| 8,063,245 B2 | 11/2011 | Okada et al. |
| 2001/0009936 A1* | 7/2001 | Suzuki .................. C08G 77/34 524/35 |
| 2003/0082925 A1* | 5/2003 | Yano ..................... G03F 7/0387 438/778 |
| 2010/0193967 A1* | 8/2010 | Takamoto ........... H01L 21/6835 257/778 |
| 2011/0244229 A1* | 10/2011 | Ishiguro .................. C08K 5/20 428/355 AC |

FOREIGN PATENT DOCUMENTS

| | | |
|---|---|---|
| JP | 2001-264980 A | 9/2001 |
| JP | 2002-114981 A | 4/2002 |
| JP | 2003-124603 A | 4/2002 |
| JP | 2003-179321 A | 6/2003 |
| JP | 2004-176031 A | 6/2004 |
| JP | 2005-251895 A | 9/2005 |
| JP | 2006-057099 A | 3/2006 |
| JP | 2007-192936 A | 8/2007 |
| JP | 2008-12918 A | 1/2008 |
| JP | 2008-260907 A | 10/2008 |
| JP | 2009-258367 A | 11/2009 |
| JP | 2010-083951 A | 4/2010 |
| JP | 2011-165889 A | 8/2011 |
| JP | 2011-228493 A | 11/2011 |
| JP | 2011-236315 A | 11/2011 |
| JP | 2012-015465 A | 1/2012 |
| JP | 2012-169346 A | 9/2012 |
| WO | WO 2005/019231 A1 | 3/2005 |
| WO | WO 2012/098734 A1 | 7/2012 |

* cited by examiner

RESIN COMPOSITION, LAYERED PRODUCT, MULTILAYER PRINTED WIRING BOARD, MULTILAYER FLEXIBLE WIRING BOARD AND MANUFACTURING METHOD OF THE SAME

TECHNICAL FIELD

The present invention relates to a resin composition, layered product, multilayer printed wiring board, multilayer flexible wiring board and manufacturing method of the same.

BACKGROUND ART

In recent years, polyimides excellent in heat resistance have been used as surface protective films of semiconductor devices, interlayer insulating films, bonding sheets, protective insulating films for printed wiring boards and substrates for printed wiring boards. Further, with thinning and miniaturization of electronic• electric equipment, in the printed wiring board, it is required to package electronic parts and the like high densely. Therefore, required is processing for enabling continuity to be high densely made between conductive layers of the printed wiring board.

Generally, in a manufacturing process of the printed wiring board, via holes and through holes are formed by NC drilling, plasma etching, laser drilling, punching or the like, and plating is applied to the formed via holes and through holes to be continuity between conductive layers. However, in laser drilling used in the case of performing fine processing, it is necessary to form via holes and through holes on a hole-by-hole basis. Therefore, the need makes continuous production by the roll-to-roll method difficult, and is a significant obstacle also in terms of reduction in costs and improvement in productivity.

On the other hand, it is proposed to dissolve and remove polyimide used as an interlayer insulating film by chemical etching to form via holes and through holes. Chemical etching is suitable for processing by the roll-to-roll method. However, a strong reducing agent such as hydrazine needs to be used in chemical etching of polyimide, and inhibits popularization.

Further, generally, polyimide is low in solubility in aqueous sodium hydroxide generally used in the manufacturing process of the printed wiring board. Therefore, the etching rate of chemical etching is not sufficient, and is a significant obstacle in terms of reduction in costs and improvement in productivity. In order to improve solubility in alkali solution, proposed are adhesive compositions using polyimide having alkali soluble functional groups and oxazoline compound (for example, see Patent Document 1).

PRIOR ART DOCUMENT

Patent Document

[Patent Document 1] Japanese Unexamined Patent Publication No. 2008-260907

DISCLOSURE OF INVENTION

Problems to be Solved by the Invention

However, in an adhesive composition as described in Patent Document 1, a crosslinking reaction between an alkali soluble functional group of polyimide and an oxazoline compound proceeds at low temperatures. Therefore, after applying a solution of the adhesive composition of Patent Document 1 to provide a resin composition layer, by heating in removing a solvent from the resin composition layer, a thermoplastic resin and the oxazoline compound react to decrease alkali solubility, and there is the problem decreases in the etching rate.

The present invention was made in view of such a respect, and it is an object of the invention to provide a resin composition allowed to obtain a resin composition layer and resin cured material layer excellent in alkali processability, embeddability in press, heat resistance, bendability, insulation reliability, adhesion to a conductive layer and the like. Further, it is another object of the invention to provide a layered product and multilayer printed wiring board provided with the resin composition layer. Furthermore, it is still another object of the invention to provide a multilayer printed wiring board permitting thin plating. Still furthermore, it is still another object of the invention to provide a multilayer flexible wiring board good in bending mountability and excellent in smoothness of the resin composition layer on a wiring circuit and via holes, and a manufacturing method thereof.

Means for Solving the Problem

A resin composition according to the present invention is a resin composition containing (A) a polyimide having acidic functional groups and (B) a compound having functional groups that react with the acidic functional groups, and is characterized in that (a) a solution rate of the resin composition in 3 mass % aqueous sodium hydroxide at 45° C. is 0.95 or more after a heat history of 90° C. for 10 minutes with the solution rate before the heat history assumed to be 1, (b) the solution rate of the resin composition in 3 mass % aqueous sodium hydroxide at 45° C. ranges from 0.001 μm/sec to 0.02 μm/sec after a heat history of 180° C. for 60 minutes, (c) a bleed-out amount of the resin composition is 50 mg/m² or less in storing at 40° C. for 2 weeks after the heat history of 180° C. for 60 minutes, and that (d) a thermogravimetric decrease at 260° C. is 2.0% or less in measuring on a temperature rising condition of 10° C./min from 40° C. by thermogravimetric analysis (TG).

The resin composition according to the invention is characterized by containing (A-1) a polyimide having a structure expressed by following general formula (1) as a polyimide having phenolic hydroxyl groups, and (B-1) an oxazoline compound.

[Chemistry 1]

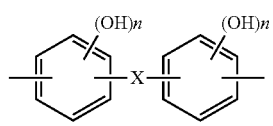

formula (1)

(In formula (1), X represents a single bond or —C(CF$_3$)$_2$—, and n represents an integer of from 1 to 4.)

A multilayer printed wiring board according to the invention is a multilayer printed wiring board obtained by removing, in a layered product provided with a first conductive layer, a resin composition layer provided on a surface of the first conductive layer, and a second conductive layer provided on a surface of the resin composition layer, apart of the second conductive layer to form an opening portion, removing the resin composition layer exposed to the opening portion by etching using an alkali solution using the second conductive layer with the opening portion formed as a mask, forming a via hole formed in the resin composition layer so that apart of the first conductive layer is exposed, and applying plating to the surface of the second conductive layer including the inside of the via hole, and is characterized in that in observing a perpendicular cross section of the via hole, a horizontal distance x from an end surface of the second conductive layer on the inner side of the opening portion to an end portion of the via hole on the second conductive layer side ranges from −30 μm to 0 μm, a horizontal distance y from the end surface of the second conductive layer on the inner side of the opening portion to an end portion of the via hole on the first conductive layer side ranges from −10 μm to 20 μm, and that in TOF-SIMS measurement of the perpendicular cross section of the via hole, in the resin composition layer forming a side wall surface of the via hole, a thickness T in the horizontal direction is 10 μm or more from the side wall surface of a resin modified portion in which a total residual concentration of alkali metal ions contained in the alkali solution is 50 ppm or more.

A multilayer flexible wiring board according to the invention is a multilayer flexible wiring board formed by laminating an outer layer substrate provided with an outer conductive layer, and a single resin cured material layer formed on a surface of the outer conductive layer on a core substrate comprised of a double-sided flexible substrate with a wiring circuit or a via hole formed so that the resin cured material layer is disposed on the surface side of the core substrate, and is characterized in that a flexible portion is formed by removing apart of the outer conductive layer, a repulsive force ranges from 0.001 N/mm to 0.5 N/mm in the flexible portion when the multilayer flexible wiring board is bent with curvature R of 0.5 mm, a surface concavo-convex amount of the resin cured material layer is 5 μm on the wiring circuit formed in the core substrate or on an opening portion of the via hole, a bleed-out amount on a surface of the resin cured material layer is 50 mg/m² or less in storing at 40° C. for 2 weeks after a heat history of 180° C. for 60 minutes, and that a thickness of the resin cured material layer on the wiring circuit ranges from 5 μm to 40 μm.

A method of manufacturing a multilayer flexible wiring board according to the invention is a method of manufacturing a multilayer flexible wiring board provided with a step of overlapping an outer layer substrate provided with an outer conductive layer and a resin composition layer formed on a surface of the outer conductive layer, and a core substrate comprised of a double-sided flexible substrate with a wiring circuit and a via hole formed so that the resin composition layer is disposed on the surface side of the core substrate, and a step of heating and pressurizing the overlapped outer layer substrate and core substrate on predetermined lamination conditions to laminate, and is characterized in that a vacuum laminator apparatus that has a rubber substrate integrated with a reinforcing material and that is allowed to pressurize and heat is used in the step of laminating the outer layer substrate and the core substrate, and that a resin flow amount from a vicinity of the outer conductive layer ranges from 0.001 mm to 1 mm on the lamination conditions that a temperature is in a range of 70° C. to 180° C. and that a pressure is in a range of 0.3 MPa to 3 MPa.

Advantageous Effect of the Invention

According to the present invention, it is possible to provide the resin composition, resin composition solution, layered product and multi layer printed board excellent in alkali processability, embeddability in press, heat resistance, bendability, insulation reliability, adhesion to the conductive layer and the like.

Further, according to the invention, it is possible to provide the multilayer printed wiring board permitting thin plating.

Furthermore, according to the invention, it is possible to provide the multilayer flexible wiring board good in bending mountability and excellent in smoothness of the resin composition layer on the wiring circuit and via hole.

Still furthermore, according to the invention, it is possible to provide the method of manufacturing a multilayer flexible wiring board for enabling surface smoothness of the resin composition layer to be improved.

BEST MODE FOR CARRYING OUT THE INVENTION

Figure 1A:
FIGs. 1A, 1B, 1C, and 1D contain cross-sectional schematic diagrams illustrating each step of a method of manufacturing a double-sided flexible board according to this Embodiment.

One Embodiment (hereinafter, referred to as "Embodiment") of the present invention will specifically be described below with reference to accompanying drawings. In addition, the present invention is not limited to the following Embodiments, and is capable of being carried into practice with modifications thereof within the scope of the subject matter.

A method of manufacturing a wiring board according to this Embodiment will specifically be described with reference to accompanying drawings. First, a method of manufacturing a double-sided flexible wiring board 10 will be described with reference to FIG. 1. FIG. 1 contains cross-sectional schematic diagrams illustrating each step of the method of manufacturing a double-sided flexible wiring board according to this Embodiment. In the method of manufacturing the double-sided flexible wiring board 10, a layered product 11 is used (see FIG. 1A). The layered product 11 is provided with a conductive layer 12a (for example, copper foil F2-WS (12 μm)), and a resin composition layer 14 (for example, thickness 12.5 μm), provided on the conductive layer 12a, having a resin composition containing an alkali soluble resin as described above according to this Embodiment.

The layered product 11 is manufactured by applying a resin composition according to this Embodiment dissolved in an organic solvent onto the conductive layer 12a, and then, heating at 95° C. for 12 minutes to dry and remove the organic solvent contained in the resin composition layer 14.

Figure 1B:
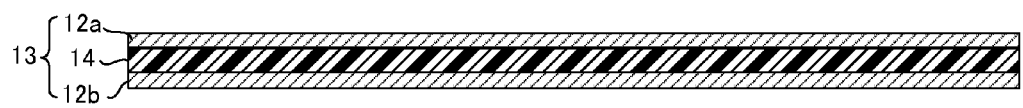
Figure 1C:
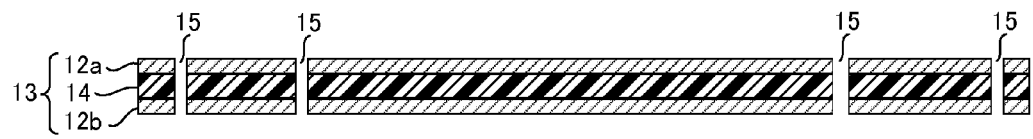
Figure 1D:

Next, a layered product 13 is obtained by a method of vacuum pressing the conductive layer 12b against the resin composition layer 14 of the layered product 11, for example, on conditions of 100° C., 1 minute and 4 MPa (see FIG. 1B). Next, photosensitive resist layers are formed on the conductive layers 12a, 12b of the layered product 13, and parts of the conductive layers 12a, 12b are removed by exposure • development of the resist layers and etching of the conductive layers 12a, 12b to form conformal masks. Next, the resin composition layer 14 exposed in etching areas of the conductive layers 12a, 12b are dissolved and removed with an alkali solution via the conformal masks to form through holes 15, and the resist layers are peeled off (see FIG. 1C).

Next, acid cleaning is formed, then the resultant is heated using a cure drying oven, for example, at 180° C. for 1 hour, and the resin composition layer 14 is thereby thermally cured to be a resin cured material layer 16.

Next, after attaching carbon black to an inner wall of the through hole 15, the conductive layers 12a, 12b are electrically connected by a method of applying electrolysis plating or the like. Next, patterning is performed on the conductive layers 12a, 12b by a subtractive method or the like to perform circuit formation, and the double-sided flexible wiring board 10 is manufactured (see FIG. 1D).

Next, a method of manufacturing a multilayer flexible wiring board 1 will be described with reference to FIG. 2. FIG. 2 contains cross-sectional schematic diagrams illustrating each step of the method of manufacturing a multilayer flexible wiring board according to this Embodiment. In the method of manufacturing a multilayer flexible wiring board 1 is used the double-sided flexible wiring board 10 obtained by the manufacturing method as shown in FIG. 1 (see FIG. 2A). In addition, herein, a commercially available double-sided copper-clad laminate board (ESPANEX M (Registered Trademark): thickness of the insulation layer 25 μm, made by Nippon Steel Chemical Co., Ltd.) may be used. The double-sided flexible wiring board 10 is provided with the resin cured material layer 16, and a pair of conductive layers (copper foil) 12a, 12b provided on both main surfaces of the resin cured material layer 16.

Figure 2A:
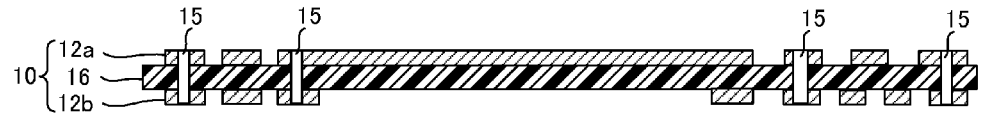
FIGs. 2A, 2B, 2C, 2D, 2E, and 2F contain cross-sectional schematic diagrams illustrating each step of a method of manufacturing a multilayer flexible wiring board according to this Embodiment.
Figure 2B:
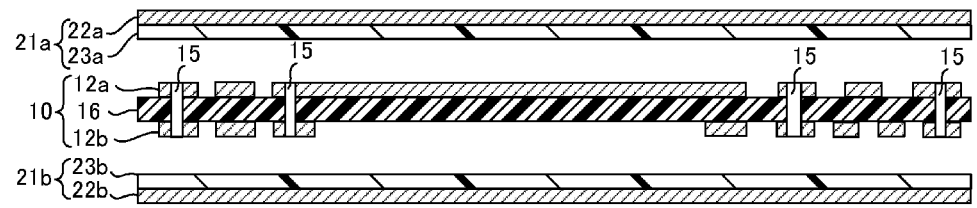
Figure 2C:
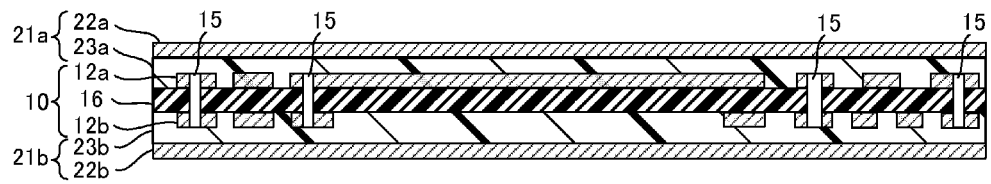

First, outer layer substrates 21a, 21b are layered on the conductive layers 12a, 12b (see FIG. 2B). The outer layer substrates 21a, 21b are provided with conductive layers 22a, 22b (copper foil: F2-WS (18 μm), made by Furukawa Circuit Foil Co., Ltd.), and resin composition layers 23a, 23b provided by applying adhesive resin varnish containing a resin composition according to this Embodiment and organic solvent onto the conductive layers 22a, 22b and removing the organic solvent.

The outer layer substrates 21a, 21b are layered on the double-sided flexible wiring board 10, for example, by a method of vacuum pressing on conditions of 100° C., 1 minute and 4 MPa (see FIG. 1B). By this means, the resin composition layers 23a, 23b are provided on the conductive layers 12a, 12b of the double-sided flexible wiring board 10, and the conductive layers 22a, 22b are successively layered on the resin composition layers 23a, 23b, respectively (see FIG. 2C).

In the layering process, heating is performed on the condition such that curing of the resin composition layers 23a, 23b do not proceed (for example, 100° C. for about 2 minutes) to melt the resin composition layers 23a, 23b, and the layers 23a, 23b are embedded in between a circuit pattern of the conductive layers 22a, 22b and are crimped. Further, a vacancy inside the through hole 15 formed in the double-sided flexible wiring board 10 may be beforehand filled completely with electrolysis plating, conductive paste, and insulation resin for embedding, and alternatively, can be filled with the resin composition layers 23a, 23b in layering. In this case, when melting of the resin is insufficient in press, there is a possibility that voids occur inside the hole. The degree of difficulty in filling the through hole 15 with the resin is dependent on the aspect ratio defined by the total thickness/hole diameter of the double-sided flexible wiring board 10, and in the resin composition according to this Embodiment, it is possible to fill the through hole 15 with the aspect ratio of 0.5 or more.

Next, photosensitive resist layers (not shown) are formed on the conductive layers 22a, 22b, and parts of the conductive layers 22a, 22b are removed by exposure • development of the resist layers and etching of the conductive layers 22a, 22b to form conformal masks. Next, the resin composition layers 23a, 23b exposed in etching areas of the conductive layers 22a, 22b are dissolved and removed with an alkali solution via the conformal masks to form via holes 24, and the resist layers are peeled off (see FIG. 2D).

Next, using a cure drying oven, the resultant is heated, for example, at 180° C. for 1 hour, and the resin composition layers 23a, 23b are thereby thermally cured to be resin cured material layers 31a, 31b.

Next, plating or the like is applied to the resin cured material layers 31a, 31b on the inner walls of the via holes 24 to electrically connect between the conductive layer 12a and the conductive layer 22a, and between the conductive layer 12b and the conductive layer 22b.

Figure 2D:
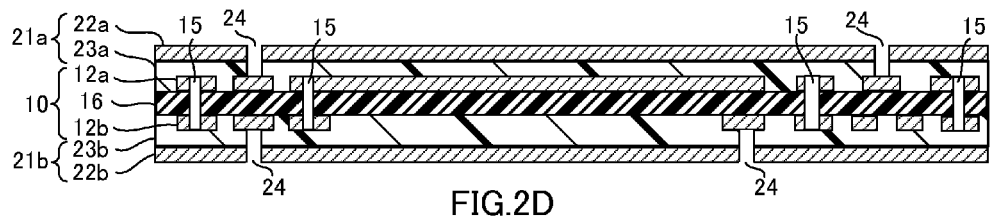
Figure 2E:
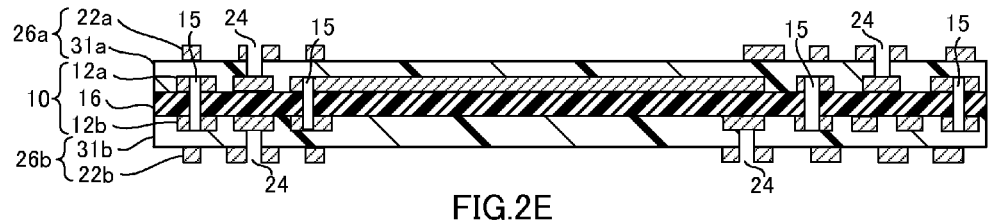

Next, patterning is performed on the conductive layers 22a, 22b by the subtractive method or the like to perform circuit formation (see FIG. 2E). Next, surface treatment is performed such as formation of cover coats 25, and the multilayer flexible wiring board 1 is manufactured (see FIG. 2F).

Further, it is possible to use the resin composition according to this Embodiment as a surface protective film of a flexible wiring board, and excellent insulation properties are obtained. It is possible to obtain the surface protective film according to this Embodiment by thermally curing the resin composition layers provided by applying and curing a solution of the resin composition onto the conductive layers 12a, 12b of the above-mentioned double-sided flexible wiring board 10 or onto the conductive layers 22a, 22b of the multilayer flexible wiring board 1. Further, in this surface protective film, by treating with an alkali solution before heat curing, it is also possible to remove an unnecessary surface protective film.

In the case of using the resin composition according to this Embodiment for a surface protective film, it is preferable that a film thickness of the surface protective film ranges from 1 μm to 50 μm. This is because handling is made ease when the film thickness is 1 μm or more, and the film is easy to bend and assemble when the film thickness is to 50 μm or less.

According to the resin composition according to this Embodiment, since the composition contains an alkali soluble resin, it is possible to perform via hole processing of blind via, through hole or the like, for example, using aqueous sodium hydroxide used for general purpose use to peel off a dry film of wiring processing in the manufacturing process of the flexible printed wiring board.

In addition, in the method of manufacturing the wiring board using the resin composition according to this Embodiment, it is possible to process a via hole by alkali, but the invention is not limited thereto, and it is also possible to perform processing using a drill, laser and the like that are conventional techniques.

In addition, in the following description of this Embodiment, the case of simply describing "via hole" includes a penetrated via hole i.e. through hole and a non-penetrated via hole. The non-penetrated via hole includes a blind via that is a via hole used in connection from the outer layer to the inner layer, and a buried via that is a via hole used in connection between inner layers.

Embodiments 1 to 4 will be described below. Embodiment 1 relates to resin compositions capable of being used suitably for the resin composition layers 14, 23a, and 23b in the method of manufacturing the wiring board according to the above-mentioned Embodiment of the invention.

Embodiment 2 relates to via hole formation techniques allowing thinner nonelectrolytic copper plating.

Embodiment 3 relates to low repulsion multilayer flexible wiring boards excellent in smoothness of the resin composition layer on the wiring circuit and via hole good in chip package and bending mountability.

Embodiment 4 relates to a press method for improving surface smoothness of the resin composition layers 23a, 23b.

(Embodiment 1)

In recent years, the progress of high functionality and weight reduction of electronic apparatuses such as a cellular telephone has promoted thinning of a flexible printed substrate and high functionality of part package and the like used in the electronic apparatuses. In a manufacturing process of a flexible printed substrate, used is a material obtained by bonding an adhesive of an epoxy-based resin or the like to a high elastic polyimide film.

However, the epoxy-based resin has problems that flexibility, low repulsion and flame retardance are not obtained sufficiently. In addition thereto, the epoxy-based resin has reactivity, and therefore, lacks storage stability. Further, in heating steps of a solvent dry step, press step and the like after coating a resin composition solution obtained by dissolving the epoxy-based resin in a solvent, crosslinking reactions proceed remarkably, and therefore, it is not possible to adequately obtain embeddability in a through hole and via hole. The embeddability is particularly important with thinning of the flexible printed substrate.

On the other hand, the conventional high elastic polyimide film is capable of achieving reductions in warp and high heat resistance, but cannot be bonded to a conductive layer by itself.

Further, development has proceeded in thermoplastic polyimide. However, the thermoplastic polyimide has the need of adding a crosslinking agent to make a cured film. In the case of adding a crosslinking agent, as the epoxy-based resin, reactions proceed at low temperatures, and problems arise such that sufficient embeddability is not obtained in press, outgassing occurs by a by-product in a crosslinking reaction, and that bendability is not obtained after cure.

The inventors of the present invention found out that it is possible to resolve the above-mentioned problems by using thermoplastic polyimide having acidic functional groups and a particular compound that reacts with the reactive functional groups.

Embodiment 1 of this Embodiment will be described below. In addition, resin compositions according to Embodiment 1 are capable of being used in the resin composition layers 14, 23a and 23b as shown in FIGS. 1 and 2, enable the through holes 15 and via holes (blind vias) 24 to be formed using an alkali aqueous solution, and further enable the holes to be formed by conventional drill and laser processing.

A resin composition according to Embodiment 1 is a resin composition containing (A) a polyimide having acidic functional groups and (B) a compound having functional groups that react with the acidic functional groups, and meets the following parameters (a) to (d).

(a) A solution rate of the resin composition in 3 mass % aqueous sodium hydroxide at 45° C. is 0.95 or more after a heat history of 90° C. for 10 minutes with the solution rate before the heat history assumed to be 1.

(b) The solution rate of the resin composition in 3 mass % aqueous sodium hydroxide at 45° C. ranges from 0.001 μm/sec to 0.02 μm/sec after a heat history of 180° C. for 60 minutes.

(c) A bleed-out amount of the resin composition is 50 mg/m$^2$ or less in storing the resin component at 40° C. for 2 weeks after a heat history of 180° C. for 60 minutes.

(d) A thermogravimetric decrease of the resin composition at 260° C. is 2.0% or less when measured on a temperature rising condition of 10° C./min from 40° C. by thermogravimetric analysis (TG).

The parameters (a) to (d) of the resin composition according to Embodiment 1 will be described below.

In a manufacturing process of a multilayer flexible wiring board according to this Embodiment as described above, as shown in FIG. 2B, the resin composition layers 23a, 23b are heat-pressed against the core substrate 10, for example, at 70° C. to 140° C. At this point, it is required to completely fill between wiring of the conductive layers 12a, 12b and through holes 15 of the core substrate 10 with the resin composition. In this heat press, when reactions proceed between (A) the polyimide having acidic functional groups and (B) the compound having the reactive functional groups that react with the acidic functional groups, flowability of the resin composition extremely degrades, and embeddability degrades. Accordingly, in heating in press, it is necessary to suppress the reactions between the reactive functional groups. On the other hand, the resin composition layers 23a, 23b are thermally cured, for example, at 150° C. to 220° C. to form the resin cured material layers 31a, 31b. At this point, it is necessary that the reaction is sufficiently active between (A) the polyimide having acidic functional groups and (B) the compound having functional groups that react with the acidic functional groups.

It is possible to judge the reactivity between (A) the polyimide having acidic functional groups and (B) the compound having functional groups that react with the acidic functional groups by the degree of decrease of the alkali solution rate of the resin composition. By this means, requirements for suppressing the reaction due to heating in press as described above are capable of being translated as described below. In other words, in the case of assuming the alkali solution rate of the resin component after a heat history to be 1, the alkali solution rate ratio after the heat history of 90° C. for 10 minutes is 0.95 or more. The heat history conditions assume heating conditions in press. By satisfying this parameter (a), the resin composition enables embeddability in press to be improved.

It is possible to calculate the alkali solution rate ratio by measuring the alkali solution rate with a solution of the same concentration, temperature and basic species. In this Embodiment, the alkali solution rate is calculated by using 3 mass % aqueous sodium hydroxide at 45° C. Using the alkali aqueous solution, the resin composition that is beforehand applied and dried on a substrate such as copper foil is prepared, an alkali spray jet is applied onto the resin composition of which the film thickness is beforehand measured, the time taken for the resin composition to be completely removed is measured, and it is thereby possible to calculate the alkali solution rate.

Further, in the manufacturing process of the multi layer flexible wiring board according to this Embodiment as described above, a residual solvent and by-product in the resin composition layers 23a, 23b become causes of the occurrence of outgassing in the heat curing step of the resin composition layers 23a, 23b and solder reflow of the printed wiring board. When the outgassing occurs, interlayer delamination occurs between the conductive layers 12a, 12b, 22a, 22b and the resin composition layers 23a, 23b. Therefore, in the resin composition layers 23a, 23b, in order to suppress the occurrence of outgassing, it is necessary to decrease the residual solvent and suppress the by-product in heat curing to reduce outgassing.

From the above-mentioned viewpoints, it is necessary for the resin composition according to Embodiment 1 to reduce outgassing in the temperature range of 70° C. to 220° C. as described previously that is of the temperature condition of the subsequent heat curing step and of up to the reflow temperature of 260° C. expected in using lead-free solder. In other words, it is necessary that a thermogravimetric decrease at 260° C. is 2.0% or less when measured on the temperature rising condition of 10° C./min from 40° C. by thermogravimetric analysis before cure. By the resin composition satisfying this parameter (d), it is possible to reduce the occurrence of outgassing based on vaporization of the residual solvent and by-product in the resin composition layers 23a, 23b. By this means, it is possible to reduce the occurrence of outgassing in the heat curing step of the resin composition layers 23a, 23b and in solder reflow of the printed wiring board, it is thereby possible to reduce delamination between the copper foil 12, 22 and the resin composition layers 23a, 23b, and heat resistance is improved.

Further, in the resin composition according to Embodiment 1, it is necessary that the alkali solution rate in 3 mass % aqueous sodium hydroxide at 45° C. is in the range of 0.001 μm/sec to 0.02 μm/sec in a state of the resin cured material after heat-curing at 180° C. for 1 hour. When the alkali solution rate of the resin cured material is 0.02 μm/sec or less, it is possible to achieve sufficient alkali resistance required of the interlayer insulating film, and it is possible to obtain good insulation reliability. On the other hand, when the alkali solution rate of the resin cured material is 0.001 μm/sec or more, it is possible to make a moderate density of three-dimensional crosslinking structure formed between (A) the polyimide having acidic functional groups and (B) the compound having functional groups that react with the acidic functional groups, and it is possible to obtain good bendability. As described above, by the resin composition satisfying the parameter (b), it is possible to ensure compatibility between alkali resistance and insulation reliability, and bendability of the resin cured material layers 31a, 31b using the resin composition according to this Embodiment. From the viewpoint of ensuring compatibility between these physical properties at a higher level, it is preferable that the alkali solution rate of the resin composition is in the range of 0.002 μm/sec to 0.01 μm/sec.

It is possible to calculate the alkali solution rate of the resin cured material by the above-mentioned method. In addition, since the resin cured material is hard to dissolve in alkali, the spray is jetted for maximum 1000 seconds, residual moisture of the resin cured material is dried and removed, the film thickness is then measured again, and the rate is calculated from a difference in the film thickness between before and after the spray jet.

Figure 2F:
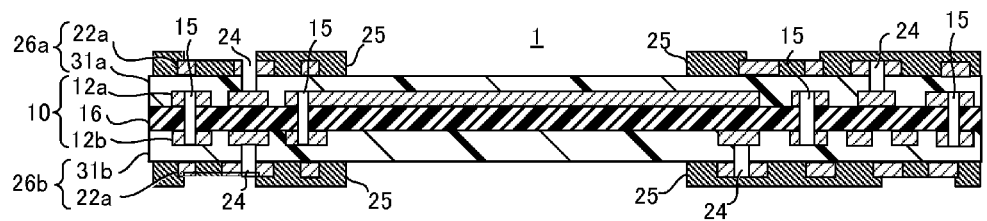

Further, there is a case where a substance incompatible with the resin in the resin cured material bleeds out to the surface over time in the resin cured material layers 31a, 31b of the multilayer flexible wiring board 1 as shown in FIG. 2F that was manufactured via the manufacturing steps of the multilayer flexible wiring board 1 according to this Embodiment as described above. In this case, there is the risk that the bled out component inhibits adhesion between the resin cured material and the conductive layers 12a, 12b, and that delamination occurs between the resin cured material layers 31a, 31b and the conductive layers 12a, 12b by packaging reflow of the subsequent step, thermal load in a thermal cycle test or the like, or physical impact in a bending test or the like.

From the above-mentioned viewpoint, in the resin cured material formed from the resin composition according to Embodiment 1, bleed-out is reduced. In other words, it is necessary that a bleed-out amount is 50 mg/m$^2$ or less in storing the resin composition at 40° C. for 2 weeks after a heat history of 180° C. for 60 minutes.

Further, in the case of forming via holes by alkali processing using the resin composition according to Embodiment 1, when the alkali solution rate in 3 mass % aqueous sodium hydroxide at 45° C. is 0.10 μm/sec or more in a state before a heat history, first, it is possible to remove the resin composition layers 23a, 23b before cure promptly by an alkali solution and water washing, and it is thereby possible to actualize the resin composition layers 23a, 23b excellent in alkali processability before cure. Accordingly, in the manufacturing method of the multilayer flexible wiring board 1, formation of via holes 24 is made ease. Further, it is possible to reduce resin residuals on the conductive layers 12a, 12b of the inner layers, and it is possible to make connection reliability of the via holes 24 good.

The resin composition in this Embodiment satisfies all the parameters according to Embodiment 1 as described above, is thereby excellent in embeddability in press, heat resistance, bendability, insulation reliability, and adhesion to the conductive layer, and is capable of achieving the resin composition used suitably as materials for surface protective films of semiconductor devices, interlayer insulating films, protective insulating films for printed wiring boards, interlayer insulating films and the like.

Components of the resin composition according to Embodiment 1 will specifically be described below.

(A) Polyimide Having Acidic Functional Groups (A) The polyimide having acidic functional groups is not limited particularly, as long as the polyimide has acidic functional groups, and examples thereof are (A-1) a polyimide having phenolic hydroxyl groups, (A-2) a polyimide having carboxyl groups, and (A-3) a polyimide having acid dianhydride terminals. Among the compounds, from the viewpoint of forming moderate three-dimensional crosslinking with the compound having functional groups that react with the acidic functional groups after cure, and the viewpoint of providing the resin composition prior to curing with alkali processability, preferable are (A-1) the polyimide having phenolic hydroxyl groups, and (A-2) the polyimide having carboxyl groups. From the viewpoints of storage stability at room temperature in a state of the resin composition solution, and of suppressing the progress of the crosslinking reaction with (B) the compound having functional groups that react with the acidic functional groups in solvent drying and press not to impair embeddability in between the circuit, through holes and via holes, (A-1) the polyimide having phenolic hydroxyl groups is more preferable. As (A) the polyimide having acidic functional groups, a plurality of kinds of polyimides (A-1) to (A-3) may be combined to use within the ranges of the parameters relating to this Embodiment as described previously, a plurality of kinds of reactive functional groups such as a phenolic hydroxyl group, carboxyl group and acid dianhydride terminals may be introduced to a molecule of one kind of polyimide, or the polyimide may be used in combination with another resin such as a phenol resin, resol resin, novolac resin, polystyrene resin, acrylic resin and polyvinyl phenol resin.

(A-1) Polyimide Having Phenolic Hydroxyl Groups

The polyimide having phenolic hydroxyl groups is not limited particularly, as long as the polyimide has phenolic hydroxyl groups in the structure, and from the viewpoints of solubility in an organic solvent, reactivity in polymerization, availability and the like, it is preferable to have a structure expressed by following general formula (1).

[Chemistry 2]

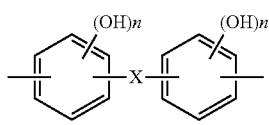

formula (1)

(In formula (1), X represents a single bond or —C(CF$_3$)$_2$—, and n represents an integer of from 1 to 4.)

Further, as the polyimide, it is preferable to contain a structure expressed by following general formula (2), from the viewpoints of heat resistance and solvent solubility. An aromatic group is preferable from the viewpoint of heat resistance, and an alicyclic group is preferable from the viewpoint of solvent solubility with a wide solvent selection range.

[Chemistry 3]

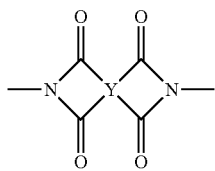

formula (2)

(In formula (2), Y represents a tetravalent organic group containing an aromatic group and/or an alicyclic group.)

Furthermore, as the polyimide, it is preferable to contain a structure expressed by following general formula (3), from the viewpoints of bendability, and resin embeddability in through holes.

[Chemistry 4]

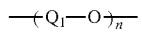

formula (3)

(In formula (3), Q1 represents an alkylene group with the carbon number of from 1 to 18, n is an integer of 1 or more, and Q1 may be different from one another for each repetition unit of n.)

The polyoxyalkylene skeleton expressed by general formula (3) may be derived from acid dianhydride or derived from diamine, and is not limited. However, the content of acid dianhydride and/or diamine containing the structure of general formula (3) preferably ranges from 25 mass % to 55 mass % relative to all the polyimide, and more preferably ranges from 35 mass % to 48 mass %. When the content of acid dianhydride and/or diamine containing the structure of general formula (3) is 25 mass % or more, excellent bendability and through hole embeddability is exhibited, and when the content is 55 mass % or less, alkali solubility and solder resistance is excellent.

It is possible to measure the content of general formula (3) in a polymer, for example, using thermal decomposition GC/MS, and herein, the content is defined as described below. First, obtained is the mass content (p) of the structure of general formula (3) in a raw material (for example, polyalkyl ether diamine) containing general formula (3). Next, the total amount (W) of the polymer is calculated as a value obtained by subtracting the theoretical mass of a by-product (water generated by imidization) generated by polymerization from the total of charge amounts of respective raw materials. Assuming a charge amount of the raw material containing general formula (3) to be w, the content mass % of general formula (3) is expressed by an equation of (w×p)/W.

Further, it is more preferable that the alkylene group of above-mentioned general formula (3) contains the skeleton of a linear tetramethylene group, from the viewpoints of solvent solubility, alkali processability, and resin embeddability in through holes.

The polyimide is obtained by reacting tetracarboxylic dianhydride with diamine.

Among preferable tetracarboxylic dianhydrides are 3,3', 4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 3,3'-oxy-diphthalic dianhydride, 4,4'-oxy-diphthalic dianhydride, bis(3,4-dicarboxyphenyl)sulfone dianhydride, polydimethylsiloxane-containing acid dianhydride, bicyclo[2,2,2]oct-7-ene-2,3,5,6-tetracaroxylic dianhydride, 1,2,3,4-butanetetracarboxylic dianhydride, 5,5'-methylene bis(anthranilic acid), etc. These tetracarboxylic dianhydrides may be used alone, or may be used in combination of two or more kinds. Further, from the viewpoints of decreasing a modulus of elasticity of the resin composition, and improving bendability and embeddability in through holes, the polyoxyalkylene skeleton-containing acid dianhydride expressed by above-mentioned general formula (3) may be used.

As the polyoxyalkylene skeleton-containing acid dianhydride, examples thereof are CRD-2 (2 mole ethylene oxide adduct) of dual-end acid dianhydrides obtained by adding alkylene oxide to the bisphenol A skeleton, CRD-18 (18 mole ethylene oxide adduct), CRD-30 (30 mole ethylene oxide adduct), CRD-060 (6 mole propylene oxide adduct), CRD-101 (10 mole propylene oxide adduct), CRD-181 (18 mole propylene oxide adduct) and the like made by TOHO Chemical Industry Co., Ltd.

Further, as the tetracarboxylic dianhydride, it is also possible to use conventional publicly-known other tetracarboxylic dianhydrides within the scope of exhibiting the effects of this Embodiment. As other tetracarboxylic dianhydrides, examples thereof are aromatic tetracarboxylic dianhydrides and aliphatic tetracarboxylic dianhydrides.

Examples of the aromatic tetracarboxylic dianhydrides are pyromellitic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 2,2-bis(4-(4-aminophenoxyl)phenyl)propane, 1,3-dihydro-1,3-dioxo-5-isobenzo furancarboxylic acid-1,4-phenylene ester, 4-(2,5-dioxotetrahydrofuran-3-yl)-1,2,3,4-tetrahydronaphthalene-1,2-dicarboxylic anhydride, 1,2,5,6-naphthalene tetracarboxylic dianhydride, 2,3,6,7-naphthalene tetracarboxylicdianhydride,2,3,5,6-pyridinetetracarboxylic dianhydride, 3,4,9,10-perylene tetracarboxylic dianhydride, 2,2-bis(3,4-dicarboxy-phenyl)hexafluoro propane dianhydride, 2,2-bis(4-(3,4-dicarboxy-phenoxy)phenyl)hexafluoro propane dianhydride, 2,2-bis(4-(3,4-dicarboxy-benzoyl-oxy)phenyl)hexafluoro propane dianhydride, and 2,2'-bis(trifluoro-methyl)-4,4'-bis(3,4-dicarboxy-phenoxy)biphenyl dianhydride.

Examples of the aliphatic tetracarboxylic dianhydrides are cyclobutane tetracarboxylic dianhydride, 1,2,3,4-cyclopentane tetracarboxylic dianhydride, 2,3,5,6-cyclohexane tetracarboxylic dianhydride, and 5-(2,5-dioxyotetrahydro-3-furanyl)-3-methyl-3-cyclohexane-1,2-dicarboxylic dianhydride. These tetracarboxylic dianhydrides may be used alone, or may be used in combination of two or more kinds.

Among the tetracarboxylic dianhydrides, 4,4'-oxy-diphthalic dianhydride, polydimethylsiloxane-containing aced dianhydride, and bicyclo[2,2,2]oct-7-ene-2,3,5,6-tetracaroxylic dianhydride are preferable from the viewpoints of flexibility of polyimide, solubility, insulation reliability and polymerization rate.

Among the diamines are 3,3'-diamino biphenyl-4,4'-diol, 3,3'-diamino biphenyl-4,4'-diol, 4,3'-diamino biphenyl-3,4'-diol, 4,4'-diamino biphenyl-3,3',5,5'-tetraol, 3,3'-diamino biphenyl-4,4',5,5'-tetraol, 2,2-bis(3-amino-4-hydroxyphenyl)hexafluoropropane, 2,2'-bis(3-amino-2,4-dihydroxyphenyl)hexafluoropropane, and 2,2'-bis(4-amino-3,5-dihydroxyphenyl)hexafluoropropane. These diamines may be used alone or may be used in combination of two or more kinds.

Among the diamines, 3,3'-diamino biphenyl-4,4'-diol and 2,2-bis(3-amino-4-hydroxyphenyl)hexafluoropropane are preferable from the viewpoints of solubility of polyimide, insulation reliability, polymerization rate and availability.

Further, as the diamine, it is possible to use conventional publicly-known other diamines within the scope of exhibiting the effects of this Embodiment. As other diamines, examples thereof are diamines such as 3,3'-diaminobenzophenone, 4,4'-diaminobenzophenone, 3,3'-diamino diphenyl ether, 4,4'-diamino diphenyl ether, 1,3-bis(3-aminophenoxy)benzene, 1,4-bis(4-aminophenoxy)benzene, bis(3-(3-aminophenoxyl)phenyl ether, bis(4-(4-aminophenoxyl)phenyl ether, 1,3-bis(3-(3-aminophenoxyl)phenoxy)benzene, 1,4-bis(4-(4-aminophenoxyl)phenoxy)benzene, bis(3-(3-(3-aminophenoxyl)phenoxy)phenyl) ether, bis(4-(4-amino-phenoxyl)phenoxy)phenyl) ether, 1,3-bis(3-(3-(3-aminophenoxyl)phenoxy)phenoxy)benzene, 1,4-bis(4-(4-(4-aminophenoxyl)phenoxy)phenoxy)benzene, 4,4'-bis(3-aminophenoxy)biphenyl, 4,4'-bis(4-aminophenoxy)biphenyl, 2,2-bis[4-(3-aminophenoxyl)phenyl]propane, 2,2-bis[4-(4-aminophenoxyl)phenyl]propane, 2,2-bis[4-(3-aminophenoxyl)phenyl]-1,1,1,3,3,3-hexafluoropropane, 2,2-bis[4-(4-aminophenoxyl)phenyl]-1,1,1,3,3,3-hexafluoropropane, m-phenylenediamine, o-phenylenediamine, p-phenylenediamine, bis(3-aminophenyl)sulfide, bis(4-aminophenyl)sulfide, bis(3-aminophenyl)sulfoxide, bis(4-aminophenyl)sulfoxide, bis(3-aminophenyl)sulfone, bis(4-aminophenyl)sulfone, and 2,2-bis[4-(3-aminophenoxyl)phenyl]butane, and silicone diamines such as α,ω-bis(2-aminoethyl)polydimethylsiloxane, α,ω-bis(3-aminopropyl)polydimethylsiloxane, α,ω-bis(4-aminobutyl)polydimethylsiloxane, α,ω-bis(4-aminophenyl)polydimethylsiloxane, and α,ω-bis(3-aminopropyl)polydiphenylsiloxane.

Furthermore, from the viewpoints of reducing a modulus of elasticity of the resin composition to improve bendability and embeddability in through holes, diamines having the structure of above-mentioned general formula (3) may be used, and examples thereof are polyoxyethylene diamines, polyoxypropylene diamines, polyoxytetramethylene diamines and polyoxyalkylene diamines (polyalkylether diamines) containing oxyalkylene groups of the different number of carbon chains. As the diamines having the structure of general formula (3), usage examples are polyoxyethylene diamines such as Jeffamine ED-600, ED-900, ED-2003, EDR-148, and HK-511 made by Huntsman International LLC., polyoxypropylene diamines such as Jeffamine D-230, D-400, D-2000, D-4000, polyether amine D-230, D-400 and D-2000 made by BASF Company, and diamines having polyoxytetramethylene groups such as Jeffamine XTJ-542, XTJ-533 and XTJ-536. From the viewpoint of embeddability in through holes, it is more preferable to use Jeffamine XTJ-542, XTJ-533 and XTJ-536 containing polyoxytetramethylene groups.

The content of the diamine expressed by above-mentioned general formula (2) relative to all diamines preferably ranges from 5 mol % to 30 mol %, and more preferably ranges from 10 mol % to 25 mol %. When the content of the diamine is 5 mol % or more, alkali solubility is exhibited, and when the content of the diamine is 30 mol % or less, solvent solubility is excellent.

A manufacturing method of the polyimide will be described next. As the manufacturing method of the polyimide according to this Embodiment, it is possible to apply all methods allowed to manufacture polyimides including publicly-known methods. Among the methods, it is preferable to perform the reaction in an organic solvent. As solvents used in such a reaction, examples thereof are N,N-dimethylformamide, N,N-dimethylacetamide, N-methyl-2-pyrrolidone, γ-butyrolactone, 1,2-dimethoxyethane, tetrahydrofuran, 1,3-dioxane, 1,4-dioxane, dimethyl sulfoxide, benzene, toluene, xylene, mesitylene, phenol, cresol, ethyl benzoate and butyl benzoate. These solvents may be used alone, or may be used in combination of two or more kinds.

The concentration of reactive raw materials in this reaction generally ranges from 2 mass % to 80 mass %, and preferably ranges from 20 mass % to 50 mass %.

The molar ratio between the tetracarboxylic dianhydride and the diamine to react is in the range of 0.8 to 1.2. In the case within the range, it is possible to increase the molecular weight, and the elongation percentage and the like are also excellent. The molar ratio is preferably in the range of 0.9 to 1.1, and more preferably in the range of 0.92 to 1.07.

The weight average molecular weight of a polyimide precursor preferably ranges from 5,000 to 100,000. Herein, the weight average molecular weight means the molecular weight measured by Gel Permeation Chromatography using polystyrene of the known number average molecular weight as a standard. The weight average molecular weight more preferably ranges from 10,000 to 60,000, and most preferably ranges from 15,000 to 50,000. When the weight average molecular weight is in the range of 5,000 to 100,000, a protective layer obtained by using the resin composition is improved in elongation percentage and is excellent in mechanical properties. Further, it is possible to apply in a desired film thickness in coating without bleeding.

The polyimide is obtained by the following method. First, reactive raw materials are subjected to the polycondensation reaction at temperatures between room temperature and 80° C., and a polyimide precursor comprised of the polyamic acid structure is manufactured. Next, this polyimide precursor is imidized by heating to 100° C. to 400° C., or chemically imidized using an imidizing agent such as an acetic anhydride, and the polyimide is thereby obtained which has the repeating unit structure associated with the polyamic acid. In the case of imidizing by heating, to remove by-product water, it is also preferable to cause an azeotropic agent (preferably, toluene and xylene) to coexist to perform dehydration under reflux using a Dean-Stark type dehydration apparatus.

Further, it is also possible to obtain the polyimide by performing the reaction at 80° C. to 220° C. to cause generation of the polyimide precursor and heat imidization reaction to proceed together. In other words, it is also preferable to obtain the polyimide by suspending or dissolving the diamine component and acid dianhydride component in an organic solvent to react under heating at 80° C. to 220° C., and thereby causing generation of the polyimide precursor and dehydration imidization together.

Moreover, as the polyimide according to this Embodiment, from the viewpoint of storage stability of the resin composition, it is preferable that terminals are blocked with a terminal blocking agent comprised of a monoamine derivative or a carboxylic acid derivative.

As the terminal blocking agent comprised of a monoamine derivative, examples thereof are aromatic monoamines such as aniline, o-toluidine, m-toluidine, p-toluidine, 2,3-xylidine, 2,6-xylidine, 3,4-xylidine, 3,5-xylidine, o-chloroaniline, m-chloroaniline, p-chloroaniline, o-bromoaniline, m-bromoaniline, p-bromoaniline, o-nitroaniline, p-nitroaniline, m-nitroaniline, o-aminophenol, p-aminophenol, m-aminophenol, o-anisidine, m-anisidine, p-anisidine, o-phenetidine, m-phenetidine, p-phenetidine, o-aminobenzaldehyde, p-aminobenzaldehyde, m-aminobenzaldehyde, o-aminobenzonitrile, p-aminobenzonitrile, m-aminobenzonitrile, 2-aminobiphenyl, 3-aminobiphenyl, 4-aminobiphenyl, 2-aminophenyl phenyl ether, 3-aminophenyl phenyl ether, 4-aminophenyl phenyl ether, 2-aminobenzophenone, 3-aminobenzophenone, 4-aminobenzophenone, 2-aminophenyl phenyl sulfide, 3-aminophenyl phenyl sulfide, 4-aminophenyl phenyl sulfide, 2-aminophenyl phenyl sulfone, 3-aminophenyl phenyl sulfone, 4-aminophenyl phenyl sulfone, α-naphthylamine, β-naphthylamine, 1-amino-2-naphthol, 5-amino-1-naphthol, 2-amino-1-naphthol, 4-amino-1-naphthol, 5-amino-2-naphthol, 7-amino-2-naphthol, 8-amino-1-naphthol, 8-amino-2-naphthol, 1-aminoanthracene, 2-aminoanthracene, and 9-aminoanthracene. Among the monoamines, it is preferable to use aniline derivatives. The monoamines may be used alone, or two or more kinds may be mixed to use.

As the terminal blocking agent comprised of a carboxylic acid derivative, main examples are carboxylic anhydride derivatives. As the carboxylic anhydride derivatives, examples thereof are aromatic dicarboxylic anhydrides such as phthalic anhydride, 2,3-benzophenonedicarboxylic anhydride, 3,4-benzophenonedicarboxylic anhydride, 2,3-dicarboxyphenyl phenyl ether anhydride, 3,4-dicarboxyphenyl phenyl ether anhydride, 2,3-biphenyldicarboxylic anhydride, 3,4-biphenyldicarboxylic anhydride, 2,3-dicarboxyphenyl phenyl sulfone anhydride, 3,4-dicarboxyphenyl phenyl sulfone anhydride, 2,3-dicarboxyphenyl phenyl sulfide anhydride, 3,4-dicarboxyphenyl phenyl sulfide anhydride, 1,2-naphthalenedicarboxylic anhydride, 2,3-naphthalenedicarboxylic anhydride, 1,8-naphthalenedicarboxylic anhydride, 1,2-anthracenedicarboxylic anhydride, 2,3-anthracenedicarboxylic anhydride and 1,9-anthracenedicarboxylic anhydride. Among the aromatic dicarboxylic anhydrides, it is preferable to use phthalic anhydride. The anhydrides may be used alone, or two or more kinds may be mixed to use.

It is possible to use the obtained polyimide itself without removing the solvent, or to further blend a required solvent, additive and the like to use as the resin composition according to Embodiment 1.

(A-2) Polyimide Having Carboxyl Groups

As the polyimide having carboxyl groups, it is possible to use the same compounds as the above-mentioned hydroxyl group-containing polyimides except that the carboxyl groups are substituted for hydroxyl groups of the hydroxyl group-containing polyimides. A carboxyl group-containing polyimide is synthesized using a carboxyl group-containing diamine. From the viewpoints of alkali solubility of the obtained carboxyl group-containing polyimide, polymerization rate, solubility in an organic solvent constituting the solution and availability, as the carboxyl group-containing diamine, it is possible to use 3,5-diaminobezoate, 3,3'-dicarboxy-4,4'-diaminodiphenylmetane (hereinafter, also abbreviated as MBAA), and the like.

Further, also with respect to polyimides having carboxyl groups, from the viewpoints of solvent solubility of the resin composition and heat resistance, and the viewpoint of decreasing elasticity of the resin composition to provide with flexibility and bendability, preferable are polyimides containing the structure of general formula (2) and flexible segments of general formula (3).

In the case of the polyimide having carboxyl groups, the polyimide reacts with the compound having reactive functional groups in curing to form the crosslinking structure, is therefore useful from the viewpoints of insulation reliability, bendability and the like, however is difficult to meet all the parameters according to Embodiment 1 when used alone, and has a tendency that the reaction with the reactive functional groups is apt to proceed generally even at low temperatures. Therefore, from the viewpoints of sufficiently not providing storage stability, and embeddability in through holes in press, it is preferable to use together with (A-1) the polyimide having phenolic hydroxyl groups, or to use a polyimide having phenolic hydroxyl groups and carboxyl groups in the same molecule of the polyimide.

(B) Compound Having Functional Groups that React with the Acidic Functional Groups The compound having functional groups that react with the acidic functional groups is not limited particularly, as long as the compound is a compound having functional groups that react with (A) the polyimide having acidic functional groups, and a thermogravimetric decrease by the occurrence of outgassing component derived from the by-produce in the reaction is in the range of the above-mentioned parameter (d). Examples of such a compound are (B-1) oxazoline compounds, (B-2) epoxy compounds, (B-3) isocyanate compounds, (B-4) benzoxazine compounds, methylol compounds, melamine resins, urea resins, carbodiimide compounds and oxetane compounds. Among the compounds, from the viewpoints of reactivity and availability, preferable are (B-1) oxazoline compounds, (B-2) epoxy compounds, (B-3) isocyanate compounds, and (B-4) benzoxazine compounds. From the viewpoint of insulation reliability, among more preferable compounds are (B-1) oxazoline compounds, (B-2) epoxy compounds, and (B-3) isocyanate compounds. (B-1) oxazoline compounds are further preferable from the viewpoints of storage stability at room temperature in a state of the resin composition solution and of suppressing the progress of the crosslinking reaction with (A) the polyimide having acidic functional groups, the viewpoint of meeting the alkali solution rate ratio after the heat history of 90° C. for 10 minutes specified in the above-mentioned parameter (a), and the viewpoint of forming a moderate three-dimensional crosslinking structure and thereby achieving the alkali solution rate of 0.001 µm/sec to 0.02 µm/sec specified in the above-mentioned parameter (b).

As an additive amount of (B) the compound having functional groups that react with the acidic functional groups, the ratio of the number of the acidic functional groups (for example, phenolic hydroxyl groups, carboxyl groups) of (A) the polyimide having the acidic functional groups to the number of functional groups (for example, oxazoline groups, epoxy groups) of (B) the compound having functional groups (hereinafter, also referred to as reactive functional groups) that react with the acidic functional groups i.e. acidic functional groups/reactive functional groups is preferably in the range of 4.0 to 0.5, and more preferably in the range of 1.5 to 0.7. When acidic functional groups/reactive functional groups is 4.0 or less, alkali solubility of the resin composition is improved. When acidic functional groups/reactive functional groups is 0.5 or more, it is possible to reduce outgassing caused by flexibility of the resin composition and a low-molecular residual component, and further, it is possible to reduce bleed-out caused by the low-molecular residual component.

(B-1) Oxazoline Compound

The oxazoline compound is a compound having at least one oxazoline group in a molecule. As the oxazoline compound, compounds having two or more oxazoline groups in a molecule are preferable from the viewpoints of blocking the hydroxyl groups of the polyimide and further, forming crosslinking with the polyimide.

Examples of the oxazoline compounds are 1,3-bis(4,5-dihydro-2-oxazolyl)benzene (hereinafter, also referred to as PBO), K-2010E, K-2020E and K-2030E made by Nippon Shokubai Co., Ltd., 2,6-bis(4-isopropyl-2-oxazoline-2-yl) pyridine, 2,6-bis(4-phenyl-2-oxazoline-2-yl)pyridine, 2,2'-isopropylidenebis(4-phenyl-2-oxazoline) and 2,2'-isopropylidenebis(4-tertialbutyl-2-oxazoline). Further, among the compounds are copolymers of polymerizable monomers such as 2-vinyl-2-oxazoline, 2-vinyl-4-methyl-2-oxazoline, 2-vinyl-5-methyl-2-oxazoline, 2-isopropenyl-2-oxazoline, and 2-isopropenyl-4-methyl-2-oxazoline. These oxazoline compounds may be used alone, or may be used in combination of two or more kinds.

The above-mentioned (B-1) oxazoline compound is suppressed in the reaction with the acidic functional groups of (A) the polyimide in a low temperature region, reacts remarkably at a high temperature region, forms a moderate three-dimensional crosslinking structure, and since any low-molecular by-product generated in the crosslinking reaction does not exist, is suitable for satisfying the parameters (a) to (d) according to Embodiment 1. Within the ranges of the parameters (a) to (d) according to Embodiment 1, the compound may be used in combination with (B-2) the epoxy compound, (B-3) the isocyanate compound, and (B-4) the benzoxazine compound.

(B-2) Epoxy Compound

The epoxy compound is a compound having at least one epoxy group in a molecule. As the epoxy compound, compounds having two or more epoxy groups in a molecule are preferable from the viewpoints of blocking the acidic hydroxyl groups of the polyimide and further, forming crosslinking with the polyimide.

In the case of the epoxy compound, the compound reacts with the acidic functional groups of the polyimide in curing, forms a dense crosslinking structure and is thereby useful from the viewpoints of insulation reliability and the like. However, it is difficult to meet all the parameters according to Embodiment 1 by using the compound alone, and the reaction with the acidic functional groups proceeds generally at low temperatures. Therefore, in the respects that it is not possible to sufficiently provide alkali processability and through hole embeddability in press and that there is the problem in the viewpoint of bendability since the crosslinking density is high, it is preferable to use together with (B-1) the oxazoline compound, (B-4) the benzoxazine compound and the like.

As two-functional epoxy compounds, examples thereof are bisphenol type epoxy resins such as bisphenol A type epoxy resins, bisphenol S type epoxy resins, and bisphenol F type epoxy resins, novolac type epoxy resins such as phenol novolac epoxy resins, cresol novolac type epoxy resins and bisphenol type novolac, modified novolac type epoxy resins, and dicyclopentadiene type epoxy resins that are epoxidized compounds of various kinds of dicyclopentadiene modified phenol resins obtained by reacting dicyclopentadiene and various kinds of phenols. Among the two-functional epoxy compounds, from the viewpoint of being excellent in heat resistance, solvent resistance, and plating solution resistance, it is preferable to use bisphenol A type epoxy resins, novolac type epoxy resins, modified novolac type epoxy resins, and dicyclopentadiene type epoxy resins.

Among the bisphenol A type epoxy compounds are EPICLON (Registered Trademark) 840 (hereinafter, 840) made by DIC Corporation, jER 828EL, jER 1001 and jER 1004 made by Mitsubishi Chemical Corporation, RIKARESIN BEO-60E made by New Japan Chemical Co., Ltd., and the like.

As the dicyclopentadiene type epoxy resins, examples thereof are XD-1000 (BrandName: made by Nippon Kayaku Co., Ltd.), and HP-7200 (Brand Name: made by DIC Corporation, etc.). Among the novolac type epoxy resins are NC-7000L (Brand Name: made by Nippon Kayaku Co., Ltd.), EPICLON N-680 (Brand Name: made by DIC Corporation), etc. As the modified novolac type epoxy resins, for example, there are NC-3000 (Brand Name: made by Nippon Kayaku Co., Ltd.), etc. It is possible to use these epoxy compounds (epoxy resins) alone or mix two or more kinds to use. Further, as the epoxy resins, for prevention of electromigration and prevention of metal semiconductor circuits from corrosion, it is preferable to use high purity products with impurity ions such as alkali metal ions, alkaline earth metal ions, halogen ions, particularly chlorine ions and hydrolytic chlorine reduced to 300 ppm or less.

In the case of using the above-mentioned epoxy resin, it is also possible to use a hardener when necessary. As the hardener, examples thereof are phenol-based compounds, aliphatic amines, alicyclic amines, aromatic polyamines, polyamides, aliphatic acid anhydrides, alicyclic acid anhydrides, aromatic acid anhydrides, dicyandiamide, organic acid dihydrazides, boron trifluoride-amine complexes, imidazoles, and tertiary amines. Among the hardeners, phenol-based compounds are preferable, and more preferable are phenol-based compounds having at least two phenolic hydroxyl groups in a molecule. As such compounds, examples thereof are phenol novolac resins, cresol novolac resins, t-butyl phenol novolac resins, dicyclopentadiene cresol novolac resins, dicyclopentadiene phenol novolac resins, xylylene-modified phenol novolac resins, naphthol-based compounds, trisphenol-based compounds, tetrakis phenol novolac resins, bisphenol A novolac resins, poly-p-vinylphenol resins and phenol aralkyl resins. Among the compounds, preferable are compounds with the number average molecular weight in the range of 400 to 1500. By this means, it is possible to effectively reduce outgassing that is a cause of contamination of the semiconductor device, apparatus or the like in assembling and heating the semiconductor apparatus.

(B-3) Isocyanate Compound

The isocyanate compound is a compound having at least one isocyanate group in a molecule. As the isocyanate compound, compounds having two or more isocyanate groups in a molecule are preferable from the viewpoints of blocking the acidic functional groups of the polyimide and further, forming crosslinking with the polyimide. For example, it is possible to use diphenylmethane diisocyanate compounds and their hydrogenated compounds such as diphenylmethane-2,4'-diisocyanate; 3,2'-, 3,3'-, 4,2'-, 4,3'-, 5,3'-, 6,2'- or 6,3'-dimethyldiphenylmethane-2,4'-diisocyanate; 3, 2'-, 3, 3'-, 4,2'-, 4,3'-, 5,2'-, 5,3'-, 6,2'- or 6,3'-diethyldiphenylmethane-2,4'-diisocyanate; 3, 2'-, 3, 3'-, 4,2'-, 4,3'-, 5,2'-, 5,3'-, 6,2'- or 6,3'-dimethoxydiphenylmethane-2,4'-diisocyanate; diphenylmethane-4,4'-diisocyanate; diphenylmethane-3,3'-diisocyanate; and diphenylmethane-3,4'-diisocyanate; aromatic isocyanate compounds such as diphenylether-4,4'-diisocyanate; benzophenone-4,4'-diisocyanate; diphenyl sulfone-4,4'-diisocyanate; tolylene-2,4-diisocyanate; tolylene-2,6-diisocyanate; 2,4-tolylene diisocyanate; 2,6-tolylene diisocyanate; m-xylylene diisocyanate; p-xylylene diisocyanate; 1,5-naphthalene diisocyanate; and 4,4'-[2,2bis(4-phenoxyphenyl)propane diisocyanate; and aliphatic or alicyclic isocyanates such as hexamethylene diisocyanate, 2,2,4-trimethyl hexamethylene diisocyanate, isophorone diisocyanate, 4,4'-dicyclohexylmethane diisocyanate, trans-cyclohexane-1,4-diisocyanate, hydrogenated m-xylylene diisocyanate, and lysine diisocyanate. From the viewpoint of suppressing reactivity at low temperatures, aliphatic or alicyclic isocyanate compounds are preferable.

In the case of the isocyanate compound, the compound reacts with the acidic functional groups of the polyimide in curing, forms a dense crosslinking structure and is thereby useful from the viewpoints of insulation reliability, bendability and the like. However, it is difficult to meet all the parameters according to Embodiment 1 by using the compound alone, and the reaction with the acidic functional groups proceeds generally at low temperatures. Therefore, it is not possible to sufficiently provide storage stability and through hole embeddability in press, the crosslinking density is high, there is the problem in the viewpoint of bendability, and therefore, it is preferable to use together with (B-1) the oxazoline compound.

On the other hand, with respect to block isocyanates containing block isocyanate groups obtained by reacting a blocking agent with a polyfunctional isocyanate compound containing two or more isocyanate groups, the block isocyanates are useful from the viewpoint of suppressing the reaction at low temperatures. However, in this case, the blocking agent escapes in heat curing to develop outgassing, and such isocyanates are not suitable in the viewpoint of heat resistance.

(B-4) Benzoxazine Compound

Among the benzoxazine compounds that may be used are compounds comprised of only monomers and compounds in an oligomer state in which the number of molecules is polymerized. Further, a plurality of benzoxazine compounds having different structures may be used together as the benzoxazine compounds. Examples of the benzoxazine compounds are bisphenol type benzoxazines. It is possible to use commercially available products such as bisphenol F type benzoxazine (Brand Name: BF-BXZ), bisphenol S type benzoxazine (Brand Name: BS-BXZ) and bisphenol A type benzoxazine (Brand Name: BA-BXZ) made by Konishi Chemical Inc. Co., Ltd.

In the case of the benzoxazine compound, the compound suppresses the reaction with the acidic functional groups of the polyimide appropriately at low temperatures, reacts with the acidic functional groups of the polyimide in curing to form a moderate crosslinking structure, and therefore, is useful from the viewpoints of embeddability in through holes in press, bendability and the like. However, since phenolic hydroxyl groups are produced as a by-product by the self-reaction of the benzoxazine in heat curing, it is not possible to sufficiently decrease the alkali solution rate of the cured film, and there is a problem with the viewpoints of alkali resistance and insulation reliability. Further, since the by-product phenolic hydroxyl groups react with remaining carboxyl groups of the polyimide to form esters in the reflow step and water is produced as a by-product, there is also a problem with the viewpoint of heat resistance, it is thereby not difficult to meet all the parameters according to Embodiment 1 by using the compound alone, and it is preferable to use the compound together with (B-1) the oxazoline compound, (B-2) epoxy compound and the like.

As described above, the most suitable combination of (A) the polyimide having acidic functional groups and (B) the compound having functional groups that react with the acidic groups for meeting the parameters according to Embodiment 1 is (A-1) the polyimide having phenolic hydroxyl groups and (B-2) the oxazoline compound, and (A-1) is the polyimide having the structure expressed by following general formula (1).

[Chemistry 5]

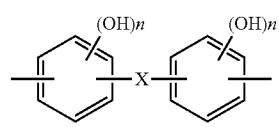

formula (1)

(In formula (1), X represents a single bond or —C(CF$_3$)$_2$—, and n represents an integer of from 1 to 4.)

As an additive amount of the oxazoline compound, the ratio of the number of hydroxyl groups of the polyimide having the hydroxyl groups to the number of oxazoline groups i.e. hydroxyl groups/oxazoline groups is preferably in the range of 4.0 to 0.5, and more preferably in the range of 3.0 to 0.7. When hydroxyl groups/oxazoline groups is 4.0 or less, alkali processability of the resin composition is improved. When hydroxyl groups/oxazoline groups is 0.5 or more, flexibility and heat resistance is improved in the resin composition.

According to this resin composition, the reactivity of the phenolic hydroxyl group of the polyimide relative to the oxazoline group of the oxazoline compound is lowered moderately, and therefore, in removing the solvent from the solution of the resin composition on general dry conditions (for example, 95° C., 30 minutes), it is possible to suppress the crosslinking reaction between the polyimide and the oxazoline compound. By this means, it is possible to prevent alkali solubility from degrading in the resin composition after removing the solvent, and therefore, it is possible to obtain the resin composition layer excellent in alkali processability.

Further, according to this resin composition, on heat curing conditions (for example, 180° C., 1 hour) of the resin composition layer, the phenolic hydroxyl groups of the polyimide react with the oxazoline groups of the oxazoline compound to form crosslinking bonds, and therefore, the heat-cured resin composition layer has high alkali resistance. At this point, in the resin composition, the reaction temperature of the polyimide and the oxazoline compound is high moderately, and it is thereby possible to perform heat curing after removing the solvent by heating. As a result, since it is possible to decrease the residual solvent amount in the heat-cured resin composition layer, in the case of heating the heat-cured resin composition layer, it is also possible to reduce bulges and the like of the resin composition layer based on vaporization of the residual solvent, and high heat resistance is obtained. Further, in the resin composition, it is possible to control the crosslinking density of the heat-cured resin composition layer moderately, and therefore, high bendability is obtained in the heat-cured resin composition layer. Furthermore, by selecting X as appropriate corresponding to a use purpose, it is possible to obtain solvent solubility with a wide range. From the results, it is possible to use the resin composition according to Embodiment 1 suitably as a surface protective film of a semiconductor device and the like.

(C) Polyfunctional Hydroxyl Group-Containing Compound Having Two or More Hydroxyl Groups With respect to the resin composition according to Embodiment 1, a polyfunctional hydroxyl group-containing compound may be added for the purpose of aiding crosslinking between (A) the polyimide having acidic functional groups and (B) the compound having functional groups that react with the acidic functional groups in curing, and providing flexibility, bendability and the like.

The polyfunctional hydroxyl group-containing compound refers to compounds containing two or more hydroxyl groups per molecular chain. Specific examples of the polyfunctional hydroxyl group-containing compounds are polytetramethylene diol such as PTMG 1000 (made by Mitsubishi Chemical Corporation), polybutadiene diol such as G-1000 (made by Nippon Soda Co., Ltd.), hydrogenated polybutadiene diol such as GI-1000 (made by Nippon Soda Co., Ltd.), polycarbonate diol such as DURANOL T5651, DURANOL T5652 and DURANOL T4671 (made by Asahi Kasei Chemicals Corporation) and Placcel CD (made by Daicel corporation), polycaprolactone diol such as Placcel 200 (made by Daicel corporation), bisphenols such as bis-phenol A (made by Daicel corporation), hydrogenated bisphenols such as RIKABINOL HB (made by New Japan Chemical Co., Ltd.) and dual-end phenol-modified silicone X-22-1821 (made by Shin-Etsu Chemical Co., Ltd.).

Further, as the polyfunctional hydroxyl group-containing compound, liquid compounds at room temperature are preferable in terms of reductions in warpage and solubility in an organic solvent. As the molecular weight thereof, the range of 500 to 3,000 is preferable, and particularly, the range of 500 to 2,000 is preferable.

It is desirable that an additive amount of the polyfunctional hydroxyl group-containing compound is less than 3 mass %. When the amount is less than 3 mass %, it is possible to suppress bleed-out caused by unreacted components after heat curing, and it is possible to obtain high adhesion between the resin composition layers 14, 23a, 23b and conductive layers 12a, 12b, 22a, 22b.

(D) Flame Retardant

Further, in the resin composition according to Embodiment 1, from the viewpoint of improving flame retardance, it is also possible to contain a flame retardant to use. Kinds of flame retardants are not limited particularly, and examples thereof are halogen-containing compounds, phosphorus-containing compounds and inorganic flame retardants. The retardants may be used alone, or two or more kinds may be mixed to use.

An additive amount of the flame retardant is not limited particularly, and is capable of being varied as appropriate corresponding to the kind of flame retardant to use. As the additive amount of the flame retardant, generally, relative to the polyimide in the resin composition, it is preferable to use in the range of 5 mass % to 50 mass %.

Among the halogen-containing compounds are organic compounds containing chlorine atoms and bromine atoms. Examples of the halogen-containing flame retardants are pentabromodiphenyl ether, octabromodiphenyl ether, decabromodiphenyl ether, tetrabromobisphenol A, and hexabromocyclododecane tetrabromobisphenol A.

Among the phosphorus-containing compounds are phosphazene, phosphine, phosphine oxide, phosphates and phosphites. Particularly, in terms of compatibility with the polyimide composition, it is preferable tousephosphazene, phosphineoxide, or phosphate. As phosphazene, for example, it is possible to use substituted hexa(phenoxy) cyclotriphosphazene having a cyano group or hydroxyl group.

In addition, it is desirable that an additive amount of the halogen-containing flame retardant is less than 40 mass %. When the amount is less than 40 mass %, it is possible to suppress bleed-out caused by unreacted components after heat curing, and it is possible to obtain high adhesion to the conductive layers.

Examples of the inorganic flame retardants are antimony compounds and metal hydroxides. Among the antimony compounds are antimony trioxide and antimony pentoxide. By using the antimony compound and above-mentioned halogen-containing compound together, in the thermal decomposition temperature range of plastic, the antimony oxide pulls halogen atoms out of the flame retardant to form antimony halide, and it is thereby possible to enhance flame resistance synergistically. Examples of the metal hydroxides are aluminium hydroxide and magnesium hydroxide.

Inorganic flame retardants are not dissolved in organic solvents. Therefore, as the inorganic flame retardant, the particle diameter of the powder is preferably 100 μm or less. When the particle diameter of the power is 100 μm or less, the retardant is easy to mix into the resin composition, does not impair transparence of the cured resin, and is preferable. Further, from the viewpoint of sufficiently increasing flame resistance, the particle diameter of the power is preferably 50 μm or less, and more preferably 10 μm or less.

In forming a coating film, adjustments are made to the viscosity and thixotropy corresponding to the coating method. When necessary, it is also possible to add filler, thixotropy adding agent or the like to use. Further, it is also possible to add publicly-known additives such as an antifoaming agent, leveling agent and pigment.

(E) Other Additives

In the resin composition according to Embodiment 1, from the viewpoint of preventing oxidation of the resin composition, it is also possible to use an antioxidant. As the antioxidant, for example, it is possible to use bis[3-(3-tert-butyl-4-hydroxy-5-methylphenyl)propionic acid] [Ethylenebis(oxyethylene)] (Brand Name: IRGANOX 245 made by BASF Company) and the like.

Further, in the resin composition according to Embodiment 1, from the viewpoint of improving adhesion between the resin composition layer containing the resin composition and the conductive layer, it is also possible to contain an adhesive material to use. The adhesive material is not limited particularly, and examples thereof are phenol compounds, nitrogen-containing organic compounds, and acetylacetone-metal complexes. Among the compounds, phenol compounds are preferable.

Further, it is possible to use the resin composition according to Embodiment 1 as a negative type photosensitive resin compound, by further adding acrylic monomers and photo radical generator. Furthermore, it is possible to use the resin composition according to Embodiment 1 as a positive type photosensitive resin compound, by adding a photoacid generator.

<Resin Composition Solution>

It is possible to dissolve the resin composition according to Embodiment 1 in an organic solvent to use as a resin composition solution.

Among such organic solvents are amide solvents such as N,N-dimethylacetamide, N,N-diethylacetamide, N,N-dimethylformamide, N,N-diethylformamide, N-methyl-2-pyrrolidone and 1,3-dimethyl-2-imidazolidinone, lactone solvents such as γ-butyrolactone and γ-valerolactone, sulfur-containing-based solvents such as dimethyl sulfoxide, diethyl sulfoxide, and hexamethyl sulfoxide, phenol-based solvents such as cresol and phenol, ether-based solvents such as diethyleneglycoldimethylether (diglyme), triethyleneglycoldimethylether (triglyme), tetraglyme, dioxane and tetrahydrofuran, and ester-based solvents such as butyl benzoate, ethyl benzoate, and methyl benzoate. Further, one of the organic solvents may be used alone, or a plurality of solvents may be used together.

Further, by applying the resin composition solution according to Embodiment 1 onto a resin film such as PET and conductor (conductive layer) and drying, it is possible to suitably use as an interlayer insulation film and substrate material of a multilayer flexible wiring board and the like. Furthermore, by directly applying the resin composition solution according to Embodiment 1 to cover a wiring pattern formed on the substrate, it is possible to suitably use as a protective film of the wiring pattern of the wiring board.

<Layered Product>

A layered product according to Embodiment 1 is provided with a substrate, and the resin composition according to above-mentioned Embodiment 1 provided on the substrate.

In the layered product according to Embodiment 1, it is preferable that the substrate is a carrier film.

Further, in the layered product according to Embodiment 1, it is preferable to provide a cover film on the resin composition.

Furthermore, in the layered product according to Embodiment 1, for example, it is preferable that the substrate is a conductive material such as copper foil.

It is possible to obtain the layered product according to Embodiment 1 by applying the resin composition solution and then drying. Although the form of heating is not limited particularly, from the viewpoints of sufficiently removing volatile components such as the solvent and residual monomer, and making soluble in an alkali aqueous solution, it is preferable to heat at 70° C. to 140° C. for 1 minute to 60 minutes, and heating may be performed by a vacuum drying method.

The resin composition according to Embodiment 1 is soluble in an alkali aqueous solution even after heating at 70° C. to 140° C. for 1 minute to 60 minutes. Therefore, the composition eliminates the need for laser drilling processing and the like used in manufacturing of a flexible printed wiring board, and is capable of being used suitably as an interlayer insulation material in performing via hole processing and through hole processing using an alkali aqueous solution.

Further, in the layered product according to Embodiment 1, it is preferable that a thickness of the resin composition layer ranges from 5 μm to 50 μm. When the thickness of the resin composition layer is 5 μm or more, handling is made ease. When the thickness of the resin composition layer is 50 μm or less, bending and assembling is made ease in the case of using in a flexible printed wiring board.

Furthermore, it is possible to use the layered product according to Embodiment 1 for manufacturing of a wiring board. In other words, a method of manufacturing a wiring board using the above-mentioned layered product includes a step of performing patterning on the conductor of the layered product manufactured as described above, a step of heat-curing the patterned resin composition layer, and a step of performing patterning on the conductor. Further, in the step of heat-curing the resin composition layer, it is preferable to heat at 150° C. to 220° C. for 10 minutes to 100 minutes.

<Multilayer Printed Wiring Board>

Referring to FIGS. 1 and 2, Embodiment 1 as described above is descried using the multilayer flexible wiring board 1 as an example, but the resin composition according to Embodiment 1 is not limited to the multilayer flexible wiring board, and is applicable to a multilayer printed wiring board. In other words, a multilayer printed wiring board according to Embodiment 1 is characterized by being provided with a substrate having wiring, and the resin composition according to Embodiment 1 as described above provided to cover the wiring.

The multilayer printed wiring board according to Embodiment 1 is preferably in the shape of a roll, from the viewpoint of handling of the printed wiring board.

(Embodiment 2)

In the conventional multilayer flexible wiring board, for a via hole for electrically connecting between layers is used a manufacturing method of applying laser light using a carbon dioxide laser or YAG laser processing apparatus to partially remove a resin composition layer, immersing a double-sided flexible substrate in a strong alkali heated solution such as a potassium permanganate solution, removing a resin smear attached to the copper foil surface in laser processing, and then applying electrolytic copper plating via a nonelectrolytic copper plating step. Currently, the nonelectrolytic plating copper thickness generally ranges from 1.0 μm to 2.0 μm, and with increasing requirements for reductions in the consumed amount of the nonelectrolytic plating copper solution of high cost and finer wiring pattern, it is required to further thin the thickness.

The invention according to Embodiment 2 was made in view of such a respect, and the inventors of the present invention found out that in a manufacturing method of the wiring board according to this Embodiment as described above, adhering properties of nonelectrolytic metal plating are enhanced by resin modified portions formed by the resin composition layers 23a, 23b, which are left in the step of removing the resin composition layers 23a, 23b using an alkali solution and water washing to form via holes 24 and which form side wall surfaces of the via holes 24 as shown in FIG. 2D, containing the alkali solution, and that it is possible to thin the nonelectrolytic metal plating.

In other words, a multilayer flexible wiring board according to Embodiment 2 is a wiring board obtained by removing, in a layered product provided with a first conductive layer, a resin composition layer provided on a surface of the first conductive layer, and a second conductive layer provided on a surface of the resin composition layer, a part of the second conductive layer to form an opening portion, removing the resin composition layer exposed to the opening portion by etching using an alkali solution using the second conductive layer with the opening portion formed as a mask, forming a via hole formed in the resin composition layer so that apart of the first conductive layer is exposed, and applying plating to the surface of the second conductive layer including the inside of the via hole, and is characterized in that in observing a perpendicular cross section of the via hole, a horizontal distance x from an end surface of the second conductive layer on the inner side of the opening portion to an end portion of the via hole on the second conductive layer side ranges from −30 μm to 0 μm, a horizontal distance y from the end surface of the second conductive layer on the inner side of the opening portion to an end portion of the via hole on the first conductive layer side ranges from −10 μm to 20 μm, and that in TOF-SIMS measurement of the perpendicular cross section of the via hole, in the resin composition layer forming a side wall surface of the via hole, a thickness T in the horizontal direction is 10 μm or more from the side wall surface of a resin modified portion in which a total residual concentration of alkali metal ions contained in the alkali solution is 50 ppm or more.

The multilayer flexible wiring board according to Embodiment 2 will be described next. A method of manufacturing the multilayer printed wiring board 1 according to Embodiment 2 will be described using formation of the via holes 24 in the resin composition layer 23a as shown in FIG. 2D as an example.

FIG. 3 contains cross-sectional schematic diagrams illustrating each step of via hole formation in the method of manufacturing the multilayer flexible wiring board according to Embodiment 2. As shown in FIG. 3A, the resin composition layer 23a is provided on the surface of the conductive layer 12a of the core substrate and the conductive layer 22a is provided on the surface of the resin composition layer 23a. In such a layered product comprised of conductive layer 12a/resin composition layer 23a/conductive layer 22a, as shown in FIG. 3B, a resist mask 101 using a dry film is formed on the surface of the conductive layer 22a. Next, the conductive layer 22a exposed to an opening portion 101a formed in the resist mask 101 is removed by etching to form a conformal mask.

Figure 3A:
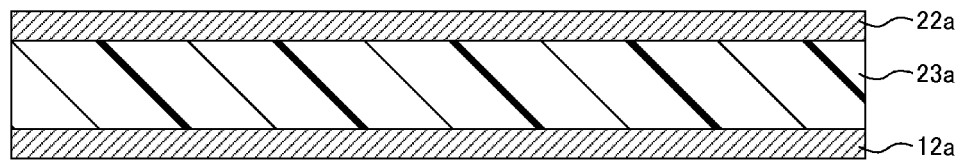
FIGs. 3A, 3B, 3C, and 3D contain cross-sectional schematic diagrams illustrating each step of via hole formation in a method of manufacturing a multilayer flexible wiring board according to Embodiment 2.
Figure 3B:
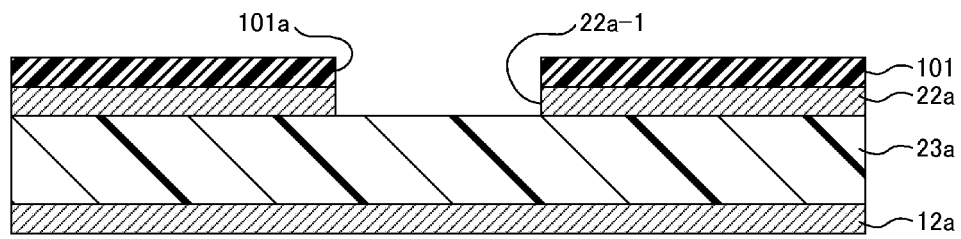
Figure 3C:
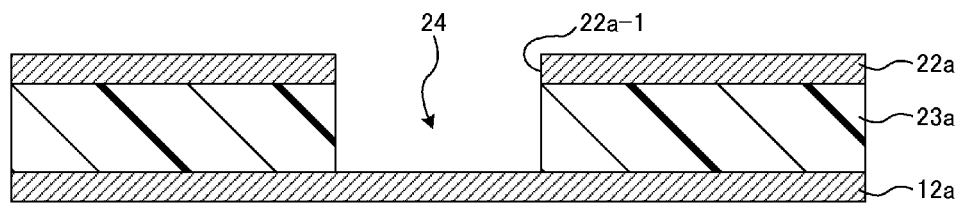

Next, the resin composition layer 23a exposed to an opening portion 22a-1 of the conformal mask is removed by etching using an alkali solution to form a via hole (blind via) 24 as shown in FIG. 3C. For example, etching using an alkali solution is performed by spray-jetting a sodium hydroxide solution and then, washing with water using a spray. Further, the resist mask 101 is peeled off in this etching.

Figure 3D:
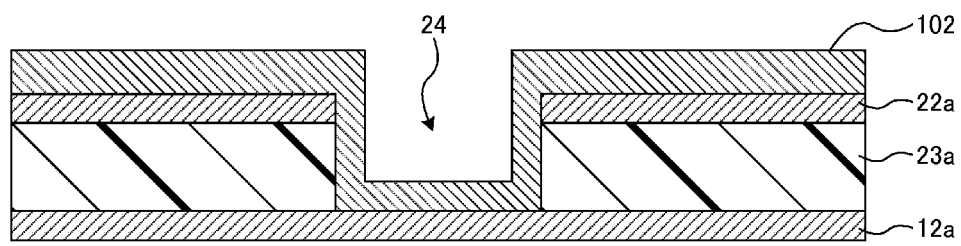

Next, as shown in FIG. 3D, nonelectrolytic copper plating treatment is applied to the resin composition layer 23a forming the side wall surface of the via hole 24 and the surface of the conductive layer 22a including the surface of the conductive layer 12a exposed to the via hole 24, and a copper plating layer 102 is formed to obtain electric continuity between the conductive layer 12a and the conductive layer 22a.

Figure 4:
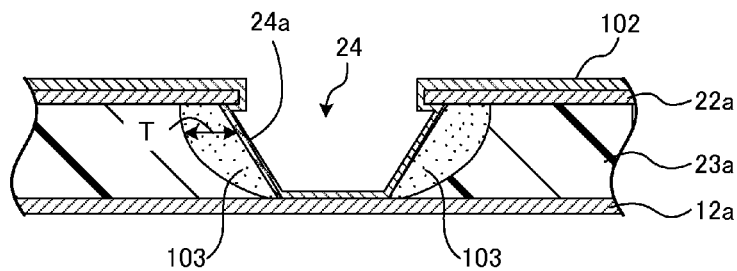
FIG. 4 is a partial schematic cross-sectional diagram illustrating the wiring board according to Embodiment 2.

FIG. 4 is a partial schematic cross-sectional diagram illustrating the wiring board according to Embodiment 2. As shown in FIG. 4, by etching using the alkali solution, a resin modified portion 103 modified by containing the alkali solution is formed in a part of the resin composition layer 23a forming the side wall surface of the via hole 24.

In Embodiment 2, in TOF-SIMS measurement of the perpendicular cross section of the via hole 24, the resin modified portion 103 is defined as a portion in which a total residual concentration of alkali metal ions contained in the alkali solution is 50 ppm or more in the resin composition layer 23a forming the side wall surface of the via hole 24. For example, in using a sodium hydroxide solution as the alkali solution, the alkali metal ions are sodium ions. In using a potassium hydroxide solution, the alkali metal ions are potassium ions.

Herein, TOF-SIMS measurement is time-of-flight secondary ion mass spectrometry, and is to obtain a secondary ion mass spectrum by first applying primary ions onto the perpendicular cross section of the via hole 24, and measuring the mass of generated secondary ions using a reflectron type mass spectrometer. Further, by analyzing the secondary ion mass spectrum, it is possible to calculate the total amount of alkali metal ions contained in the resin composition from the normalized secondary ion detection intensity.

In the resin modified portion 103, as shown in FIG. 4, a thickness T thereof is defined as a maximum value of the distance in the horizontal direction from the side wall surface 24a of the via hole 24. When the thickness T of the resin modified portion 103 is 10 μm or more, permeability of the nonelectrolytic metal plating solution in the resin modified portion 103 is enhanced, and adhering properties of plating are remarkably improved.

In order to form the resin modified portion 103 with the thickness T of 10 μm or more, it is necessary to form the via hole 24 by alkali processing. Therefore, the alkali etching rate of the resin composition is preferably 0.10 μm/sec or more, and more preferably 0.20 μm/sec or more. In the polyimide etching method using a particular agent including hydrazine and the like of conventional techniques, since the alkali etching rate is extremely low, it is not possible to form the resin modified portion with the thickness T of 10 μm or more.

Figure 5:
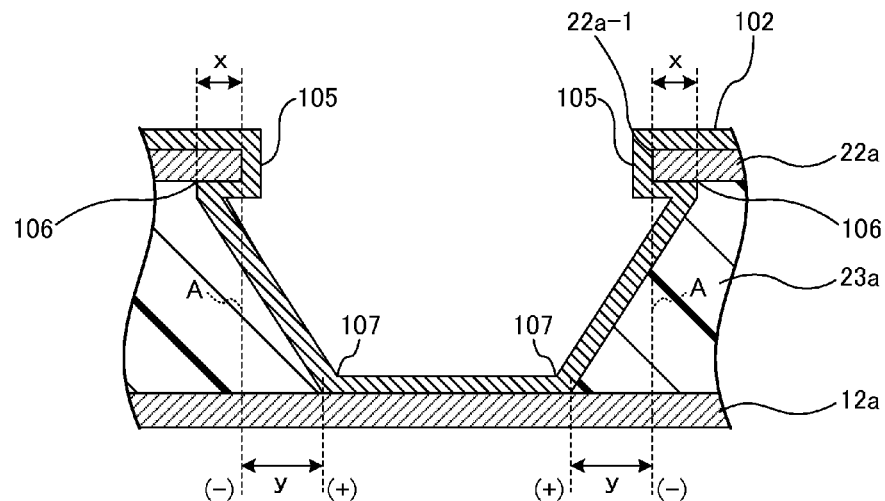
FIG. 5 is a cross-sectional schematic diagram illustrating a via hole in the wiring board according to. Embodiment 2.

A shape of the via hole 24 will be described next. FIG. 5 is a cross-sectional schematic diagram illustrating the via hole in the wiring board according to Embodiment 2. As shown in FIG. 5, in the case of observing the perpendicular cross section of the via hole 24, a parameter x is determined as a horizontal direction from an end portion 105 of the conductive layer 22a on the inner side of the opening portion 22a-1 to an end portion 106 of the via hole 24 on the conductive layer 22a side (upper portion in FIG. 5). Herein, it is assumed that the parameter x is + when the end portion 106 of the via hole 24 is on the inner side than the end portion 105, while being—when the portion 106 is on the outer side.

Further, a parameter y is determined as a horizontal direction from the end portion 105 of the conductive layer 22a on the inner side of the opening portion 22a-1 to an end portion 107 of the via hole 24 on the conductive layer 12a side (lower portion in FIG. 5). To be more specifically described, a perpendicular A is dropped from the end portion 105 of the conductive layer 22a on the inner side of the opening portion 22a-1 toward the conductive layer 12a (in other words, toward the bottom of the via hole 24), and the parameter y is the distance from the end portion 107 of the via hole 24 on the conductive layer 12a side. Herein, it is assumed that the parameter y is + when the end portion 107 of the via hole 24 is on the inner side than the perpendicular A, while being − when the portion 107 is on the outer side.

In the wiring board according to Embodiment 2, it is necessary that the parameter x ranges from −30 μm to 0 μm, and that the parameter y ranges from −10 μm to 20 μm. When the parameter x is −30 μm or more and/or the parameter y is −10 μm or more, improved is permeability of the nonelectrolytic metal plating solution to the surface on the side opposite to the resin composition layer 23a of the conductive layer 22a that is the outer conductive layer, and plating adhering properties are remarkably improved. From the viewpoint of permeability of the nonelectrolytic metal plating to the conductive layer, it is further preferable that the parameter x is −20 μm or more. On the other hand, when the parameter y is −10 μm or more, it is possible to join to the land of the bottom of the via hole 24 without disconnection, and when the parameter y is 20 μm or less, it is possible to ensure the via ground area for enabling connection reliability on the conductive layer 12a side to be sufficiently provided.

In the case of forming the via hole by etching using an alkali solution, the alkali solution is preferably a sodium hydroxide or potassium hydroxide solution, and from the viewpoint of decreasing the parameter x of the blind via, it is preferable that the alkali jet treatment time is 0.1 to 0.6 time the time taken for the resin to be completely etched. Further, 0.1 to 0.3 time is more preferable from the viewpoints of further decreasing the parameter x and of nonelectrolytic metal plating adhering properties. When the alkali jet treatment time does not reach 1.0 time the time taken for the resin to be completely etched, although the resin remains on the bottom of the via hole 24, the resin is completely removed by then performing water washing treatment successively. In this case, it is preferable to perform treatment at water pressure ranging from 0.1 MPa to 0.3 MPa for 30 seconds or more and 120 seconds or less. Further, from the viewpoint of suppressing resin peeling from the conductive layer 12a of the core substrate 10, it is particularly preferable to perform treatment at water pressure ranging from 0.1 MPa to 0.2 MPa for 60 seconds or more and 120 seconds or less.

Thus obtained side wall formed by the resin composition layer 23a of the via hole 24 is exposed to alkali in via hole processing, and thereby forms the resin modified portion with the thickness T of 10 μm or more by being cured while containing alkali metal ions, and with respect to the shape of the via hole 24, the parameters x and y relating to the via hole are capable of meeting the above-mentioned ranges.

In the above-mentioned resin modified portion containing alkali metal ions, water absorption is increased. Therefore, permeability of the nonelectrolytic metal plating (for example, nonelectrolytic copper plating) solution is increased, ion exchange with metal ions (for example, copper ions) also occurs, and adhering properties of nonelectrolytic metal (for example, nonelectrolytic copper) are thereby improved.

Further, in the multilayer flexible wiring board according to Embodiment 2, on the surface of the resin composition layer 23a in contact with the conductive layer 12a, a bleed-out amount is preferably 50 mg/m$^2$ or less in storing at 40° C. for 2 weeks, from the viewpoint of adhesion between the conductive layer and the resin composition layer.

Above-mentioned Embodiment 2 is described using, as an example, the multilayer flexible wiring board 1 with the conductive layers 22a, 22b arranged on both surfaces of the core substrate 10 as shown in FIG. 2, but is not limited thereto. The present invention is applicable to via hole formation in a wiring board having at least two-layer conductive layers that are isolated by providing a resin composition layer using a resin composition containing an alkali soluble resin. For example, it is possible to apply to formation of the through hole 15 of the core substrate as shown in FIG. 1. Further, the wiring board is not limited to the multilayer flexible wiring board, and may be a multilayer printed wiring board.

(Embodiment 3)

In a conventional multilayer flexible wiring board, a single-sided flexible wiring board is layered on a core substrate layer comprised of a double-sided flexible wiring board via a resin composition layer having adhesion using a vacuum press apparatus or the like, next on the single-sided flexible wiring board are formed an end portion to package semiconductor devices and the like, a wiring circuit derived therefrom, and blind vias or through holes to establish electrical connection with a land portion that is beforehand formed in the core substrate, and a package portion of the multilayer flexible wiring board is formed.

Currently, electronic equipment such as a smartphone and tablet PC has further been made smaller, thinner and higher density, miniaturization and high integration have thereby proceeded also in packaged semiconductor devices, and surface packaging has become mainstream in a packaging method. Therefore, in the multilayer flexible wiring board, the bend radius is decreased to package together with a motherboard, module substrate, display apparatus or the like while bending, and therefore, from requirements for peeling resistance and connection reliability of the package portion and easiness of assembly operation, a low repulsive force is required in a decreased bend radius. Further, in the semiconductor device package portion of the multilayer flexible wiring board, from requirements for package connection reliability, it is required to further improve surface smoothness of the substrate.

The invention according to Embodiment 3 was made in view of such respects, the inventors of the present invention found out that it is possible to improve bending mountability of a flexible portion and mountability of semiconductor devices in the package portion by decreasing a radius of curvature of the flexible portion to reduce a repulsive force in bending, and thinning a film thickness of a resin composition layer of an outer layer substrate layered on a wiring circuit of a core substrate, while forming smoothly.

In other words, a multilayer flexible wiring board according to Embodiment 3 is a multilayer flexible wiring board formed by laminating an outer layer substrate provided with an outer conductive layer, and a resin composition layer formed on a surface of the outer conductive layer on a core substrate comprised of a double-sided flexible substrate with a wiring circuit or a via hole formed so that the resin composition layer is disposed on the surface side of the core substrate, and is characterized in that a flexible portion is formed by removing a part of the outer conductive layer, a repulsive force ranges from 0.001 N/mm to 0.5 N/mm in the flexible portion when the multilayer flexible wiring board is bent with curvature R of 0.5 mm, a height of asperities on a surface of the resin composition layer is 5 µm on the wiring circuit formed in the core substrate or on an opening portion of the via hole, a bleed-out amount on the surface of the resin composition layer on the core substrate side is 50 mg/m$^2$ or less in storing at 40° C. for 2 weeks after a heat history of 180° C. for 60 minutes, and that a thickness of the resin composition layer on the wiring circuit ranges from 5 µm to 40 µm.

Figure 6:
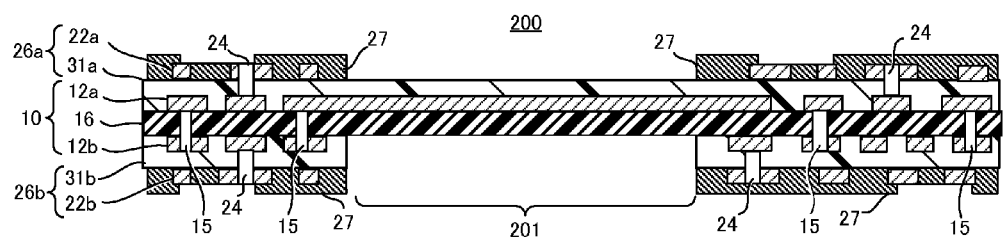
FIG. 6 is a cross-sectional schematic diagram illustrating a multilayer flexible wiring board according to Embodiment 3.

The multilayer flexible wiring board according to Embodiment 3 will be described below. FIG. 6 is a cross-sectional schematic diagram illustrating the multilayer flexible wiring board according to Embodiment 3. A multilayer flexible wiring board 200 as shown in FIG. 6 has the same configuration as that of the multilayer flexible wiring board 1 as shown in FIG. 2 except that the conductive layer 12b, resin cured material layer 31b and conductive layers 22a, 22b are partially removed to form a flexible portion 201. The same reference numerals are assigned to the same components of the multilayer flexible wiring board 1 as shown in FIG. 2 to omit descriptions thereof. The flexible portion 201 has bendability and bending properties, and is a portion required to have a low repulsive force after bending.

In the multilayer flexible wiring board 200 according to Embodiment 3, the resin cured material layers 31a, 31b are not limited to the resin cured material obtained by curing the resin composition containing the alkali soluble resin unlike the multilayer flexible wiring board 1 according to Embodiment 1. However, it is preferable that the resin cured material layers 31a, 31b contain a polyimide resin, from the viewpoints of flexibility and insulation reliability.

The multilayer flexible wiring board 200 according to Embodiment 3 is preferably in the shape of a roll, from the viewpoint of handling of the printed wiring board.

The multilayer flexible wiring board 200 according to Embodiment 3 is formed by layering, as outer layer substrates 26a, 26b, conductive layers 22a, 22b and resin cured material layers 31a, 31b as single resin cured material layers on the core substrate 10. The resin cured material layers 31a, 31b function as interlayer insulation layers in the package portion. Further, in the flexible portion 201, a part of each of the conductive layers 12a, 12b, 22a, 22b and resin composition layer is removed by etching, the resin composition is cured to be the resin cured material layers 31a, 31b, and the layers thereby function as cover coat layers of the conductive layers 12a, 12b constituting the wiring circuit of the core substrate 10. It is preferable that the resin cured material layers 31a, 31b are comprised of cured materials obtained by curing a single resin composition, in terms of thinning, productivity, low repulsion of the flexible portion 201, and blind via processability in the package portion.

With respect to the repulsive force of the flexible portion 201, the bend radius is reduced as much as possible to use, from the viewpoints of miniaturization and thinning of electronic equipment. It is preferable that the repulsive force is small in the case where the bend radius is small, and the repulsive force in the case where the curvature R is 0.5 mm preferably ranges from 0.001 N/mm to 0.5 N/mm, from the viewpoints of handling properties of bending and easiness in installing in electronic equipment. Further, it is more preferable that the force ranges from 0.005 N/mm to 0.25 N/mm, from the viewpoints of connection reliability of the bend package portion. Moreover, from the viewpoints of further miniaturization, thinning and roll-shaped making of the multilayer flexible wiring board 200 via roll-to-roll process, it is further preferable that the force ranges from 0.005 N/mm to 0.1 N/mm. When the repulsive force is smaller than 0.5 N/mm, the package connection portion is hard to peel off in bend packaging, and it is possible to suppress a break of the wiring circuit or via hole in bending. Further, it is possible to thin the total thickness of the multilayer flexible wiring board 200 to 400 µm or less. When the force is 0.001 N/mm or more, elasticity of the substrate is obtained, and handling properties are good.

The resin composition used in the resin cured material layers 31a, 31b layered on the package portion of the core substrate 10 is required to enable the wiring circuits formed by the conductive layers 12a, 12b formed on the core substrate 10 and through holes 15 or via holes (blind vias) 24 to be embedded, and is required to have smoothness on the surface when the composition is cured to be the cured material layer. In this case, it is preferable that a height of asperities on the surface on the outer layer side is 5 µm on the resin cured material layers 31a, 31b, from the viewpoint of mountability by a mass-production production apparatus such as a mounter of semiconductor device. Further, it is more preferable that the height of asperities is 3 µm or less, from the viewpoints of the package shape and reliability.

Moreover, from the viewpoint of resin embeddability in the wiring circuit and through holes 15 of the core substrate 10, each of film thicknesses of the resin cured material layers 31a, 31b on the wiring circuit layers comprised of the conductive layers 12a, 12b preferably ranges from 5 µm to 40 µm, and more preferably ranges from 5 µm to 20 µm. When the film thickness is 40 µm or less, it is possible to thin the multilayer flexible wiring board 200 and to provide low repulsion. When the film thickness is 5 µm or more, it is possible to obtain excellent interlayer insulation reliability and coating properties in end portions of the wiring circuit.

Further, it is preferable that a bleed-out amount on the surface of each of the resin cured material layers 31a, 31b is 50 mg/m$^2$ or less in storing at 40° C. for 2 weeks after a heat history of 180° C. for 60 minutes, from the viewpoints of solder reflow resistance in packaging and adhesion between the conductive layers 12a, 12b and the resin cured material layers 31a, 31b of the core substrate 10, and also in bend packaging, it is possible to suppress a break of the wiring circuit and a break of the via hole caused by delamination of the conductive layers 12a, 12b and the resin cured material layers 31a, 31b.

(Embodiment 4)

In a conventional method of manufacturing a multilayer flexible wiring board, being dependent on the shapes of wiring circuit, through hole and via hole formed in an inner layer substrate (core substrate), it is not possible to obtain desired surface smoothness and/or film thickness uniformity in the outer layer substrate after lamination, and such an event may occur that part mountability and interlayer insulation reliability deteriorates. To solve the problem, there are methods of making the press pressure a high pressure and the press time a long time. In this case, there is the risk that the resin composition flows out of an end portion of the wiring board, the thickness of the insulation layer is thinned in the end portion of the wiring portion, and that insulation properties degrade.

The invention according to Embodiment 4 was made in view of such respects, and is a method of manufacturing a multilayer flexible wiring board which is excellent in resin embeddability in between the circuit, through hole and via hole, excellent in surface smoothness of the substrate and excellent in part mountability and interlayer insulation reliability while suppressing a flow-out amount of the resin composition from the wiring board end portion.

The inventors of the present invention found out that it is possible to obtain desired surface smoothness and film thickness uniformity, without depending on the shape of a wiring circuit of a core substrate, by laminating an outer layer substrate comprised of a resin composition layer that functions as an interlayer insulation material of a multilayer flexible wiring board and a conductive layer provided on the resin composition layer on the core substrate on certain lamination conditions using a vacuum laminator apparatus that has a rubber substrate integrated with a reinforcing material and that is allowed to pressurize and heat, or the like.

In other words, a method of manufacturing a multilayer flexible wiring board according to Embodiment 4 is a method of manufacturing a multi layer flexible wiring board provided with a step of overlapping an outer layer substrate provided with an outer layer conductor layer and a resin composition layer formed on a surface of the outer layer conductor layer, and a core substrate comprised of a double-sided flexible substrate with a wiring circuit and a via hole formed so that the resin composition layer is disposed on the surface side of the core substrate, and a step of heating and pressurizing the overlapped outer layer substrate and core substrate on predetermined lamination conditions to laminate, and is characterized in that a vacuum laminator apparatus that has a rubber substrate integrated with a reinforcing material and that is allowed to pressurize and heat is used in the step of laminating the outer layer substrate and the core substrate, and that a resin flow amount from a vicinity of the outer layer conductor layer ranges from 0.001 mm to 1 mm on the lamination conditions that a temperature is in a range of 70° C. to 180° C. and that a pressure is in a range of 0.3 MPa to 3 MPa.

In the method of manufacturing a multilayer flexible wiring board according to Embodiment 4, from the viewpoints of suppressing reactivity of the resin composition to embed and maintaining flowability, the temperature condition is preferably in a range of 70° C. to 120° C.

Further, it is preferable that temperatures are in the range of the lamination temperature condition where the temperatures are temperatures at which a melt viscosity of the resin composition forming the resin composition layer is 100 Pa·s or more when raising the temperature at 5° C./min using a cone plate rheometer and are lower than a lowest melt viscosity. When the temperatures relating to the melt viscosity are in the range of the lamination temperature condition, in the lamination step, it is possible to exhibit high embeddability while suitably suppressing the resin flow amount from the vicinity of the conductor layer.

In the method of manufacturing a multilayer flexible wiring board according to Embodiment 4, in the rubber substrate, it is preferable that the reinforcing material is comprised of cloth or nonwoven cloth, and that rubber is in the shape of a sheet or roll comprised of silicone or urethane with surface hardness ranging from 30 degrees to 70 degrees. When the rubber with surface hardness of 30 degrees or more is of structure provided with the reinforcing material, it is possible to laminate the resin composition layer on the substrate having the wiring layer without distortion, and by using the rubber with surface hardness of 70 degrees or more, it is possible to embed the resin composition layer smoothly on the substrate having the wiring layer with asperities and through holes.

In the method of manufacturing a flexible wiring board according to Embodiment 4, the flexible wiring board is a multilayer flexible wiring board obtained by laminating the outer layer substrate (outer conductive layer) comprised of the resin composition layer as an adhesive layer and the conductive layer provided on the resin on a double-sided flexible substrate constituting the core substrate using the vacuum laminator apparatus having the rubber substrate integrated with a reinforcing plate. In Embodiment 4, for example, the vacuum laminator apparatus refers to a laminator apparatus for performing lamination at the degree of vacuum ranging from 0.01 kPa to 50 kPa.

In Embodiment 4, lamination is performed in the vacuum laminator apparatus having the rubber substrate integrated with the reinforcing material, and it is thereby possible to ensure surface smoothness and film thickness uniformity without depending on the shape of the wiring circuit provided on the core substrate. When surface smoothness is excellent, it is possible to prevent floating or inclination in chip packaging, and to make part mountability excellent. Further, since the film thickness is uniform, it is possible to avoid the occurrence of a part in which the resin thickness is extremely thinned in a wiring step portion, and to improve interlayer insulation reliability. As a result, it is possible to improve part mountability and interlayer insulation reliability.

The method of manufacturing a multilayer flexible wiring board will be described below.
(Method of Manufacturing a Multilayer Flexible Wiring Board Using Blind Vias)

Described first is the method of manufacturing a multi layer flexible wiring board using blind vias. FIG. 7 contains cross-sectional schematic diagrams illustrating manufacturing steps of a multilayer flexible wiring board according to Embodiment 4.

Figure 7A:
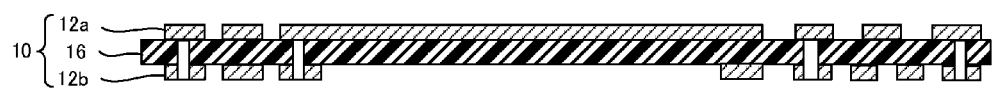
FIGS. 7A, 7B, 7C, 7D, and 7E contain cross-sectional schematic diagrams illustrating manufacturing steps of a multilayer flexible wiring board according to Embodiment 4.

As shown in FIGS. 7A to 7E, in Embodiment 4, the multilayer flexible wiring board is manufactured using a double-sided flexible wiring board as the core substrate 10. Used as the core substrate 10 is a double-sided flexible wiring board provided with the conductive layers 12a, 12b as the conductive layers on both main surfaces of the resin cured material layer 16 (FIG. 7A). In addition, as the core substrate 10, it is also possible to manufacture using various kinds of flexible wiring boards such as a single-sided flexible wiring board, double-sided flexible wiring board and multilayer flexible wiring board. In addition, the double-sided flexible wiring board manufactured by the above-mentioned manufacturing method may be used as the core substrate 10.

Figure 7B:
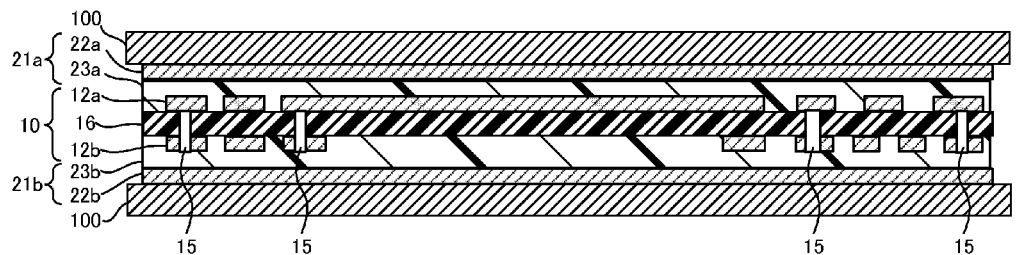

First, the resin composition layers 23a, 23b are provided on the conductive layers 12a, 12b of the core substrate 10, and the conductive layers 22a, 22b are successively layered on the resin composition layers 23a, 23b (FIG. 7B). In this layering step, heating is required on conditions on which curing of the resin does not proceed, for example, to an extent of 100° C. for about 20 minutes. In addition, the outer layer substrates 21a, 21b are formed of the resin composition layers 23a, 23b and conductive layers 22a, 22b.

Next, thus layered outer layer substrates 21a, 21b are crimped with rubber substrates 100. Herein, the rubber substrates 100 are provided in the laminator apparatus to laminate the outer layer substrate 21a, 21b on the core substrate 10. The laminator apparatus is configured to be able to heat and pressurize with the rubber substrates 100 in contact with the conductive layer 22a, 22b sides constituting the outer layer substrates 21, 21b. In addition, the rubber substrates 100 are integrated with reinforcing plates having wider contact areas than those of the conductive layers 22a, 22b constituting the outer layer substrates 21, 21b.

Next, dry films (DF) are laminated on the conductive layers 22a, 22b, and then, by exposure • development of the dry films and etching of the conductive layers 22a, 22b, parts of the conductive layers 22a, 22b are removed to form conformal masks.

Figure 7C:
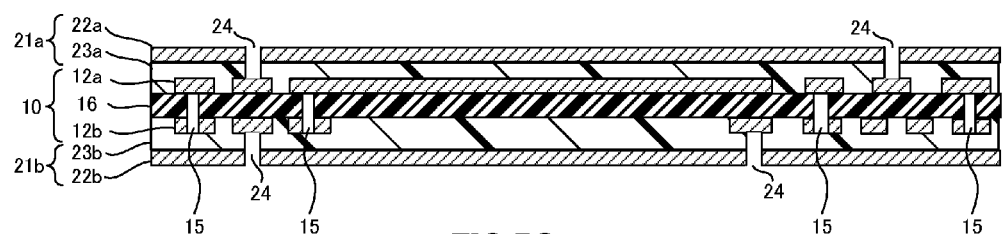

Next, in the case of forming blind vias by alkali processing, the resin composition layers 23a, 23b exposed to etching portions of the conductive layers 22a, 22b are removed via the conformal masks using an alkali solution to form via holes (blind vias) 24 (FIG. 7C).

Next, using a cure drying oven, the resin compositions contained in the resin composition layers 23a, 23b are cured by heating at 70° C. to 220° C. for 10 minutes to 5 hours. In the case of forming blind vias by laser processing, the resin is thermally cured in the heating step, and then, vias are formed.

When necessary, desmear treatment is performed using a potassium permanganate aqueous solution or sodium permanganate aqueous solution, nonelectrolytic copper plating or carbon fine particles are applied to the resin cured material layers 31a, 31b on the inner walls of the via holes 24, and then, electrolytic copper plating is applied to form the plating on via holes 24 and surfaces of conductive layers 12a, 12b. By this plating, electrical connection is established between the conductive layer 12a on one main surface side of the core substrate 10 and the conductive layer 22a of the outer layer substrate 26a, and between the conductive layer 12b on the other main surface side of the core substrate 10 and the conductive layer 22b of the outer layer substrate 26b.

Figure 7D:
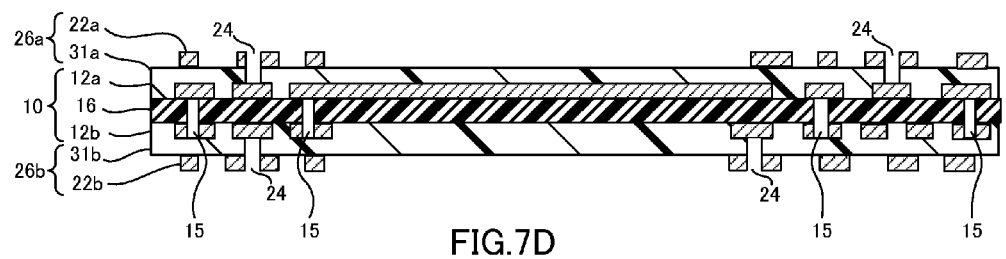
Figure 7E:
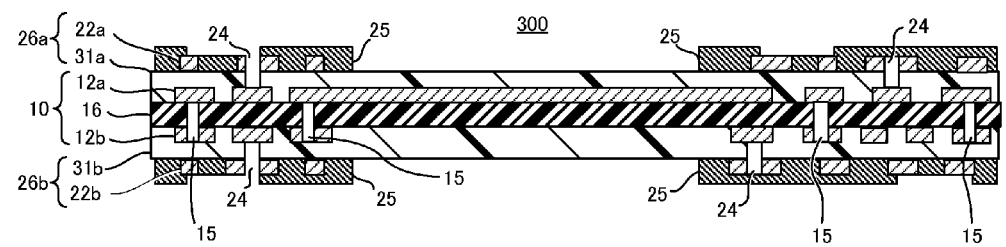

Next, patterning is performed on the conductive layers 22a, 22b of the outer layer substrates 26a, 26b by a subtractive method to perform circuit formation (FIG. 7D). Next, as in the conventional wiring board method of the flexible substrate, insulation processing such as formation of cover coats 25 is performed to manufacture a multilayer flexible wiring board 300 (FIG. 7E).

In the above-mentioned method of manufacturing a multilayer flexible wiring board according to Embodiment 4, by using the resin composition layers 23a, 23b and laminating with the vacuum laminator apparatus having the rubber substrates 100 integrated with the reinforcing materials, it is possible to ensure surface smoothness and film thickness uniformity without depending on the shape of the wiring circuit of the core substrate 10, and it is thereby possible to manufacture the multilayer flexible wiring board excellent in part mountability and interlayer insulation reliability.

In the method of manufacturing a multilayer flexible wiring board according to Embodiment 4, the vacuum laminator apparatus allowed to execute heat vacuum laminate or the like is used, from the viewpoints of adhesion to the resin composition layer as described above, and resin embeddability in the through hole and wiring circuit formed on the double-sided flexible substrate constituting the core substrate 10.

In this vacuum laminator apparatus, the rubber substrate having the reinforcing material is provided between a press surface plate and the layered product in performing vacuum lamination. The rubber substrate may be fixed to the vacuum laminator apparatus, or may be independent. As the reinforcing material, it is preferable to use cloth and nonwoven cloth, in terms of suppressing deformation of the rubber substrate, further suppressing fluctuations in pressure inside the press surface, and laminating uniformly. The material is not particularly limited, and may be glass fibers and steel fibers that are provided with heat resistance. Further, the rubber substrate is not limited particularly, as long as the substrate has heat resistance up to about 200° C., and is more preferably silicone, or is preferably urethane materials. Furthermore, the surface hardness of the rubber preferably ranges from 30 degrees to 70 degrees, and more preferably ranges from 30 degrees to 50 degrees. Still furthermore, from the viewpoint of continuous productivity with a roll-to-roll manufacturing apparatus, it is preferable that the rubber surface is provided with embossing and the like with minute concavo-convex structure.

Moreover, the size of the rubber material is preferably larger than that of the layered product, in terms of suppression of the unnecessary resin flow of the resin composition from the substrate end portion, heat conduction of the press surface plate, pressure uniformity, and elimination of the need for changing the size for any size of the layered product while being not dependent on the size of the press apparatus.

As the lamination conditions in press lamination, on conditions that the temperature is in the range of 70° C. to 180° C. and that the pressure is in the range of 0.3 MPa to 3 MPa, it is preferable that a resin flow amount, which is an amount of the melted resin composition constituting the resin composition layers 23a, 23b spilled from outer end portions of the conductive layers 22a, 22b, ranges from 0.001 mm to 1 mm, from the viewpoint of resin embeddability in the wiring circuit and via of the inner layer substrate. Further, in terms of surface smoothness, it is particularly preferable that the amount ranges from 0.001 mm to 0.2 mm. From the viewpoints of making embeddability and smoothness good, it is preferable that the temperature is 70° C. or more and that the pressure is 0.3 MPa or more. Further, from the viewpoints of suppressing the spill amount of the resin and uniforming the film thickness, it is preferable that the temperature is 180° C. or less and that the pressure is 3 MPa or less, and from the viewpoints of suppressing the reaction of the resin composition in press and maintaining flowability, it is more preferable that the temperature is 120° C. or less. In the range of lamination conditions of Embodiment 4, there is particularly no dependency on the vacuum press or vacuum laminator apparatus, and therefore, the method is suitably used for the vacuum laminator, quick press apparatus and the like, in reducing the production time.

(Resin Composition)

Described next is the resin composition used in the method of manufacturing a flexible wiring board according to Embodiment 4. The resin composition is not limited particularly, as long as the resin composition has both the function as an adhesive and the function of the interlayer insulation film of the flexible wiring board after heat curing.

It is preferable that the resin composition is low in the modulus of elasticity to provide the flexible portion of the flexible wiring board with flexibility or to enable formation by the roll-to-roll method. It is preferable that the modulus of elasticity of the resin composition ranges from 0.05 GPa to 3.0 GPa, and that the glass transition temperature is 150° C. or less, and particularly, it is more preferable that the modulus of elasticity ranges from 0.2 GPa to 2.0 GPa.

When the modulus of elasticity of the resin composition layer ranges from 0.05 GPa to 3.0 GPa, the substrate is small in warpage, and is excellent in flexibility and bendability. When the glass transition temperature is 150° C. or less, and more preferably, ranges from 50° C. to 120° C., it is possible to perform laminate processing using a general laminate apparatus.

In the method of manufacturing a multilayer flexible wiring board according to Embodiment 4, it is possible to ensure surface smoothness and film thickness uniformity without depending on the shape of the wiring circuit provided on the core substrate 10, by using, as the resin composition layer, the resin composition having a certain resin flow amount on predetermined lamination conditions (temperature condition, pressure condition), and laminating with the vacuum laminator apparatus having the rubber substrate integrated with the reinforcing material, and it is thereby possible to improve part mountability and interlay insulation reliability.

EXAMPLES

Examples performed to clarify the effects of the present invention will be described below. In addition, the invention is not limited at all by the following Examples.
(Embodiment 1)
Examples 1 to 25 relating to Embodiment 1 will be described.
Described first are evaluation methods in Examples 1 to 25.
(Preparation of Layered Product A)
A resin composition solution obtained by dissolving the resin composition of each of the Examples and Comparative Examples in a solvent was applied onto a mat surface of electrolytic copper foil (F2-WS) (made by Furukawa Circuit Foil Co., Ltd.) with a thickness of 12 μm using a bar coater, and leveling was performed at room temperature for 5 minutes to 10 minutes. The copper foil coated with the resin composition solution was successively dried by an atmospheric drying method and reduced-pressured drying method, and obtained was a layered product A with a resin composition layer with a thickness of 25 μm layered on the copper foil. In addition, the atmospheric drying method was performed by heating at 95° C. for 15 minutes using a hot-air oven (SPHH-101) (made by ESPEC Corporation). Further, the reduced-pressure drying method was performed by vacuum drying at 90° C. for 30 minutes (under reduced pressure of about $6.7 \times 10^{-2}$ Pa) using a vacuum drier (DRR420DA) (made by ADVANTEC Co., Ltd.) and a belt drive type oil-sealed rotary vacuum pump (TSW-150) (made by SATO VAC. INC.).
(Evaluation A: Alkali Solution Rate and Rate Ratio)
A-1: Alkali Solution Rate Before Cure
The layered product A was used without modification or was subjected to heat treatment at 90° C. for 10 minutes using the hot-air oven (SPHH-101) (made by ESPEC Corporation). Subsequently, 3 mass % aqueous sodium hydroxide was sprayed onto the resin surface of the layered product A at 48° C. with 0.18 MPa, and the evaluation was made using a film reduction rate obtained by measuring the time taken for the resin to be dissolved or swollen to peel off. In the evaluated sample, the surface of copper was observed by 10-times stereoscopic microscope observation, and it was checked whether a thin coating of the resin composition was left on the conductor surface. When the coating was left, the evaluation was made again, and the alkali solution rate was calculated by dividing the film thickness of the sample by the time taken for the coating to be completely removed. In the case where the coating was not completely removed even by spraying for 1000 seconds, the case was described as "presence of coating".

A-2: Alkali Solution Rate Ratio
The alkali solution rate ratio after a heat history of 90° C. for 10 minutes was calculated with the alkali solution rate of the resin composition before the heat history assumed to be 1.
A-3: Alkali Solution Rate after Cure
Further, with respect to the alkali solution rate of a resin cured material layer, the layered product A was subjected to heat treatment at 180° C. for 60 minutes using the hot-air oven (SPHH-101) (made by ESPEC Corporation). With respect to the obtained layered product having the resin cured material layer, after spraying with alkali for 1000 seconds, the resin cured material layer was dried at 100° C. for 30 minutes, the film thickness was then measured, and the rate was calculated by dividing a film reduction amount before and after spraying by 1000.
(Evaluation B: Thermogravimetric Analysis (TG))
A PET film (N152Q) (made by Teijin DuPont Films Japan Limited) was placed on a coating stage (made by Matsuki Science Company) allowed to perform vacuum absorption and heat, and was attached by vacuum absorption, and using an applicator with a cap of 125 μm (made by Matsuki Science Company), the resin composition solution of each of the Examples and Comparative Examples was applied onto the PET. Subsequently, by the same atmospheric drying method and reduced-pressured drying method as in preparation of the layered product A, solvent removal was performed for a certain time. Further, using the hot-air oven (SPHH-101) (made by ESPEC Corporation), dehumidification drying was performed on the obtained layered product at 80° C. for 2 hours. Subsequently, the obtained film of the resin composition was peeled off from the PET film. Using a differential heat/thermogravimetry simultaneous measurement apparatus (TG/DTA 6200) (made by SII•Nanotechnology Corporation), the film of the resin composition was heated at a rate of 10° C./min from 40° C. to 300° C. in the atmosphere, and a weight reduction rate at 260° C. was measured with the weight at 40° C. assumed to be 100%.
(Evaluation C: Evaluation of Bleed-Out)
The layered product A was heat-cured on conditions of 180° C. for 60 minutes, using the hot-air oven (SPHH-101) (made by ESPEC Corporation), and a layered product having the resin cured material layer was obtained. The product was cut to length 250 mm×width 250 mm, the surface of the resin cured material layer was washed with pure water, water drops were wiped with gauze, and the film was weighed (W1). The film was put in a thermostatic oven of 40° C. and was left for 2 weeks, bled-out plasticizer was wiped with waste, and the film was weighed (W2). A bleed-out amount was calculated by following equation (1) from the mass before and after the elapsed time.

$$\text{Bleed-out amount (\%)} = (W1 - W2)/W1 \times 16 \quad \text{Eq. (1)}$$

(Evaluation D: Evaluation of Solder Resistance)
The resin surface of the layered product A and the mat surface of copper foil was laminated by vacuum press on conditions of 2 minutes with 4 MPa at 140° C., and then, was heated at 180° C. for 60 minutes using the hot-air oven (SPHH-101) (made by ESPEC Corporation), and the resultant was made a sample for evaluation of solder resistance.
In conformity with JPCA-BMO2 standards, solder resistance was evaluated by the test in which the above-mentioned sample cut to 3 cm×3 cm was immersed in a solder bath at 260° C. for 10 seconds. The sample was observed with a 500-times microscope, and it was assumed that the case where any abnormality such as swelling was not seen on the film surface was ⊚, the case where abnormalities such as swelling were observed in a part but swelling of 2 mm□ or more was not seen was ○, and that the case where swelling of 2 mm□ or more was seen was X. Herein, the swelling refers to a bulge of 5 μm or more on the surface of the cured film seen after immersing in the solder bath as described above.

(Evaluation E: Evaluation of Bendability)

The resin surface of the layered product A and the mat surface of copper foil was laminated by vacuum press on conditions of 2 minutes with 4 MPa at 140° C., and then, was heated at 180° C. for 60 minutes using the hot-air oven (SPHH-101) (made by ESPEC Corporation), and the resultant was made a sample for bendability evaluation.

Bendability was evaluated by a test for bending the above-mentioned sample 180 degrees, imposing a load of 500 g/(cm×cm) for 5 minutes, then restoring, and further, performing such bending total 5 times. It was assumed that the case where any abnormality such as a crack and fracture was not seen after performing 5 times was ⊚, the case where the abnormality was seen during 3 to 5 times was ○, the case where the abnormality was seen for the second time was Δ, and that the case where the abnormality was seen from the first time was X.

(Evaluation F: Evaluation of Through Hole Embeddability)

In advance, through holes each with a diameter of 100 μm were made in a double-sided flexible wiring substrate (ES-PANEX (Registered Trademark) M) (made by Nippon Steel Chemical Co., Ltd.) with a thickness of copper foil of 12 μm and a thickness of the insulating resin layer of 20 μm, through hole plating with a thickness of 15 μm was applied, and the substrate was prepared (aspect ratio of the through hole=1.1).

The layered products A were placed on both surfaces of the substrate having the through holes with the resin surface of the layered product A in contact with the substrate, and lamination was performed by vacuum press on conditions of 2 minutes with 4 MPa at 140° C. Subsequently, the obtained layered product was cut in the vicinity of the through hole with scissors, and was polished with water-resistant abrasive paper (rough abrasion: #600 and finish abrasion: #1200) so that the cross section of the through hole was observed, the through hole cross sections of 10 holes were observed, and embeddability was evaluated based on the following criteria.

[Evaluation Criteria]

⊚: All of ten through holes were completely embedded and any void was not recognized.

○: Voids less than 10% of the cross section area were recognized in one hole among ten holes.

Δ: Voids of 10% or more of the cross section area were recognized in one hole among ten holes, or voids less than 10% of the cross section area were recognized in two holes among ten holes.

×: Voids of 10% or more of the cross section area were recognized in two or more holes among ten holes, or voids were recognized in three or more holes among ten holes.

(G: Insulation Reliability Evaluation (Ion Migration Test))

The insulation reliability evaluation was performed as described below. The resin composition solution of each of the Examples and Comparative Examples was applied to a PET film, and the solvent was dried at 90° C. for 30 minutes in the atmosphere using the hot-air oven (SPHH-101) (made by ESPEC Corporation). The obtained PET film with the resin composition layer was applied onto a comb-shaped substrate with line and space of 20 μm/20 μm by pressurizing with 1.0 MPa at 100° C. for 1 minute using a vacuum press apparatus (KITAGAWA SEIKI Co., Ltd.). After peeling off the PET film, the resultant was heated and cured at 180° C. for 60 minutes using the hot-air oven (SPHH-101) (made by ESPEC Corporation) to obtain the substrate with the resin cured material layer. A cable of a migration tester was soldered to the substrate, and insulation reliability tests were performed on the conditions as described below.

Insulation deterioration evaluation system: SIR-12 (made by Kusumoto Chemicals, Ltd.)

Steady temperature and humidity chamber: SH-641 (made by ESPEC Corporation)

Temperature: 85° C.

Humidity: 85%

Applied voltage: 20V

Application time: 1,000 hours

It was assumed that the case of insulation resistance values less than $1.0 \times 10^6 \Omega$ was X, the case of values of $1.0 \times 10^6 \Omega$ or more and less than $1.0 \times 10^8 \Omega$ was Δ, the case of values of $1.0 \times 10^8 \Omega$ or more and less than $1.0 \times 10^9 \Omega$ was ○, and that the case of values of $1.0 \times 10^9 \Omega$ or more was ⊚.

(Evaluation H: Adhesion: Peel Strength of Copper Foil and Resin Cured Material Layer)

The resin composition solution of each of the Examples and Comparative Examples was applied onto electrolytic copper foil (F2-WS) (made by Furukawa Circuit Foil Co., Ltd.) with a thickness of 12 μm using the bar coater, and then, was heated for 15 minutes in an oven heated to 95° C., and then, the solvent was removed by vacuum-drying at 95° C. for 30 minutes to obtain the copper foil with the resin having the resin composition layer with a thickness of 25 μm to be an outer layer material. The resin composition layer side of the copper foil with the resin was laid and placed on copper foil of a single-sided flexible wiring substrate (ES-PANEX (Registered Trademark) M) (made by Nippon Steel Chemical Co., Ltd.) with a thickness of copper foil of 12 μm and a thickness of the insulating resin layer of 20 μm, and the both surfaces were further sandwiched by mold release films to prepare a layered product.

Further, a double-sided flexible wiring substrate (ES-PANEX (Registered Trademark) M) (made by Nippon Steel Chemical Co., Ltd.) with a thickness of copper foil of 12 μm and a thickness of the insulating resin layer of 20 μm was prepared, and was subjected to acid cleaning with a 3% hydrochloric acid aqueous solution. The resin composition layer of the layered product as described previously was laminated onto one of conductive layers of the double-sided flexible wiring substrate by pressuring with 1.0 MPa at 100° C. to 120° C. for 1 to 2 minutes using the vacuum press apparatus (made by KITAGAWA SEIKI Co., Ltd.). The resultant was put in the thermostatic oven of 40° C., and was left for 2 weeks. The obtained multilayer flexible wiring board was used in evaluations as described below.

A method of measuring the peel strength was performed in conformity with JIS C6471 standards. The multilayer flexible wiring board was cut to the size of length 15 cm×width 2.5 cm. On the obtained test piece, using a masking tape, masking with a width of 2.5 cm was performed on the surface on the double-sided flexible wiring substrate side. On the other hand, masking with a center width of 1 cm was performed on the surface on the layered product side, and copper foil was etched using a ferric chloride solution. The etched test piece was left in a drier at 105° C. for 1 hour to dry. Subsequently, the test piece was attached to an FR-4 substrate with a thickness of 3 mm with a double-sided adhesive tape. A part of the copper foil on the surface on the layered product side of the sample piece with a width of 1 cm was peeled off in the interface with the resin composition layer, and an aluminium tape was bonded to a part of the peeled copper foil as a grip to prepare a sample.

The obtained sample was fixed to a tensile tester (made by Shimadzu Corporation, Autograph AG-10KNI). Infixing, a jig was attached to the sample so as to peel in the direction of 90° reliably. The load in peeling 50 mm at a velocity of about 50 mm/min was measured, and was calculated as adhesion strength per mm. It is assumed that the case where the peel strength was 0.7 N/mm or more was ⊚, the case where the strength was 0.5 N/mm or more and less than 0.7 N/mm was ○, the case where the strength was 0.2 N/mm or more and less than 0.5 N/mm was Δ, and that the case where the strength was less than 0.2 N/mm was X.

(Evaluation I: Alkali Processability)

Prepared was a double-sided flexible substrate (ES-PANEX (Registered Trademark) M) (made by Nippon Steel Chemical Co., Ltd.) with copper foil (F2-WS) (made by Furukawa Circuit Foil Co., Ltd.) with a thickness of the insulating layer of 25 μm and a thickness of the conductive layer of 12 μm. The double-sided flexible substrate was subjected to acid cleaning with a 3% hydrochloric acid aqueous solution. Subsequently, the resin composition layer of the layered product A was laminated onto one of conductive layers of the double-sided flexible substrate by pressuring with 1.0 MPa at 100° C. to 120° C. for 1 to 2 minutes using the vacuum press apparatus (made by KITA-GAWA SEIKI Co., Ltd.).

Next, a dry film resist (SUNFORT (Registered Trademark) AQ2578) (made by Asahi Kasei E-materials Corporation) was laminated onto the conductive layer of the layered product A, a hole pattern with 500 μm Φ was formed, and then, the conductive layer in the hole formation portion was etched and removed using a ferric chloride etching solution.

Subsequently, 3 mass % aqueous sodium hydroxide heated to 50° C. was sprayed onto the resin composition layer with 0.18 MPa, and then, ion-exchanged water of 20° C. was sprayed with a pressure of 0.20 MPa for 2 minutes to form via holes. It was assumed that ○ was the case where the resin composition layer with a thickness of 40 μm was only removed for an alkali spray time within 3 minutes and the conductive layer of the double-sided flexible substrate was completely exposed to the bottom of the via hole, and that X was the case where the resin composition layer was left on the bottom of the via hole for a spray time of 3 minutes.

[Synthesis Example of Polyimide A]

To a three-neck separable flask were attached a nitrogen introduction tube, thermometer, and bulb condenser provided with a water separation trap. In an oil bath at 80° C., in the flask were placed 120.4 g of N-methyl-2-pyrrolidone (NMP), 45 g of toluene, and 21.5 g of 4,4'-oxydiphthalic dianhydride (ODPA), and the mixture was stirred to be uniform. Further, 21.1 g of silicone diamine (KF-8010, made by Shin-Etsu Chemical Co., Ltd.), and 9 g of 3,3'-diaminobiphenyl-4,4'-diol (HAB) were added gradually, and then, the mixture was heated to 180° C., and heated for 2 hours. During the reaction, by-product water was removed from the reaction system by azeotropy dehydration with toluene under toluene reflux. After removing by-product water from the water separation trap, reflux was halted, toluene was removed, and the resultant was cooled to room temperature. Next, the product was press-filtered with a filter of 5 μm, and polyimide A varnish was obtained. The weight average molecular weight was 42,000.

[Synthesis Example of Polyimide B]

To a three-neck separable flask were attached a nitrogen introduction tube, thermometer, and bulb condenser provided with a water separation trap. In an oil bath at 80° C., in the flask were placed 117 g of N-methyl-2-pyrrolidone (NMP), 45 g of toluene, and 21.5 g of 4,4'-oxydiphthalic dianhydride (ODPA), and the mixture was stirred to be uniform. Further, 20 g of silicone diamine (KF-8010, made by Shin-Etsu Chemical Co., Ltd.), and 8.5 g of 3,3'-diaminobiphenyl-4,4'-diol (HAB) were added gradually, and then, the mixture was heated to 180° C., and heated for 2 hours. During the reaction, by-product water was removed from the reaction system by azeotropy dehydration with toluene under toluene reflux. After removing by-product water from the water separation trap, reflux was halted, toluene was removed, and the resultant was cooled to room temperature. Next, the product was press-filtered with a filter of 5 μm, and polyimide B varnish was obtained. The weight average molecular weight was 21,000.

[Synthesis Example of Polyimide C]

To a three-neck separable flask were attached a nitrogen introduction tube, thermometer, and bulb condenser provided with a water separation trap. In an oil bath at room temperature, in the flask were placed 344 g of 1,3-dimethyl-2-imidazolidinone (DMI), 90 g of toluene, 78.4 g of dimethyl sulfoxide, 48.8 g of 2,2'-bis(3-amino-4-hydroxyphenyl)hexafluoropropane (6FAP), and 112.8 g of polyalkyl ether diamine (Brand Name: Baxxodur (Registered Trademark) EC302, made by BASF Company), and the mixture was stirred to be uniform. Further, 120 g of 3,3',4,4'-biphenyltetracarboxylic dianhydride (BPDA) was added gradually, and then, the mixture was heated to 180° C., and heated for 3 hours. During the reaction, by-product water was removed from the reaction system by azeotropy dehydration with toluene under toluene reflux. After removing by-product water from the water separation trap, reflux was halted, toluene was removed, and the resultant was cooled to room temperature. Next, the product was press-filtered with a filter of 5 μm, and polyimide C varnish was obtained. The weight average molecular weight was 28,000. The content of the structure expressed by general formula (3) relative to all the mass of the polymer C was calculated from the charge amounts, and as a result, was 35%.

[Synthesis Example of Polyimide D]

To a three-neck separable flask were attached a nitrogen introduction tube, thermometer, and bulb condenser provided with a water separation trap. In an oil bath at room temperature, in the flask were placed 121 g of γ-butyrolactone (GBL), 45 g of toluene, and 23.1 g of bicyclo[2,2,2]oct-7-ene-2,3,5,6-tetracaroxylic dianhydride (BTA), the mixture was heated to 80° C., then added were 17.2 g of 2,2'-bis(3-amino-4-hydroxyphenyl)hexafluoropropane (6FAP) and 40.3 g of silicone diamine (KF-8010, made by Shin-Etsu Chemical Co., Ltd.), and the mixture was stirred to be uniform. Further, the mixture was heated to 180° C., and heated for 2 hours. During the reaction, by-product water was removed from the reaction system by azeotropy dehydration with toluene under toluene reflux. After removing by-product water from the water separation trap, reflux was halted, toluene was removed, and the resultant was cooled to room temperature. Next, the product was press-filtered with a filter of 5 μm, and polyimide D varnish was obtained. The weight average molecular weight was 19,000.

[Synthesis Example of Polyimide E]

To a three-neck separable flask were attached a nitrogen introduction tube, thermometer, and bulb condenser provided with a water separation trap. In an oil bath at room temperature, in the flask were placed 121 g of γ-butyrolactone (GBL), 45 g of toluene, and 18.7 g of 1,2,3,4-butanetetracarboxylic dianhydride, the mixture was heated to 80° C., then added were 17.2 g of 2,2'-bis(3-amino-4-hydroxyphenyl)hexafluoropropane (6FAP) and 40.3 g of silicone diamine (KF-8010, made by Shin-Etsu Chemical Co., Ltd.), and the mixture was stirred to be uniform. Further, the mixture was heated to 180° C., and heated for 2 hours. During the reaction, by-product water was removed from the reaction system by azeotropy dehydration with toluene under toluene reflux. After removing by-product water from the water separation trap, reflux was halted, toluene was removed, and the resultant was cooled to room temperature. Next, the product was press-filtered with a filter of 5 μm, and polyimide E varnish was obtained. The weight average molecular weight was 18,000.

[Synthesis Example of Polyimide F]

To a three-neck separable flask were attached a nitrogen introduction tube, thermometer, and bulb condenser provided with a water separation trap. In an oil bath at room temperature, in the flask were placed 181.4 g of γ-butyrolactone, 50.0 g of toluene, 18.13 of 2,2'-bis(3-amino-4-hydroxyphenyl)hexafluoropropane (6FAP), and 48.50 g of polyalkyl ether diamine (Brand Name: Jeffamine (XTJ-542), made by Huntsman International LLC.), and the mixture was stirred to be uniform at 60° C. Further, after adding 31.02 g of 4,4'-oxydiphthalic dianhydride (ODPA) gradually, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide F varnish was obtained. The weight average molecular weight was 114,000. The content of the structure expressed by general formula (3) relative to all the mass of the polymer F was calculated from the charge amounts, and as a result, was 48%.

[Synthesis Example of Polyimide G]

To a three-neck separable flask were attached a nitrogen introduction tube, thermometer, and bulb condenser provided with a water separation trap. In an oil bath at room temperature, in the flask were placed 175.7 g of γ-butyrolactone, 50.0 g of toluene, 21.02 of 2,2'-bis(3-amino-4-hydroxyphenyl)hexafluoropropane (6FAP), and 42.60 g of polyalkyl ether diamine (Brand Name: Jeffamine (XTJ-542), made by Huntsman International LLC.), and the mixture was stirred to be uniform at 60° C. Further, 30.09 g of 4,4'-oxydiphthalic dianhydride (ODPA) was added gradually. After 30 minutes, 0.89 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide G varnish was obtained. The weight average molecular weight was 83,000. The content of the structure expressed by general formula (3) relative to all the mass of the polymer G was calculated from the charge amounts, and as a result, was 42%.

[Synthesis Example of Polyimide H]

To a three-neck separable flask were attached a nitrogen introduction tube, thermometer, and bulb condenser provided with a water separation trap. In an oil bath at room temperature, in the flask were placed 72.7 g of γ-butyrolactone, 38.0 g of toluene, and 30.09 g of 4,4'-oxydiphthalic dianhydride (ODPA), and the mixture was stirred to be uniform at 60° C. Further, 42.32 g of polyalkyl ether diamine (Brand Name: Jeffamine (XTJ-542), made by Huntsman International LLC.) was added gradually, and the mixture was heated to 180° C., and heated for 3 hours. During the reaction, by-product water was subjected to azeotropy with toluene, and dehydration was carried out under reflux using the bulb condenser provided with the water separation trap. After once cooling the reaction solution to 35° C., 0.89 g of phthalic anhydride was added, the solution was stirred to be uniform, 101.9 g of γ-butyrolactone, 12.0 g of toluene, and 21.12 of 2,2'-bis(3-amino-4-hydroxyphenyl)hexafluoropropane (6FAP) were added gradually, and the solution was heated and stirred at 70° C. for 3 hours. The reaction solution was further heated to 180° C., and was refluxed for 3 hours. After removing by-product water, reflux was halted, all toluene was removed, and the solution was cooled to room temperature. Next, the product was press-filtered with a filter of 5 μm, and polyimide H varnish was obtained. The weight average molecular weight was 87,000. The content of the structure expressed by general formula (3) relative to all the mass of the polymer H was calculated from the charge amounts, and as a result, was 42%.

[Synthesis Example of Polyimide I]

To a three-neck separable flask were attached a nitrogen introduction tube, thermometer, and bulb condenser provided with a water separation trap. In an oil bath at room temperature, in the flask were placed 45.1 g of γ-butyrolactone, 40.0 g of toluene, 5.02 g of 2,2'-bis(3-amino-4-hydroxyphenyl)hexafluoropropane (6FAP), and 4.91 g of 1,3-bis(3-aminophenoxy)benzene (Brand Name: APB-N, made by Mitsui Chemicals, Inc.), and the mixture was stirred to be uniform at 60° C. Further, 1.46 g of 4,4'-oxydiphthalic dianhydride (ODPA) and 25.50 g of dual-end acid dianhydride-modified silicone (Brand Name: X-22-2290AS, made by Shin-Etsu Chemical Co., Ltd.) were added gradually. Subsequently, the resultant was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide I varnish was obtained. The weight average molecular weight was 22,000.

[Synthesis Example of Polyimide J]

To a three-neck separable flask were attached a nitrogen introduction tube, thermometer, and bulb condenser provided with a water separation trap. In an oil bath at room temperature, in the flask were placed 151.6 g of γ-butyrolactone, 50.0 g of toluene, 28.53 of 2,2'-bis(3-amino-4-hydroxyphenyl)hexafluoropropane (6FAP), and 22.10 g of polyalkyl ether diamine (Brand Name: Jeffamine (XTJ-542), made by Huntsman International LLC.), and the mixture was stirred to be uniform at 60° C. Further, 30.09 g of 4,4'-oxydiphthalic dianhydride (ODPA) was added gradually. After 30 minutes, 0.89 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide J varnish was obtained. The weight average molecular weight was 91,000. The content of the structure expressed by general formula (3) relative to all the mass of the polymer J was calculated from the charge amounts, and as a result, was 25%.

[Synthesis Example of Polyimide K]

To a three-neck separable flask were attached a nitrogen introduction tube, thermometer, and bulb condenser provided with a water separation trap. In an oil bath at room temperature, in the flask were placed 130.0 g of γ-butyrolactone, 50.0 g of 2,2'-bis(3-amino-4-hydroxyphenyl)hexafluoropropane (6FAP), and 16.34 g of polyalkyl ether diamine (Brand Name: Baxxodur (Registered Trademark) EC302, made by BASF Company), and the mixture was stirred to be uniform at 60° C. Further, 29.47 g of 4,4'-oxydiphthalic dianhydride (ODPA) was added gradually. After 30 minutes, 1.48 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide K varnish was obtained. The weight average molecular weight was 32,000. The content of the structure expressed by general formula (3) relative to all the mass of the polymer K was calculated from the charge amounts, and as a result, was 20%.

[Synthesis Example of Polyimide L]

To a three-neck separable flask were attached a nitrogen introduction tube, thermometer, and bulb condenser provided with a water separation trap. In an oil bath at room temperature, in the flask were placed 145.6 g of γ-butyrolactone, 50.0 g of toluene, 30.4 of 2,2'-bis(3-amino-4-hydroxyphenyl)hexafluoropropane (6FAP), and 17.00 g of polyalkyl ether diamine (Brand Name: Jeffamine (XTJ-542), made by Huntsman International LLC.), and the mixture was stirred to be uniform at 60° C. Further, 30.09 g of 4,4'-oxydiphthalic dianhydride (ODPA) was added gradually. After 30 minutes, 0.89 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide L varnish was obtained. The weight average molecular weight was 91,000. The content of the structure expressed by general formula (3) relative to all the mass of the polymer L was calculated from the charge amounts, and as a result, was 20%.

[Synthesis Example of Polyimide M]

To a three-neck separable flask were attached a nitrogen introduction tube, thermometer, and bulb condenser provided with a water separation trap. In an oil bath at room temperature, in the flask were placed 199.7 g of γ-butyrolactone, 50.0 g of toluene, 13.55 of 2,2'-bis(3-amino-4-hydroxyphenyl)hexafluoropropane (6FAP), and 63.00 g of polyalkyl ether diamine (Brand Name: Jeffamine (XTJ-542), made by Huntsman International LLC.), and the mixture was stirred to be uniform at 60° C. Further, 30.09 g of 4,4'-oxydiphthalic dianhydride (ODPA) was added gradually. After 30 minutes, 0.89 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide M varnish was obtained. The weight average molecular weight was 86,000. The content of the structure expressed by general formula (3) relative to all the mass of the polymer M was calculated from the charge amounts, and as a result, was 55%.

[Synthesis Example of Polyimide N]

To a three-neck separable flask were attached a nitrogen introduction tube, thermometer, and bulb condenser provided with a water separation trap. In an oil bath at room temperature, in the flask were placed 213.8 g of γ-butyrolactone, 50.0 g of toluene, 9.16 of 2,2'-bis(3-amino-4-hydroxyphenyl)hexafluoropropane (6FAP), and 75.00 g of polyalkyl ether diamine (Brand Name: Jeffamine (XTJ-542), made by Huntsman International LLC.), and the mixture was stirred to be uniform at 60° C. Further, 30.09 g of 4,4'-oxydiphthalic dianhydride (ODPA) was added gradually. After 30 minutes, 0.89 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide N varnish was obtained. The weight average molecular weight was 91,000. The content of the structure expressed by general formula (3) relative to all the mass of the polymer N was calculated from the charge amounts, and as a result, was 61%.

[Synthesis Example of Polyimide O]

To a three-neck separable flask were attached a nitrogen introduction tube, thermometer, and bulb condenser provided with a water separation trap. In an oil bath at 80° C., in the flask were placed 171.6 g of γ-butyrolactone, 50 g of toluene, and 16.31 g of 4, 4'-oxydiphthalic dianhydride (ODPA), and the mixture was stirred to be uniform. Further, 1.37 g of silicone diamine (LP-7100, made by Shin-Etsu Chemical Co., Ltd.), 1.86 g of 5,5'-methylene-bis(anthranilic acid) (MBAA) and 15.83 g of polyalkyl ether diamine (Baxxodur (Registered Trademark) EC302, made by BASF Company) were gradually added, and then, the mixture was heated to 180° C., and heated for 2 hours. During the reaction, by-product water was removed from the reaction system by azeotropy dehydration with toluene under toluene reflux. After removing by-product water from the water separation trap, reflux was halted, toluene was removed, and the resultant was cooled to room temperature. Next, the product was press-filtered with a filter of 5 μm, and polyimide O varnish was obtained. The weight average molecular weight was 28,000. The content of the structure expressed by general formula (3) relative to all the mass of the polymer O was calculated from the charge amounts, and as a result, was 42%.

[Synthesis Example of Polyimide P]

To a three-neck separable flask were attached a nitrogen introduction tube, thermometer, and bulb condenser provided with a water separation trap. In an oil bath at room temperature, in the flask were placed 171.6 g of γ-butyrolactone, 50.0 g of toluene, 10.99 g of 2,2'-bis(3-amino-4-hydroxyphenyl)hexafluoropropane (6FAP), 7.84 g of 5,5'-methylene-bis(anthranilic acid) (MBAA), and 42.60 g of polyalkyl ether diamine (Brand Name: Jeffamine (XTJ-542), made by Huntsman International LLC.), and the mixture was stirred to be uniform at 60° C. Further, 30.09 g of 4,4'-oxydiphthalic dianhydride (ODPA) was added gradually. After 30 minutes, 0.89 g of phthalic anhydride was added, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide P varnish was obtained. The weight average molecular weight was 76,000. The content of the structure expressed by general formula (3) relative to all the mass of the polymer P was calculated from the charge amounts, and as a result, was 45%.

[Synthesis of Phosphazene Compound A]

The phosphazene compound A having cyano groups was synthesized by the method as described in Synthesis Example 17 of Japanese Unexamined Patent Publication No. 2002-114981.

To a four-neck flask of capacity of 2 L provided with a stirring apparatus, heating apparatus, thermometer, and dehydration apparatus were added 1.32 mol (157.2 g) of 4-cyanophenol, 2.20 mol (124.2 g) of phenol, 2.64 mol (105.6 g) of sodium hydroxide and 1000 ml of toluene. The mixture was heated and refluxed, and water was removed from the system to prepare a toluene solution of sodium salts of cyanophenol and phenol. To the toluene solution of sodium salts of cyanophenol and phenol was dropped 580 g of 20% chlorobenzene solution containing 1 unit mol (115.9 g) of dichlorophosphazene oligomer while stirring at an inner temperature of 30° C. or less. After refluxing the mixed solution for 12 hours, 5% aqueous sodium hydroxide was added to the reaction mixture, and the resultant was washed two times. Next, the organic layer was neutralized with diluted sulfuric acid, water washing was then performed two times, and the organic layer was filtered, concentrated and subjected to vacuum drying to obtain a target substance (phosphazene compound A).

[Synthesis of Phosphazene Compound B]

The phosphazene compound B having phenolic hydroxyl groups was synthesized by the method as described in Synthesis Example 4 of International Publication No. 2005/019231 Pamphlet.

Into a four-neck flask of capacity of 2 L provided with a reflux condenser, thermometer, stirrer, and drop funnel were charged 58 g (0.5 unit mol, with NPC12 as one unit) of hexachloro cyclotriphosphazene with a purity of 99.9% and 100 mL of THF to be a solution. Next, a separately prepared THF solution of Na-salt of 4-methoxyphenol (68.3 g (0.55 mol) of 4-methoxyphenol, 11.1 g (0.44 g-atom) of sodium, 200 ml of THF) was dropped into the THF solution of hexachloro cyclotriphosphazene as described above for 1 hour while stirring. At this point, the reaction was carried out while cooling as appropriate so that the reaction temperature did not exceed 30° C. After dropping, the stirring reaction was carried out at 60° C. for 6 hours subsequently. Next, a separately prepared THF solution of sodium phenolate (61.2 g (0.65 mol) of phenol, 13.8 g (0.6 g-atom) of sodium, 200 mL of THF) was dropped for 1 hour while cooling and controlling so that the reaction temperature was 30° C. or less. Next, the reaction was carried out at room temperature for 5 hours and then at a reflux temperature for 3 hours, and was completed. After finishing the reaction, THF that was the solvent was distilled under a reduced pressure, 500 mL of toluene was next added to redissolve the product, and 300 mL of water was further added to wash and separate. The organic layer was subjected to washing with 5% aqueous sodium hydroxide and washing with 2% aqueous sodium hydroxide each once, washing with (1+9) hydrochloric acid solution once, washing with 5% sodium bicarbonate solution once, and further to washing with water twice, and the water layer was made neutral. Next, the organic layer was separated and was dehydrated with anhydrous magnesium sulfate, and toluene was distilled to obtain a light yellow oil-shaped product. The residual chlorine amount was 0.01% or less. Into a four-neck flask of capacity of 2 L were charged 116.2 g (0.45 unit mol) of cyclotriphosphazene with 4-methoxy phenoxy group and phenoxy group mixed and substituted obtained by the above-mentioned method and 583.6 g (5.05 mol) of pyridine hydrochloride, the mixture was heated gradually, and the reaction was carried out at 205° C. to 210° C. for 1 hour. Subsequently, the product was purified to obtain a target substance (phosphazene compound B).

[Example 1]

A resin composition was prepared so that the solid content of the polyimide A was 84 mass % and that 1,3-bis(4,5-dihydro-2-oxazolyl)benzene (PBO) as the oxazoline compound was 16 mass %, and was diluted with γ-butyrolactone so that the total solid content of the resin composition was 40 mass %. Using the resin composition solution, a layered product was prepared, and the prepared layered product was evaluated.

[Examples 2 to 25, Experiment Example 1]

As in Example 1, resin compositions of Examples 2 to 25 and Experiment Example 1 were prepared so as to obtain compositions as shown in Tables 1 and 2, a layered product was prepared using each of the resin compositions, and the prepared layered product was evaluated.

In addition, bisphenol A bis(triethylene glycol glycidyl ether)ether (Brand Name: BEO-60E, made by New Japan Chemical Co., Ltd.) was used as the epoxy compound. Bisphenol S type benzoxazine (Brand Name: BS-BXZ, made by Konishi Chemical Inc. Co., Ltd.) was used as the benzoxazine compound. The hexamethylene diisocyanate-based compound (Brand Name: TPA-100, made by Asahi Kasei Chemicals Corporation) was used as the isocyanate compound. X-22-1821 (Hydroxyl value 38 mgKOH/g, made by Shin-Etsu Chemical Co., Ltd.) was used as the dual-end phenol-modified silicone. Used as the flame retardant were the phosphazene compound A having cyano groups, the phosphazene compound B having phenolic hydroxyl groups and composite magnesium hydroxide (Brand Name: MGZ-5R, made by Sakai Chemical Co., Ltd.). IRGANOX 245 (IRG 245, made by BASF Company) was used as the antioxidant. A layered product was prepared using a solution that was diluted with γ-butyrolactone so that the total solid content of the resin composition was 40 mass % as in Example 1, and the prepared layered product was evaluated. Tables 4 and 5 show evaluation results of Examples 1 to 25 and Experiment Example 1.

[Comparative Examples 1 to 10]

As in Example 1, resin compositions were prepared so as to obtain compositions as shown in Table 3, a layered product was prepared using each of the resin compositions, and the prepared layered product was evaluated.

In addition, the three-functional epoxy resin (Brand Name: VG3101, made by Printec Co.) was used as the epoxy compound. The hexamethylene diisocyanate-based block isocyanate (Brand Name: SBN-70D, made by Asahi Kasei Chemicals Corporation) was used as block isocyanate.

Table 6 shows evaluation results of Comparative Examples 1 to 10.

TABLE 1

| | | | Example | | | | | | | | | | | | |
|---|---|---|---|---|---|---|---|---|---|---|---|---|---|---|---|
| | | | 1 | 2 | 3 | 4 | 5 | 6 | 7 | 8 | 9 | 10 | 11 | 12 | 13 |
| Composition · Mass % | (A) Polyimide | Polyimide A | 84 | 73 | 63 | 57 | | | | | | | | | |
| | | Polyimide B | | | | | 84 | 73 | | | | | | | |
| | | Polyimide C | | | | | | | 60 | | | | | | |
| | | Polyimide D | | | | | | | | 65 | | | | | |
| | | Polyimide E | | | | | | | | | 66 | | | | |
| | | Polyimide F | | | | | | | | | | 88 | | | |
| | | Polyimide G | | | | | | | | | | | 51 | | |
| | | Polyimide H | | | | | | | | | | | | 86 | |
| | | Polyimide I | | | | | | | | | | | | | 92 |
| | | Polyimide J | | | | | | | | | | | | | |
| | | Polyimide K | | | | | | | | | | | | | |
| | | Polyimide L | | | | | | | | | | | | | |
| | | Polyimide M | | | | | | | | | | | | | |
| | | Polyimide N | | | | | | | | | | | | | |
| | | Polyimide O | | | | | | | | | | | | | |
| | | Polyimide P | | | | | | | | | | | | | |
| | (B) Reactive compound | PBO | 16 | 27 | 12 | 21 | 16 | 27 | 15 | 5 | 4 | 10 | 7 | 12 | 8 |
| | | VG3101 | | | | | | | | | | | | | |
| | | BEO-60E | | | | | | | | | | | | | |
| | | BS-BXZ | | | | | | | | | | | | | |
| | | TPA-100 | | | | | | | | | | | | | |
| | | SBN-70D | | | | | | | | | | | | | |
| | (C) Diol | X-22-1821 | | | | | | | | | | | | | |
| | | T5651 | | | | | | | | | | | | | |
| | (D) Flame retardant | Phosphazene A | | | 25 | 22 | | | 6 | 30 | 30 | | | | |
| | | Phosphazene B | | | | | | | 18 | | | | | | |
| | | MGZ-5R | | | | | | | | | | | 40 | | |
| | Other | IRG245 | | | | | | | 1 | | | 2 | 2 | 2 | |
| Hydroxyl group/Oxazoline group | | | 1.0 | 0.5 | 1.0 | 0.5 | 1.0 | 0.5 | 0.5 | 1.7 | 2.3 | 1.0 | 1.0 | 1.0 | 1.0 |
| Acidic functional group/Reactive functional group | | | 1.0 | 0.5 | 1.0 | 0.5 | 1.0 | 0.5 | 1.0 | 1.7 | 2.3 | 1.0 | 1.0 | 1.0 | 1.0 |

TABLE 2

| | | | Example | | | | | | | | | | | | Experiment |
|---|---|---|---|---|---|---|---|---|---|---|---|---|---|---|---|
| | | | 14 | 15 | 16 | 17 | 18 | 19 | 20 | 21 | 22 | 23 | 24 | 25 | Example 1 |
| Composition · Mass % | (A) Polyimide | Polyimide A | | | | | | | | | | | | | |
| | | Polyimide B | | | | | | | | | | | | | |
| | | Polyimide C | | | | | | | | | | | | | |
| | | Polyimide D | | | | | | | | | | | | | |
| | | Polyimide E | | | | | | | | | | 85 | | | 83 |
| | | Polyimide F | | | | | | | | | | | | | |
| | | Polyimide G | | | | | | | | | | | | | |
| | | Polyimide H | | | | | | | 79 | 82 | 85 | | 82 | | |
| | | Polyimide I | | | | | | | | | | | | 98 | |
| | | Polyimide J | 88 | | | | | | | | | | | | |
| | | Polyimide K | | 82 | | | | | | | | | | | |
| | | Polyimide L | | | 79 | | | | | | | | | | |
| | | Polyimide M | | | | 91 | | | | | | | | | |
| | | Polyimide N | | | | | 93 | | | | | | | | |
| | | Polyimide O | | | | | | | | | | | | | |
| | | Polyimide P | | | | | | | | | | | | 86 | |
| | (B) Reactive compound | PBO | 10 | 16 | 19 | 7 | 5 | 6 | 6 | 8 | 12 | 11 | 12 | 2 | 12 |
| | | VG3101 | | | | | | | | | | | | | |
| | | BEO-60E | | | | | | 15 | | | | | | | |
| | | BS-BXZ | | | | | | | 12 | | | | | | |
| | | TPA-100 | | | | | | | | 5 | | | 2 | | |
| | | SBN-70D | | | | | | | | | | | | | |
| | (C) Diol | X-22-1821 | | | | | | | | | | 3 | | | 5 |
| | | T5651 | | | | | | | | | | | | 3 | |

TABLE 2-continued

|  |  |  | Example |  |  |  |  |  |  |  |  |  |  |  | Experiment |
|---|---|---|---|---|---|---|---|---|---|---|---|---|---|---|---|
|  |  |  | 14 | 15 | 16 | 17 | 18 | 19 | 20 | 21 | 22 | 23 | 24 | 25 | Example 1 |
|  | (D) Flame retardant | Phosphazene A Phosphazene B MGZ-5R |  |  |  |  |  |  |  |  |  |  |  |  |  |
|  | Other | IRG245 | 2 | 2 | 2 | 2 | 2 |  |  | 2 |  | 2 | 2 |  |  |
| Hydroxyl group/Oxazoline group |  |  | 1.0 | 1.0 | 1.0 | 1.0 | 1.0 | 1.8 | 1.9 | 1.5 | 1.0 | 1.0 | 0.5 | 4.0 | 1.0 |
| Acidic functional group/ Reactive functional group |  |  | 1.0 | 1.0 | 1.0 | 1.0 | 1.0 | 1.0 | 1.0 | 1.0 | 1.0 | 1.0 | 1.0 | 4.0 | 1.0 |

TABLE 3

|  |  |  | Comparative Example |  |  |  |  |  |  |  |  |  |
|---|---|---|---|---|---|---|---|---|---|---|---|---|
|  |  |  | 1 | 2 | 3 | 4 | 5 | 6 | 7 | 8 | 9 | 10 |
| Composition · Mass % | (A) Polyimide | Polyimide A |  |  |  |  |  |  |  |  |  |  |
|  |  | Polyimide B |  |  |  |  |  |  |  |  |  |  |
|  |  | Polyimide C |  |  |  |  |  |  |  |  |  |  |
|  |  | Polyimide D |  |  |  |  |  |  |  |  |  |  |
|  |  | Polyimide E |  |  |  |  |  |  |  |  |  |  |
|  |  | Polyimide F |  |  |  |  |  |  |  |  |  |  |
|  |  | Polyimide G |  |  |  |  |  |  |  |  |  |  |
|  |  | Polyimide H | 98 |  |  |  |  | 68 | 76 | 81 | 73 | 70 |
|  |  | Polyimide I |  |  |  |  |  |  |  |  |  |  |
|  |  | Polyimide J |  |  |  |  |  |  |  |  |  |  |
|  |  | Polyimide K |  |  |  |  |  |  |  |  |  |  |
|  |  | Polyimide L |  |  |  |  |  |  |  |  |  |  |
|  |  | Polyimide M |  |  |  |  |  |  |  |  |  |  |
|  |  | Polyimide N |  |  |  |  |  |  |  |  |  |  |
|  |  | Polyimide O |  | 84 | 79 | 94 | 91 |  |  |  |  |  |
|  |  | Polyimide P |  |  |  |  |  |  |  |  |  |  |
|  | (B) Reactive compound | PBO |  | 16 | 11 | 4 | 2 |  |  |  |  |  |
|  |  | VG3101 |  |  | 3 |  | 2 |  |  |  |  |  |
|  |  | BEO-60E |  |  | 7 |  | 3 | 30 |  |  |  |  |
|  |  | BS-BXZ |  |  |  |  |  |  | 22 |  |  |  |
|  |  | TPA-100 |  |  |  |  |  |  |  | 17 |  | 18 |
|  |  | SBN-70D |  |  |  |  |  |  |  |  | 25 |  |
|  | (C) Diol | X-22-1821 |  |  |  |  |  |  |  |  |  |  |
|  |  | T5651 |  |  |  |  |  |  |  |  |  | 10 |
|  | (D) Flame retardant | Phosphazene A |  |  |  |  |  |  |  |  |  |  |
|  |  | Phosphazene B |  |  |  |  |  |  |  |  |  |  |
|  |  | MGZ-5R |  |  |  |  |  |  |  |  |  |  |
|  | Other | IRG245 | 2 |  | 2 | 2 | 2 | 2 | 2 | 2 | 2 | 2 |
| Hydroxyl group/Oxazoline group |  |  | — | 0 | 0 | 0 | 0 | — | — | — | — | — |
| Acidic functional group/ Reactive functional group |  |  | — | 0.2 | 0.2 | 1.0 | 1.0 | 1.0 | 1.0 | 1.0 | 1.0 | 1.0 |

TABLE 4

|  |  |  | Example |  |  |  |  |  |  |
|---|---|---|---|---|---|---|---|---|---|
|  |  |  | 1 | 2 | 3 | 4 | 5 | 6 | 7 |
| Parameter | Before cure | Alkali solution rate (μm/sec) | 0.14 | 0.15 | 0.15 | 0.16 | 0.2 | 0.2 | 0.55 |
|  |  | Alkali solution rate ratio 90° C. 10 min | 0.99 | 0.99 | 0.99 | 0.99 | 0.98 | 0.98 | 0.98 |
|  |  | Thermogravimetric decrease amount(%) | 0.3 | 0.3 | 0.6 | 0.5 | 0.3 | 0.3 | 1.7 |
|  | After cure (180° C., 60 min) | Alkali solution rate ratio(μm/sec) | 0.002 | 0.003 | 0.002 | 0.003 | 0.002 | 0.003 | 0.002 |
|  |  | Bleed-out (mg/m$^2$) | <20 | <20 | 22 | 20 | <20 | <20 | <20 |

TABLE 4-continued

| Evaluation | Through hole embeddability | Δ | Δ | Δ | Δ | Δ | Δ | ○ |
|---|---|---|---|---|---|---|---|---|
| | Solder heat resistance | ⊚ | ⊚ | ⊚ | ⊚ | ⊚ | ⊚ | ⊚ |
| | Bendability | ⊚ | ⊚ | ⊚ | ⊚ | ⊚ | ⊚ | ⊚ |
| | Insulation reliability | ⊚ | ⊚ | ⊚ | ⊚ | ⊚ | ⊚ | ⊚ |
| | Alkali processability | ○ | ○ | ○ | ○ | ○ | ○ | ○ |
| | Adhesion | ⊚ | ⊚ | ○ | ○ | ⊚ | ⊚ | ⊚ |

| | | | Example | | | | | |
|---|---|---|---|---|---|---|---|---|
| | | | 8 | 9 | 10 | 11 | 12 | 13 |
| Parameter | Before cure | Alkali solution rate (μm/sec) | 0.2 | 0.2 | 0.22 | 0.26 | 0.29 | 0.18 |
| | | Alkali solution rate ratio 90° C. 10 min | 0.98 | 0.98 | 0.98 | 1.0 | 1.0 | 0.99 |
| | | Thermogravimetric decrease amount(%) | 0.5 | 0.5 | 1.5 | 1.8 | 1.5 | 0.4 |
| | After cure (180° C., 60 min) | Alkali solution rate ratio(μm/sec) | 0.002 | 0.002 | 0.002 | 0.003 | 0.003 | 0.002 |
| | | Bleed-out (mg/m²) | 22 | 25 | <20 | <20 | <20 | <20 |
| Evaluation | Through hole embeddability | | Δ | Δ | ⊚ | ⊚ | ⊚ | ○ |
| | Solder heat resistance | | ⊚ | ⊚ | ⊚ | ⊚ | ⊚ | ⊚ |
| | Bendability | | ⊚ | ○ | ⊚ | ⊚ | ⊚ | ⊚ |
| | Insulation reliability | | ⊚ | ⊚ | ⊚ | ⊚ | ⊚ | ⊚ |
| | Alkali processability | | ○ | ○ | ○ | ○ | ○ | ○ |
| | Adhesion | | ○ | ○ | ⊚ | ⊚ | ⊚ | ⊚ |

TABLE 5

| | | | Example | | | | | | |
|---|---|---|---|---|---|---|---|---|---|
| | | | 14 | 15 | 16 | 17 | 18 | 19 | 20 |
| Parameter | Before cure | Alkali solution rate (μm/sec) | 0.23 | 0.35 | 0.23 | 0.23 | 0.22 | 0.17 | 0.26 |
| | | Alkali solution rate ratio 90° C. 10 min | 1.0 | 1.0 | 1.0 | 1.0 | 1.0 | 0.95 | 0.99 |
| | | Thermogravimetric decrease amount(%) | 1.4 | 1.3 | 1.4 | 1.7 | 1.7 | 1.6 | 2.0 |
| | After cure (180° C., 60 min) | Alkali solution rate ratio(μm/sec) | 0.003 | 0.002 | 0.003 | 0.003 | 0.004 | 0.001 | 0.017 |
| | | Bleed-out (mg/m²) | <20 | <20 | <20 | <20 | <20 | <20 | <20 |
| Evaluation | Through hole embeddability | | ⊚ | Δ | ○ | ⊚ | ⊚ | Δ | ⊚ |
| | Solder heat resistance | | ⊚ | ⊚ | ⊚ | ⊚ | ⊚ | ⊚ | ○ |
| | Bendability | | ○ | Δ | ○ | ⊚ | ⊚ | Δ | ⊚ |
| | Insulation reliability | | ⊚ | ⊚ | ⊚ | ○ | ○ | ⊚ | Δ |
| | Alkali processability | | ○ | ○ | ○ | ○ | ○ | ○ | ○ |
| | Adhesion | | ○ | ○ | ○ | ⊚ | ⊚ | ⊚ | ⊚ |

| | | | Example | | | | | Experiment |
|---|---|---|---|---|---|---|---|---|
| | | | 21 | 22 | 23 | 24 | 25 | Example 1 |
| Parameter | Before cure | Alkali solution rate (μm/sec) | 0.21 | 0.11 | 0.13 | 0.23 | 0.16 | 0.11 |
| | | Alkali solution rate ratio 90° C. 10 min | 0.96 | 0.98 | 0.95 | 0.96 | 0.98 | — |
| | | Thermogravimetric decrease amount(%) | 1.6 | 0.8 | 1.7 | 1.6 | 0.4 | 0.9 |
| | After cure (180° C., 60 min) | Alkali solution rate ratio(μm/sec) | 0.002 | 0.003 | 0.003 | 0.002 | 0.012 | 0.003 |
| | | Bleed-out (mg/m²) | <20 | 43 | 40 | <20 | <20 | 75 |
| Evaluation | Through hole embeddability | | Δ | ○ | Δ | Δ | ○ | ○ |
| | Solder heat resistance | | ⊚ | ⊚ | ⊚ | ⊚ | ⊚ | ⊚ |
| | Bendability | | ⊚ | ⊚ | ⊚ | ⊚ | ⊚ | ⊚ |
| | Insulation reliability | | ⊚ | ⊚ | ⊚ | ⊚ | Δ | ⊚ |
| | Alkali processability | | ○ | ○ | ○ | ○ | ○ | ○ |
| | Adhesion | | ⊚ | Δ | Δ | ⊚ | ⊚ | X |

TABLE 6

| | | | Comparative Example | | | | | | | | | |
|---|---|---|---|---|---|---|---|---|---|---|---|---|
| | | | 1 | 2 | 3 | 4 | 5 | 6 | 7 | 8 | 9 | 10 |
| Parameter | Before cure | Alkali solution rate (μm/sec) | 0.31 | 0.06 | 0.09 | 0.09 | 0.08 | 0.04 | 0.27 | 0.08 | 0.27 | Presence of coating |
| | | Alkali solution rate ratio 90° C. 10 min | 1.0 | 0.9 | 0.92 | 0.93 | 0.91 | 0.92 | 0.98 | 0.9 | 1.0 | — |
| | | Thermogravimetric decrease amount(%) | 1.4 | 1.7 | 1.8 | 1.6 | 1.6 | 1.6 | 2.6 | 1.7 | 4 | 1.7 |
| | After cure (180° C., 60 min) | Alkali solution rate ratio(μm/sec) | 0.3 | 0.002 | 0 | 0.002 | 0 | 0 | 0.033 | 0.002 | 0.002 | 0.002 |
| | | Bleed-out(mg/m²) | <20 | <20 | <20 | <20 | <20 | <20 | <20 | <20 | <20 | 65 |
| Evaluation | | Through hole embeddability | ◎ | X | X | X | X | X | ◎ | X | ◎ | X |
| | | Solder heat resistance | ◎ | ◎ | ◎ | ◎ | ◎ | ◎ | X | ◎ | X | ◎ |
| | | Bendability | ○ | ○ | X | ◎ | X | X | ◎ | ◎ | ◎ | ◎ |
| | | Insulation reliability | X | ◎ | ◎ | ◎ | ◎ | ◎ | X | ◎ | ◎ | ◎ |
| | | Alkali processability | ○ | X | X | X | X | X | ○ | X | ○ | X |
| | | Adhesion | ◎ | ◎ | ◎ | ◎ | ◎ | ◎ | ◎ | ◎ | ◎ | X |

As can be seen from Tables 4 to 6, in the resin compositions containing polyimides A to N and oxazoline compound (PBC)), the alkali solution rate ratios were 0.95 or more, and embeddability in through holes in press was good (Examples 1 to 18). It is conceivable that the reason of the results is that the polyimides A to N had the structure with phenolic hydroxyl groups expressed by above-mentioned general formula (A-1), the crosslinking reaction between the polyimides A to N and (B-1) the oxazoline compound (PBO) was thereby suppressed on the solvent dry conditions (after heating at 95° C. for 15 minutes, vacuum drying of 90° C. for 30 minutes) of the layered product and after the heat history of 90° C. for 10 minutes, and that flowability was not impaired.

Particularly, with respect to Examples 11, 12 and 14 to 18 using polyimides G, H, J, K, L, M and N with terminals of the polyimide blocked, extremely good alkali solution rate ratios were exhibited, and embeddability was also good. It is conceivable that the reason is that the reaction did not proceed because the terminals were blocked, although the reactivity relatively is high between acid dianhydride that is the polymer terminal of the terminal-unblocked polyimide and the oxazoline compound.

Further, with respect to Examples 7, 10, 11, 12, 14 and 17 using polyimides C, F, G, H, J and M having the structure (flexible segment) expressed by general formula (3), embeddability in through holes was good, and particularly, with respect to Examples 10 to 12, 14 and 17 using polyimides F, G, H, J and M containing linear polymer tetramethylene groups, it is understood that it is possible to suitably use for substrates having through holes with high aspect ratios exceeding 1.0.

In the resin compositions containing the polyimides A to N and oxazoline compound (PBO), the alkali solution rates after heat curing were in the range of 0.002 μm/sec to 0.005 μm/sec, bendability and insulation reliability were both good, and it is conceivable that the reason of the results is that the crosslinking density between the polyimide and the oxazoline compound was controlled moderately. Further, in Examples 7, 10, 11, 12, 14 and 17 using polyimides C, F, G, H, J and M in which the content of the structure expressed by general formula (3) was in the range of 25 mass % to 55 mass %, bendability was particularly excellent.

In each of the resin compositions of Examples 1 to 25, the thermogravimetric decrease amount was 2.0% or less, the outgassing amount in heat was reduced, and it is understood that high heat resistance is obtained.

Further, in the each of Examples 1 to 24, the initial alkali solution rate after solvent drying and the alkali solution rate ratio were 0.95 or more, and the evaluation of alkali processability was good. As described previously, it is conceivable that the reason of the result is that the polyimides A to N had the structure with phenolic hydroxyl groups expressed by above-mentioned general formula (A-1), and that the crosslinking reaction between the polyimides A to N and the (B-1) oxazoline compound (PBO) was thereby suppressed on the solvent cry conditions (after heating at 95° C. for 15 minutes, vacuum drying of 90° C. for 30 minutes) of the layered product and after the heat history of 90° C. for 10 minutes.

On the other hand, in Examples 19 to 21 with a part of (B-1) the oxazoline compound replaced with (B-2) the epoxy compound, (B-3) the benzoxazine compound or (B-4) the isocyanate compound, Examples 22 and 23 containing 3 mass % (C) the compound containing polyfunctional hydroxyl groups, and Example 24 containing the polyimide P with a half amount of phenolic hydroxyl group of (A-2) the polyimide containing the phenolic hydroxyl groups replaced with carboxyl groups, all the parameters according to Embodiment 1 were satisfied, and good results were obtained.

Further, in Examples 1 to 25, ratios of phenolic hydroxyl groups of (A-1) the polyimide having the phenolic hydroxyl groups to oxazoline groups that (B-1) the oxazoline compound had were in the range of 0.5 to 4.0 In this range, all of the parameters (a) to (d) according to Embodiment 1 were satisfied, and good evaluation results were obtained.

From the results, it is understood that it is possible to suitably use the resin compositions according to Embodiment 1 to 25 as a surface protective film of a semiconductor device and the like.

In contrast thereto, in the resin composition containing the polyimide O that was (A-2) the polyimide having carboxyl groups, the initial alkali solution rate and alkali solution rate ratio were low, and through hole embeddability and evaluation of alkali processability was failure (Comparative Examples 2 to 5). It is conceivable that the reason of the result is that the crosslinking reaction proceeded between the polyimide O and the oxazoline compound (PBO).

Further, in Comparative Examples 3, 5 and 6, since (B-2) the epoxy compound rich in reactivity was contained, the reaction proceeded at low temperatures, and through hole embeddability was poor. Particularly, in Comparative Example 6 high in the epoxy additive amount, the crosslinking density in heat curing was improved, and the alkali solution rate of the cured material was 0. In this case, insulation reliability was good, but bendability was insufficient.

In Comparative Example 7, a large amount of (B-3) the benzoxazine was contained, and alkali solubility after cure was large. It is conceivable that the reason is that benzoxazine self-reacted in heat curing, and that phenolic hydroxyl groups were generated as a by-product, and insulation reliability and heat resistance was insufficient.

In Comparative Example 8, a large amount of (B-4) the isocyanate compound rich in reactivity was contained. Therefore, as in the epoxy compound, the reaction proceeded at low temperatures, and through hole embeddability degraded.

In Comparative Example 9, the block isocyanate was contained, the reactivity at low temperatures was thereby suppressed, and through hole embeddability was good. However, in the temperature rising process to 260° C., the blocking agent was removed to volatilize, the thermogravimetric decrease amount was extremely large, and in the heat resistance test, delamination occurred in the entire interface between the copper and the resin cured material.

With respect to Comparative Example 10, in the alkali solution rate evaluation, a thin coating that was visually identified remained on the copper even after spraying alkali for 1000 seconds, and alkali processability was insufficient.

Further, with respect to Experiment Example 1 and Comparative Example 10, in the bleed-out test, such a phenomenon was identified that a sticky substance oozed to the surface, and adhesion was insufficient. It is conceivable that the reason of the result is that (C) the compound containing polyfunctional hydroxyl groups which was unreacted and remained in heat curing was bled out over time because of poor comparability with the crosslinked material of the polyimide.

From these results, it is understood that the resin compositions according to Comparative Examples 1 to 10 are not allowed to obtain sufficient performance as a surface protective film of a semiconductor device and the like.

(Embodiment 2)

Examples 26 to 31 relating to Embodiment 2 will be described.

(Layered Product and Conformal Mask Preparation for Via Formation)

A resin composition solution was applied onto electrolytic copper foil (F2-WS) (made by Furukawa Circuit Foil Co., Ltd.) with a thickness of 12 μm using the bar coater, and then, was heated for 15 minutes in an oven heated to 95° C., and then, the solvent was removed by vacuum-drying at 95° C. for 30 minutes to obtain the copper foil with the resin having the resin composition layer with a thickness of 25 μm to be an outer layer material. The resin composition layer side of the copper foil with the resin was laid and placed on copper foil of a single-sided flexible wiring substrate (ESPANEX (Registered Trademark) M) (made by Nippon Steel Chemical Co., Ltd.) with a thickness of copper foil of 12 μm and a thickness of the insulating resin layer of 20 lam, and the both surfaces were further sandwiched by mold release films to prepare a layered product.

Next, the vacuum press apparatus (made by KITAGAWA SEIKI Co., Ltd.) with heat resistant silicone rubber with hardness of 50 degrees bonded to upper and lower both-side surface plates was beforehand heated to 100° C., and then, the layered product was put in the apparatus. After performing vacuuming for 2 minutes without pressurizing, the layered product was pressurized with a pressure of 1 MPa for 2 minutes to crimp.

Next, a dry film resist (SUNFORT (Registered Trademark) AQ2578) (made by Asahi Kasei E-materials Corporation) was bonded onto the copper foil of the outer layer with a roll laminator, and then, the copper foil in predetermined positions was etched and removed by exposure • development and etching to form conformal masks with 100 μmΦ at pitch intervals of 300 μm and a hole pattern with a diameter of 3 mm.

(Evaluation J: Blind Via Shape Evaluation)

Blind vias of the flexible wiring board prepared by the method as described in each Example were embedded with an epoxy resin, and cross section polishing processing was performed perpendicularly on the embedded wiring board up to the center position of the blind via diameter using a polishing apparatus (made by Marumoto Sutoratos Corporation). Subsequently, observation with an optical microscope with length measurement function was performed to measure values of parameters x and y of the via shape described with reference to FIG. 5. In addition, with respect to observation, 10 blind via holes were observed to calculate average values of parameters x and y.

(Evaluation K: Resin Modified Portion Thickness Evaluation)

The surface layer of the sample for cross section observation of the evaluation J as described above was subjected to dry etching with Ar ion beams, and the resultant was analyzed by time-of-flight secondary ion mass spectrometry (TOF-SIMS) to measure a maximum value (maximum thickness of the resin modified portion) of the distance in the horizontal direction from the portion in contact with the side wall of the via to the portion containing total 50 ppm of sodium (Na) and potassium (K) of the interlayer resin layer.

Measurement conditions of TOF-SIMS are shown below.

Apparatus: TOF-SIM 5 made by ION-TOF GmbH

Primary ion: Bi3

Acceleration voltage: 25 keV, Current amount: 0.3 pA-10 kHz

In addition, two blind via holes were observed for one level, and the thickness of the resin modified portion was set at the maximum value of two holes.

(Evaluation L: Thin Nonelectrolytic Copper Coating Evaluation)

First, a substrate of a single-sided flexible wiring substrate (ESPANEX (Registered Trademark) M) (made by Nippon Steel Chemical Co., Ltd.) with a thickness of copper foil of 12 μm and a thickness of the insulating resin layer of 20 μm was beforehand cut to 100×300 mm, and the weight was measured in advance. After performing nonelectrolytic copper plating processing on the copper of the substrate, the resultant was dried at 100° C. for 60 minutes to remove a moisture absorption component, the weight was then measured to calculate the mass of plated copper, and based thereon, calculation was performed. Based on thus calculated result, determined were 0.5 μm-thickness nonelectrolytic copper plating conditions and 1.0 μm-thickness nonelectrolytic copper plating conditions.

The blind vias of the flexible wiring board prepared by the method as described in each of Examples 26 to 31 were subjected to nonelectrolytic copper plating with a thickness of 0.5 to 1 μm on the conditions as descried previously using a nonelectrolytic copper plating chemical solution (nonelectrolytic copper plating OPC-750) (made by Okuno Chemical Industries Co., Ltd.), and then, a copper plated layer was formed on the conditions of an electrolytic copper plating thickness of 10 μm amusing a copper sulfate plating chemical solution. Next, the vias were embedded with an epoxy resin, and cross section polishing processing was performed perpendicularly on the embedded wiring board up to the center position of the blind via diameter using the polishing apparatus (made by Marumoto Sutoratos Corporation). Further, after performing mirror surface polishing with an alumina abrasive material, the evaluation was made by optical microscope observation. With respect to the blind via cross section, it was assumed that the uniformly copper-plated section with a copper plating thickness of 7 μm or more was ⊚, the uniformly copper-plated section with a copper plating thickness of 5 μm or more and less than 7 μm was ○, the uniformly copper-plated section with a copper plating thickness less than 5 μm was Δ, and that the partially non-uniformly copper-plated section with a copper plating thickness less 5 μm was X.

(Evaluation M: Connection Reliability Evaluation)

In the flexible wiring board prepared by the method as described in each of Examples 26 to 31, using a wiring circuit formed by performing daisy chain connection on a wiring circuit of the core substrate and a wiring circuit of the outer layer substrate with 100 μmΦ-blind vias by nonelectrolytic/electrolytic copper plating, the resultant was caused to reciprocate between thermostatic ovens of 125° C. and −40° C. alternately every 15 minutes, and connection resistance values in this case were measured. With respect to the number of cycles at which variation widths in the connection resistance value from an initial value were within 10% at each temperature, it was assumed that the case of 1000 cycles or more was ⊚, the case of 500 cycles or more and less than 1000 cycles was ○, and that the case less than 500 cycles was X.

[Example 26]

A resin composition was prepared so that the solid content of the polyimide G was 51 mass %, 1,3-bis(4,5-dihydro-2-oxazolyl)benzene (PBO) was 7 mass %, composite magnesium hydroxide (Brand Name: MGZ-5R, made by Sakai Chemical Co., Ltd.) was 40 mass %, and that IRGANOX 245 (IRG 245, made by BASF Company) was 2 mass % as the antioxidant. The resin composition was diluted with γ-butyrolactone so that the total solid content of the resin composition was 40 mass %, and using the resin composition solution, a layered product and conformal masks for via formation were formed.

The resin composition layer with the hole pattern of 3 mm exposed formed in the layered product was subjected to jet treatment of 3 mass % aqueous sodium hydroxide heated to 45° C. using a full cone type spray nozzle of 0.18 MPa (jet amount 0.92 L/min), and the etching rate of the resin composition layer was 0.26 μm/sec.

Next, the resin composition layer exposed from the conformal mask portion with 100 μmΦ formed in the layered product was subjected to spray jet treatment of 3 mass % aqueous sodium hydroxide heated to 45° C. using the full cone type spray nozzle of 0.18 MPa (jet amount 0.92 L/min) for 30 seconds, and then to washing treatment for 120 seconds with spray of 0.12 MPa (jet amount 0.75 L/min), and the resin composition layer exposed from the conformal mask was etched and removed to form a blind via.

Next, using a drying oven, the resin composition layer was cured by heating at 180° C. for 1 hour.

Further, based on the method of Evaluation L, nonelectrolytic copper plating with a thickness of 0.5 μm was applied, electrolytic copper plating treatment on the condition of 10 μm was performed, and blind vias with the plating were obtained.

When the shapes of the blind vias of thus obtained substrate were examined by cross section observation, x in FIG. 5 was −15 μm, y was 20 μm, and the resin modified portion thickness in FIG. 3 was 15 μm. Further, in the substrate, thin nonelectrolytic copper coating evaluation was ⊚, and connection reliability was also ⊚.

[Example 27]

A substrate with via holes was prepared as in Example 26 except that spray jet treatment of 3 mass % aqueous sodium hydroxide heated to 45° C. was performed for 45 seconds using the full cone type spray nozzle with 0.18 MPa (jet amount 0.92 L/min), and was evaluated. The evaluation results are shown in Table 7.

[Example 28]

A substrate with via holes was prepared as in Example 27 except that the thickness of nonelectrolytic copper plating was 1.0 μm, and was evaluated. The evaluation results are shown in Table 7.

[Example 29]

A substrate with via holes was prepared as in Example 26 except that desmear treatment was performed with a KMnO solution (Nippon MacDermid Co., Ltd.) before implementing nonelectrolytic copper plating, and was evaluated. The evaluation results are shown in Table 7.

[Example 30]

A resin composition was prepared so that the solid content of the polyimide C was 52 mass %, 1,3-bis(4,5-dihydro-2-oxazolyl)benzene (PBO) was 6 mass %, the phosphazene compound A was 10 mass %, composite magnesium hydroxide (Brand Name: MGZ-5R, made by Sakai Chemical Co., Ltd.) was 30 mass %, and that IRGANOX 245 (IRG 245, made by BASF Company) was 2 mass % as the antioxidant. The resin composition was diluted with γ-butyrolactone so that the total solid content of the resin composition was 40 mass %, and the resin composition solution was used. Further, spray jet treatment was performed with 3 mass % aqueous sodium hydroxide heated to 45° C. for 25 seconds using the full cone type spray nozzle of 0.18 MPa (jet amount 0.92 L/min), water washing treatment was then performed for 120 seconds with spray of 0.12 MPa (jet amount 0.75 L/min), and the resin composition layer exposed from the conformal mask portion was etched and removed to form a blind via. Except the above-mentioned manner, as in Example 26, a substrate with via holes was prepared and evaluated. The etching rate of the resin composition layer in Example 30 was 0.48 μm/sec. The other evaluation results are shown in Table 7.

[Example 31]

A resin composition was prepared so that the solid content of the polyimide I was 51 mass %, 1,3-bis(4,5-dihydro-2-oxazolyl)benzene (PBO) was 9 mass %, the phosphazene compound B was 10 mass %, and that composite magnesium hydroxide (Brand Name: MGZ-5R, made by Sakai Chemical Co., Ltd.) was 30 mass %. The resin composition was diluted with γ-butyrolactone so that the total solid content of the resin composition was 40 mass %, and the resin composition solution was used. Further, spray jet treatment was performed with 3 mass % aqueous sodium hydroxide heated to 45° C. for 35 seconds using the full cone type spray nozzle of 0.18 MPa (jet amount 0.92 L/min), washing treatment was then performed for 120 seconds with spray of 0.12 MPa (jet amount 0.75 L/min), and the resin composition layer exposed from the conformal mask was etched and removed to form a blind via.

Except the above-mentioned manner, as in Example 26, a substrate with via holes was prepared and evaluated. The etching rate of the resin composition layer in Example 31 was 0.15 μm/sec. The other evaluation results are shown in Table 7.

[Comparative Example 11]

A substrate with via holes was prepared as in Example 26 except that spray jet treatment of 3 mass % aqueous sodium hydroxide heated to 45° C. was performed for 11 seconds using the full cone type spray nozzle with 0.18 MPa (jet amount 0.92 L/min), and was evaluated. The evaluation results are shown in Table 7.

[Comparative Example 12]

A substrate with via holes was prepared as in Example 26 except that spray treatment of 3 mass % aqueous sodium hydroxide heated to 45° C. was performed for 75 seconds using the full cone type spray nozzle with 0.18 MPa (jet amount 0.92 L/min), and was evaluated. The evaluation results are shown in Table 7.

[Comparative Example 13]

Using ESPANEX M (made by Nippon Steel Chemical Co., Ltd., copper foil thickness 12 μm, insulating resin layer thickness of 25 μm) as a double-sided flexible wiring substrate, a dry film resist (SUNFORT (Registered Trademark) AQ2578) (made by Asahi Kasei E-materials Corporation) was bonded onto copper foil with a roll laminator, and then, only one side of the copper foil in predetermined positions was etched and removed by exposure • development and etching to form conformal masks with 100 μmΦ at pitch intervals of 300 μm and a hole pattern with a diameter of 3 mm.

First, the insulating resin layer with the hole pattern of 3 mm exposed was subjected to jet treatment in the liquid using the polyimide chemical etchant (Brand Name: TPE3000, made by Toray Engineering Co., Ltd.) heated to 80° C., and the etching rate of the resin layer of ESPANEX M was 0.04 μm/sec.

The sample obtained in the above-mentioned step was subjected to wet etching on the following conditions. As pretreatment, the sample was immersed in a 0.5% aqueous solution of Surfynol 104E (Brand Name) made by Nissin Chemical Co., Ltd. that is a nonionic surfactant for 30 seconds, and then, was put in an in liquid spray scheme horizontal transfer type etching apparatus. As the etchant, the polyimide chemical etchant TPE3000 made by Toray Engineering Co., Ltd. was used, and the treatment temperature was 80° C. First, the insulating resin layer with the circular pattern of 3 mm exposed was subjected to jet treatment in the liquid using the polyimide chemical etchant (Brand Name: TPE3000, made by Toray Engineering Co., Ltd.) heated to 80° C., and the etching rate of the insulating resin layer of ESPANEX M was 0.04 μm/sec.

Next, the sample with the conformal masks of 100 μmΦ formed was treated with the treatment liquid, then subjected to in liquid spray using the polyimide etchant at 80° C. for 600 seconds, and then subjected to water washing treatment for 120 seconds with spray of 0.12 MPa (jet amount 0.75 L/min) to form blind vias.

Further, based on the method of Evaluation L, nonelectrolytic copper plating with a thickness of 0.5 μm was applied, electrolytic copper plating treatment on the condition of 10 μm was performed, and the blind vias with plating was obtained.

Thus obtained substrate with via holes was evaluated as in Example 26. The results are shown in Table 7.

[Comparative Example 14]

Evaluations were made as in Comparative Example 13 except that blind vias were formed by performing in liquid spray with the polyimide etchant at 80° C. for 700 seconds, and then, performing water washing treatment for 120 seconds by spray of 0.12 MPa (jet amount 0.75 L/min). The results are shown in Table 7.

[Comparative Example 15]

Using a double-sided flexible wiring board with conformal masks of 100 μmΦ at 300 μm pitch intervals formed by the same method as in Comparative Example 13, a carbon dioxide gas laser (made by Hitachi Construction Machinery Co., Ltd.) was applied to the insulating resin layer from the conformal mask portions to form blind vias. Desmear treatment was not performed.

Thus obtained substrate with via holes was evaluated as in Example 26. The results are shown in Table 7.

[Comparative Example 16]

Evaluations were made as in Comparative Example 15, except that desmear treatment with a KMnO solution (Nippon MacDermid Co., Ltd.) was performed after forming blind vias by applying the carbon dioxide gas laser (made by Hitachi Construction Machinery Co., Ltd.). The results are shown in Table 7.

TABLE 7

| | | | Example | | | | | |
|---|---|---|---|---|---|---|---|---|
| | | | 26 | 27 | 28 | 29 | 30 | 31 |
| Composition · Mass % | Polyimide | Polyimide C | | | | | 52 | |
| | | Polyimide G | 51 | 51 | 51 | 51 | | |
| | | Polyimide I | | | | | | 51 |
| | Reactive Compound | PBO | 7 | 7 | 7 | 7 | 6 | 9 |
| | Flame Retardant | Phosphazene A | | | | | 10 | |
| | | Phosphazene B | | | | | | |
| | | MGZ-5R | 40 | 40 | 40 | 40 | 30 | 40 |
| | Other Commercial Material (ESPANEX M) | IRG245 | 2 | 2 | 2 | 2 | 2 | |
| Via formation | Scheme | | wet | wet | wet | wet | wet | wet |
| | Etchant | | 3% NaOH | 3% NaOH | 3% NaOH | 3% NaOH | 3% NaOH | 3% NaOH |
| | Etching rate (μm/sec) | | 0.26 | 0.26 | 0.26 | 0.26 | 0.48 | 0.15 |
| | Spray time (sec) | | 30 | 45 | 45 | 30 | 25 | 45 |

TABLE 7-continued

|  |  |  |  |  |  |  |  |  |
|---|---|---|---|---|---|---|---|---|
|  | Desmear |  | Without | Without | Without | With | Without | Without |
|  | Nonelectrolytic copper plating thickness(μm) |  | 0.5 | 0.5 | 1 | 0.5 | 0.5 | 0.5 |
| Parameter | Resin modified portion | Thickness(μm) | 15 | 20 | 20 | 15 | 17 | 15 |
|  | Via shape | x | −15 | −25 | −25 | −17 | −18 | −15 |
|  |  | y | 20 | −5 | −5 | 18 | 18 | 20 |
| Evaluation | Plating adhering properties |  | ◎ | ○ | ◎ | ◎ | ◎ | ◎ |
|  | Connection reliability |  | ◎ | ○ | ◎ | ◎ | ◎ | ◎ |

|  |  |  | Comparative Example |  |  |  |  |  |
|---|---|---|---|---|---|---|---|---|
|  |  |  | 11 | 12 | 13 | 14 | 15 | 16 |
| Composition · Mass % | Polyimide | Polyimide C |  |  |  |  |  |  |
|  |  | Polyimide G | 51 | 51 |  |  |  |  |
|  |  | Polyimide I |  |  |  |  |  |  |
|  | Reactive Compound | PBO | 7 | 7 |  |  |  |  |
|  | Flame Retardant | Phosphazene A |  |  |  |  |  |  |
|  |  | Phosphazene B |  |  |  |  |  |  |
|  |  | MGZ-5R | 40 | 40 |  |  |  |  |
|  | Other | IRG245 | 2 | 2 |  |  |  |  |
|  | Commercial Material (ESPANEX M) |  |  |  | 100 | 100 | 100 | 100 |
| Via formation | Scheme |  | wet | wet | wet | wet | Laser | Laser |
|  | Etchant |  | 3% NaOH | 3% NaOH | TPE3000 | TPE3000 | — | — |
|  | Etching rate (μm/sec) |  | 0.26 | 0.26 | 0.04 | 0.04 | — | — |
|  | Spray time (sec) |  | 9 | 60 | 550 | 700 | — | — |
|  | Desmear |  | Without | Without | Without | Without | Without | With |
|  | Nonelectrolytic copper plating thickness(μm) |  | 1 | 1 | 1 | 0.5 | 0.5 | 0.5 |
| Parameter | Resin modified portion | Thickness(μm) | 7 | 25 | <1 | <1 | 0 | 0 |
|  | Via shape | x | −10 | −35 | −3 | −5 | −3 | −5 |
|  |  | y | 40 | −15 | Not opened | 30 | 28 | 25 |
| Evaluation | Plating adhering properties |  | Δ | Δ | X | X | X | X |
|  | Connection reliability |  | X | Δ | X | Δ | X | Δ |

From the results as shown in Table 7, with respect to each of Examples 26 to 31, the resin etching rate by alkali was 0.10 μm/sec or more. Further, in the via processing method of the scheme for alkali-spraying for the time required to completely remove the resin composition layer with a thickness of 25 μm by alkali x 0.2 to 0.5 time, and then, completely removing the resin on the bottom of the via by water washing, the thickness of the resin modified portion of the side wall of the via was 10 μm or more, the parameter x relating to the shape of the via hole as described with reference to FIG. 5 was within the range of −15 μm to −25 μm, and the parameter y was within the range of −5 μm to 20 μm. Within the ranges, even on the condition that the nonelectrolytic copper plating thickness was 0.5 μm that is thinner than the conventional value, plating adhering properties were good, and the via with the uniform electrolytic plating thickness near the target value was obtained. Connection reliability test results of these vias were also good. Further, with respect to Examples 26 and 29 to 31 in which the parameter x was −20 μm or more, plating adhering properties were particularly good, and variations in the resistance value in via connection reliability were only in a range of 10% up to 1000 cycles. In Examples 26 to 28, 30 and 31, desmear treatment was not performed after via formation. Also in the cases, plating adhering properties and connection reliability were good. In Embodiments 26 to 31, the resin modified portion containing sodium ions and/or potassium ions was formed. Water absorption is increased in such a resin modified portion, and therefore, it is conceivable that permeability of the nonelectrolytic metal plating solution was increased, ion exchange with copper ions also occurred, and that adhering properties of nonelectrolytic copper were improved.

From the above-mentioned results, in the via obtained by combining the resin modified portion with the horizontal direction thickness of 10 μm or more and the particular via shape according to Embodiment 2, it is possible to drastically improve adhering properties of plating, and therefore, it is confirmed that it is possible to use suitably in a multilayer printed wiring board required to further thin nonelectrolytic copper. In addition, in the Examples according to Embodiment 2, by heat-curing the resin composition, then etching the entire surface of copper on the surface layer, and applying nonelectrolytic copper plating, it is possible to apply to the semi-additive process. In the semi-additive process, from the viewpoint of making finer, it is desired to make the nonelectrolytic copper plating thinner.

On the other hand, in Comparative Example 11, the alkali spray time was shorter than the time required to completely remove the resin composition layer x 0.1 time, and in this case, x was 10 μm and was good. However, y was 40 μm, as the via with a diameter of 100 μm, it was not possible to sufficiently ensure the ground area on the via bottom, and disconnection was confirmed in the initial stage of the connection reliability test.

Conversely, in Comparative Example 12 in which the alkali spray time was longer than the time required to completely remove the resin layer x 0.6 time, x was −35 µm, permeability of the nonelectrolytic copper plating solution to the backside of the meta foil layer of the second conductive layer was insufficient, and even on the conventional condition of nonelectrolytic copper plating with a thickness of 1 µm, obtained were results that plating adhering properties and connection reliability deteriorated.

Comparative Examples 13 and 14 are examples of forming vias using polyimide etching of conventional techniques. In comparative Example 13 in which the etching time was shorter than the time required to completely remove x 1 time, the via bottom was not opened completely, resulting in poor plating adhering properties and connection reliability. In Comparative Example 14, the parameter x relating to the via shape was good, but the parameter y was a large value. Further, in polyimide etching of the examples, the resin modified portion was not confirmed. Therefore, on the nonelectrolytic copper plating condition of 0.5 µm, obtained were results that plating adhering properties were poor and that connection reliability deteriorated. As the reasons that the resin modified portion is not formed by conventional dry etching, it is presumed that the etching rate is very slow, the resin is high in elasticity and glass transition temperature, intermolecular interaction is thereby strong, and that the etchant is hard to osmose to the inside of the film.

Comparative Examples 15 and 16 are examples of forming vias using the laser via processing machine of conventional techniques. With respect to Comparative Example 15 with the laser vias without performing desmear, both the plating adhering properties and connection reliability were poor results. Also with respect to Comparative Example 16 in which desmear was performed, the parameter x was good, but the parameter y was a large value. Further, the resin modified portion was not confirmed even on the side wall of the laser via with desmear performed. Therefore, on the conventional condition of nonelectrolytic copper plating with a thickness of 0.5 µm, obtained were results that plating adhering properties were poor and connection reliability deteriorated.

From the above-mentioned results, in Comparative Examples 11 to 16, in the case of thinning nonelectrolytic copper plating, it is understood that it is not possible to exhibit sufficient performance.

(Embodiment 3)

Examples 32 to 37 according to Embodiment 3 will be described.

(Preparation of Inner Layer Core Substrate)

An inner layer core substrate was prepared as described below. First, prepared was a double-sided flexible wiring substrate (ESPANEX (Registered Trademark) M) (made by Nippon Steel Chemical Co., Ltd.) with a thickness of copper foil of 12 µm and a thickness of the insulating resin layer of 20 µm. The substrate copper of the double-sided flexible wiring substrate was subjected to half etching treatment, the copper foil thickness was thinned to 5 µm, a through hole with a diameter of 100 µm was then bored with an NC drill, and through hole plating with a thickness of 15 µm was applied. Herein, the aspect ratio of the through hole was 0.9. Next, in the double-sided flexible substrate having the through hole, a wiring circuit pattern with a land of 300 µmΦ and line and space (L/S) of 50/50 µm was formed around the through hole on the copper foil using a dry film resist (SUNFORT (Registered Trademark) AQ2578) (made by Asahi Kasei E-materials Corporation). Next, etching was applied to the copper foil, and a copper wiring circuit was formed. At this point, the copper wiring circuit was formed in a thickness of 20 µm.

(Preparation of Copper Foil with Resin)

Copper foil with resin to laminate on the outer layer of the inner layer core substrate was prepared as described below. A resin composition solution of each of Examples 32 to 37 was applied onto electrolytic copper foil (F2-WS) (made by Furukawa Circuit Foil Co., Ltd.) with a thickness of 12 µm using the bar coater, and then, was subjected to heat treatment for 15 minutes in an oven heated to 95° C., vacuum-drying treatment was then performed at 90° C. for 30 minutes, and obtained was the copper foil with the resin with a resin thickness ranging from 15 µm to 60 µm.

(Evaluation N: Resin Layer Thickness and Surface Concavo-Convex Amount on the Wiring)

The multilayer flexible wiring board prepared by the method as described in each of Examples 32 to 37 was embedded with an epoxy resin, and then, the center portion of the wiring circuit with a pitch of 100 µm was polished in cross section, and was observed with the optical microscope with length measurement function. Ten portions were observed in the wiring circuit with the pitch of 100 µm. Among ten portions, the resin layer thickness (Evaluation N-1) on the thinnest wiring circuit was adopted as the resin thickness on the circuit, and as the surface concavo-convex amount (Evaluation N-2) of the resin layer, an average value of ten portions was adopted. It is assumed that the case where surface concavo-convex properties of the resin layer were ±3 µm or less was ⊚, the case where the properties exceeded ±3 µm and were ±5 µm or less was ○, and that the case where the properties exceeded ±5 µm was X.

(Evaluation O: Repulsive Force Evaluation)

The repulsive force of the flexible portion of the multilayer flexible wiring board prepared by the method as described in each of Examples 32 to 37 was implemented by the following method. First, the flexible portion was cut to the size of 10 mm×5 mm. Next, as a measurement apparatus of the repulsive force, used was an apparatus capable of moving up and down at a certain velocity in which a force gage was attached to an auto servo gage with clearance accuracy of 0.1 mm or less. Parallel plates of 50 mm square were attached to the front end of the force gage, and the force gage was moved at a certain velocity of 600 mm/min, and was set to stop when the clearance of the parallel plate was 1 mm.

Next, the parallel plate distance was set at 20 mm, and the cut substrate was sandwiched between the plates while curving without bending. When the plates were moved up to the clearance of 1 mm on the conditions as described previously, the flexible substrate was bent to the curvature radius of 0.5 mm. In this state, the load of the force gage was measured after a lapse of 1 minute, and the repulsive force was calculated by dividing the load by a substrate width. The repulsive force less than 0.1 N/mm was represented by ⊚, the repulsive force of 0.1 N/mm or more and less than 0.2 N/mm was represented by ○, the repulsive force of 0.2 N/mm or more and less than 0.3 N/mm was represented by Δ, and the repulsive force of 0.3 N/mm or more or the occurrence of crack or peeling during measurement was represented by X.

(Evaluation P: Bleed-out Amount)

Using a layered product prepared in each of Examples 32 to 37, a bleed-out amount was calculated according to the method described in Evaluation C as described above.

(Evaluation Q: Semiconductor Chip Mountability Evaluation)

After printing solder paste (lead-free solder M705) (made by Senju Metal Industry Co., Ltd.) in the circuit pattern formed on the outer layer of the multilayer flexible wiring board prepared by the method as described in each of Examples 32 to 37, chip resistors (1005 chips) (made by NSI Corporation) were automatically mounted with a chip mounter, part mounting was performed while performing reflow treatment on the maximum temperature arrival conditions of 250° C. for 5 seconds 4 times, and misalignment in solder mounting, floating of the part and inclination was evaluated by visual inspection. It was assumed that ○ was the case where any of the abnormalities was not recognized and any abnormality was not recognized in the fillet shape after 4 times, Δ was the case where some abnormality was recognized for the fourth time, and that X was the case where some abnormality was recognized for any of the first to third time.

(Evaluation R: Bending Mountability Evaluation)

After fixing one end of the flexible portion of the multilayer flexible wiring board prepared by the method as described in each of Examples 32 to 37 to one side of a glass substrate with a thickness of 1 mm with ACF (made by Hitachi Chemical Co., Ltd.), the other side of the flexible portion was bent so that the resin layer of the outer layer substrate was the inside, and was fixed to the backside of the glass substrate with a double-sided tape. The temperature cycle test was implemented up to 1000 cycles in which one cycle was to hold for 15 minutes at each temperature of −40° C./125° C. It was assumed that ○ was the case where the occurrence of peeling and swelling was not recognized after 1000 cycles, and that X was the case the occurrence of peeling and/or swelling was recognized after 1000 cycles.

[Example 32]

A resin composition was prepared so that the solid content of the polyimide G was 51 mass %, 1,3-bis(4,5-dihydro-2-oxazolyl)benzene (PBO) was 7 mass %, composite magnesium hydroxide (Brand Name: MGZ-5R, made by Sakai Chemical Co., Ltd.) was 40 mass %, and that IRGANOX 245 (IRG 245, made by BASF Company) was 2 mass % as the antioxidant. The resin composition was diluted with γ-butyrolactone so that the total solid content of the resin composition was 40 mass %, and using the resin composition solution, a layered product having the resin composition layer with a thickness of 15 μm was prepared. The bleed-out test of Evaluation P was performed on the layered product, and the bleed-out amount was 20 mg/m$^2$ or less.

The copper foil with the resin was laid and put onto the upper and lower surfaces of the inner layer core substrate, and the result was sandwiched by mold release films from the both sided, and was beforehand prepared.

Used as a laminator apparatus was a diaphragm type vacuum laminator (made by MEIKI CO., LTD.) allowed to laminate by roll-to-roll. As a lamination method, the silicone rubber surface temperature of the diaphragm was set at 140° C., the layered product was transported to the inside of the vacuum laminator, vacuuming was performed for 2 minutes without laminate pressurization, and then, the layered product was pressurized with a pressure of 0.9 MPa for 2 minutes to crimp. Further, a dry film resist (SUNFORT/made by Asahi Kasei E-materials Corporation) was bonded onto the copper foil of the outer layer with a roll laminator, the copper foil in predetermined positions to mount parts was etched and removed by exposure, development and etching, and conformal masks with 100 μmΦ were formed to exist above the copper land formed in the inner layer core substrate.

Next, using a cure drying oven, the product was heated at 180° C. for 1 hour to cure the resin composition layer. Subsequently, a carbon dioxide gas laser (made by Hitachi Construction Machinery Co., Ltd.) was applied to the conformal mask portion of the resin cured material layer to form a bind via, and desmear treatment with a KMnO solution (Nippon MacDermid Co., Ltd.) was performed.

Next, plating treatment to the blind via was performed to establish electric connection with the inner layer core substrate. First, a palladium catalyst was attached to the resin cured material layer on the hole inner wall to apply activation, and a nonelectrolytic copper plating layer was formed in a nonelectrolytic copper plating bath while performing aeration. Subsequently, electrolytic copper plating was applied to complete electric connection between the conductive layer of the inner layer core substrate and the outer conductive layer.

Next, a circuit formation step was performed on the outer layer substrate as in the conventional multilayer flexible wiring board. Concurrently, in the flexible portion that was bent to use, an unnecessary copper layer on the outer layer substrate was etched and removed, and formation was made so that the resin cured material layer of the outer layer substrate was a cover layer of the wiring circuit formed on the inner layer core substrate. By this means, in this portion, the need for further forming a cover layer was eliminated, and it was possible to thin the portion to form. Further, the repulsive force was 0.07 N/mm.

Thus manufactured multilayer flexible wiring board was embedded with an epoxy resin, cross section polishing was then performed, and the result was observed with the optical microscope. In resin layer embeddability in the through hole with the aspect ratio of 0.9 formed in the inner layer core substrate and in the outer layer substrate in the wiring circuit with L/S=50/50 μm, lack of embedding such as voids did not exist, the embeddability was good, and further, the surface concavo-convex amount of the resin composition layer was 5 μm or less, and was extremely smooth. Furthermore, the resin layer minimum thickness on the wiring circuit layer was about 5 μm.

With respect to the obtained substrate, chip mountability and bending mountability evaluations were performed separately. The chip mountability was ○, and the bending mountability was ⊚. The results are shown in Table 8.

[Example 33]

A multilayer flexible wiring board was prepared in the same manner as in Example 32 except that a thickness of the resin composition layer of the copper foil with the resin was 25 μm. The resin layer minimum thickness and surface concavo-convex amount on the wiring circuit layer of the obtained substrate were measured by cross section observation, and chip mountability and bending mountability evaluations were performed. The results are shown in Table 8.

[Example 34]

A multilayer flexible wiring board was prepared in the same manner as in Example 32 except that a thickness of the resin composition layer of the copper foil with the resin was 40 μm. The resin layer minimum thickness and surface concavo-convex amount on the wiring circuit layer of the obtained substrate were observed by cross section observation, and chip mountability and bending mountability evaluations were performed. The results are shown in Table 8.

[Example 35]

A resin composition was prepared so that the solid content of the polyimide I was 65 mass %, 1,3-bis(4,5-dihydro-2-oxazolyl)benzene (PBO) was 5 mass %, and that the phosphazene A compound was 30 mass %. The resin composition was diluted with γ-butyrolactone so that the total solid content of the resin composition was 40 mass %, and using the resin composition solution, a layered product having the resin composition layer with a thickness of 25 μm was prepared.

Except that, a multilayer flexible wiring board was prepared in the same manner as in Example 32. The resin layer minimum thickness and surface concavo-convex amount on the wiring circuit layer of the obtained substrate were measured by cross section observation, and chip mountability and bending mountability evaluations were performed. The results are shown in Table 8.

[Example 36]

A resin composition was prepared so that the solid content of the polyimide G was 47 mass %, 1,3-bis(4,5-dihydro-2-oxazolyl)benzene (PBO) was 11 mass %, the phosphazene compound B was 10 mass %, composite magnesium hydroxide (Brand Name: MGZ-5R, made by Sakai Chemical Co., Ltd.) was 30 mass %, and that IRGANOX 245 (IRG 245, made by BASF Company) was 2 mass % as the antioxidant. The resin composition was diluted with γ-butyrolactone so that the total solid content of the resin composition was 40 mass %, and using the resin composition solution, a layered product having the resin composition layer with a thickness of 25 μm was prepared.

Except that, a multilayer flexible wiring board was prepared in the same manner as in Example 32. The resin layer minimum thickness and surface concavo-convex amount on the wiring circuit layer of the obtained substrate were measured by cross section observation, and chip mountability and bending mountability evaluations were performed. The results are shown in Table 8.

[Example 37]

A resin composition was prepared so that the solid content of the polyimide G was 49 mass %, 1,3-bis(4,5-dihydro-2-oxazolyl)benzene (PBO) was 5 mass %, three-functional epoxy resin (Brand Name: VG3101, made by Printec Co.) was 4 mass %, composite magnesium hydroxide (Brand Name: MGZ-5R, made by Sakai Chemical Co., Ltd.) was 40 mass %, and that IRGANOX 245 (IRG 245, made by BASF Company) as the antioxidant was 2 mass %. The resin composition was diluted with γ-butyrolactone so that the total solid content of the resin composition was 40 mass %, and using the resin composition solution, a layered product having the resin composition layer with a thickness of 25 μm was prepared.

Except that, a multilayer flexible wiring board was prepared in the same manner as in Example 32. The resin layer minimum thickness and surface concavo-convex amount on the wiring circuit layer of the obtained substrate were measured by cross section observation, and chip mountability and bending mountability evaluations were performed. The results are shown in Table 8.

[Comparative Example 17]

A multilayer flexible wiring board was prepared in the same manner as in Example 32 except that a thickness of the resin composition layer of the copper foil with the resin was 10 μm. The resin layer minimum thickness and surface concavo-convex amount on the wiring circuit layer of the obtained substrate were measured by cross section observation, and chip mountability and bending mountability evaluations were performed. The results are shown in Table 8.

[Comparative Example 18]

A multilayer flexible wiring board was prepared in the same manner as in Example 32 except that a thickness of the resin composition layer of the copper foil with the resin was 60 μm. The resin layer minimum thickness and surface concavo-convex amount on the wiring circuit layer of the obtained substrate were measured by cross section observation, and chip mountability and bending mountability evaluations were performed. The results are shown in Table 8.

[Comparative Example 19]

A resin composition was prepared so that the solid content of the polyimide I was 57 mass %, 1,3-bis(4,5-dihydro-2-oxazolyl)benzene (PBO) was 8 mass %, X-22-1821 (Hydroxyl value 38mgKOH/g, made by Shin-Etsu Chemical Co., Ltd.) was 5 mass % as the dual-end phenol-modified silicone, and that the phosphazene compound A was 30 mass %. The resin composition was diluted with γ-butyrolactone so that the total solid content of the resin composition was 40 mass %, and using the resin composition solution, a layered product having the resin composition layer with a thickness of 25 μm was prepared. The bleed-out test was performed on the layered product, and the bleed-out amount was 110 mg/m$^2$.

Except that, a multilayer flexible wiring board was prepared in the same manner as in Example 32. The resin layer minimum thickness and surface concavo-convex amount on the wiring circuit layer of the obtained substrate were measured by cross section observation, and chip mountability and bending mountability evaluations were performed. The results are shown in Table 8.

[Synthesis Example of Polyimide Q]

To a three-neck separable flask were attached a nitrogen introduction tube, thermometer, and bulb condenser provided with a water separation trap. In an oil bath at room temperature, 330 g of N-methyl-2-pyrrolidone (NMP), 40 g of 2,2'-bis(4-(4-aminophenoxy)phenyl)propane, and 50 g of 3,3',4,4'-diphenylsulfonetetracarboxylic dianhydride were added gradually, and then, the mixture was heated to 180° C., and heated for 3 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide Q varnish was obtained. The weight average molecular weight was 110,000.

[Preparation Example of Epoxy Resin A]

A solution of an epoxy resin A was obtained by adding 29.9 g of naphthalene skeleton epoxy resin ("NC-7000L" made by Nippon Kayaku Co., Ltd.), 30 g of polyamide imide resin ("HR15ET" made by TOYOBO CO., LTD), and 15 g of styrene • butadiene-based elastomer ("Tufprene" made by Asahi Kasei Chemicals Corporation), and diluting the mixture with N-methyl-2-pyrrolidone so that the solid concentration was 40 mass %.

[Comparative Example 20]

A resin composition was prepared so that the solid content of the epoxy resin A was 75 mass %, amino triazine novolac resin ("LA-1356" made by DIC Corporation) was 10 mass % as the epoxy hardener, the phosphazene compound A was 30 mass %, and that 2-ethyl-4-methylimidazole ("2E4MZ" made by SHIKOKU CHEMICALS CORPORATION) was 0.1 mass % as the accelerator. The resin composition was diluted with N-methyl-2-pyrrolidone so that the total solid content of the resin composition was 40 mass %, and using the resin composition solution, a layered product having the resin composition layer with a thickness of 25 μm was prepared.

Except that, a multilayer flexible wiring board was prepared in the same manner as in Example 32. The resin layer minimum thickness and surface concavo-convex amount on the wiring circuit layer of the obtained substrate were measured by cross section observation, and chip mountability and bending mountability evaluations were performed. The results are shown in Table 8.

[Comparative Example 21]

A layered product with two resin layers was prepared by the following procedure. First, a resin composition solution of the polyimide Q was applied onto electrolytic copper foil (F2-WS, made by Furukawa Circuit Foil Co., Ltd.) with a thickness of 12 μm using the bar coater, was then subjected to heat treatment for 15 minutes in an oven heated to 95° C., and was then subjected to vacuum drying treatment at 120° C. for 3 hours to obtain copper foil with the resin with a resin thickness of 12.5 μm. Further, the resin composition of Comparative Example 20 was applied to the resin surface side of the copper foil with the resin so that the thickness was 15 μm, was then subjected to heat treatment at 95° C. for 15 minutes, and was then subjected to vacuum drying at 90° C. for 30 minutes to prepare a layered product of two-layer structure with the total resin thickness of 27.5 μm.

Except that, a multilayer flexible wiring board was prepared in the same manner as in Example 32. The resin layer minimum thickness and surface concavo-convex amount on the wiring circuit layer of the obtained substrate were measured by cross section observation, and chip mountability and bending mountability evaluations were performed. The results are shown in Table 8.

TABLE 8

| | | | Example | | | | | |
|---|---|---|---|---|---|---|---|---|
| | | | 32 | 33 | 34 | 35 | 36 | 37 |
| Composition · Mass % | Resin | Polyimide G | 51 | 51 | 51 | | 47 | 49 |
| | | Polyimide I | | | | 65 | | |
| | | Polyimide Q | | | | | | |
| | | Epoxy resin A | | | | | | |
| | Reactive Compound | PBO | 7 | 7 | 7 | 5 | 11 | 5 |
| | | VG3010 | | | | | | 4 |
| | Diol | Dual-end OH silicone | | | | | | |
| | Flame Retardant | Phosphazene A | | | | 30 | | |
| | | Phosphazene B | | | | | 10 | |
| | | MGZ-5R | 40 | 40 | 40 | | 30 | 40 |
| | Hardener | LA-1356 | | | | | | |
| | Others | IRG245 | 2 | 2 | 2 | | 2 | 2 |
| | | 2E4MZ | | | | | | |
| Resin layer configuration | | | One-layer | One-layer | One-layer | One-layer | One-layer | One-layer |
| Thickness T1(μm) | | | 15 | 25 | 40 | 25 | 25 | 40 |
| Parameter | Thickness T2(μm) | | 5 | 10 | 30 | 10 | 12 | 15 |
| | Repulsive force (N/mm) | | 0.07 | 0.09 | 0.15 | 0.06 | 0.08 | 0.28 |
| | Surface asperities(μm) | | ○ | ◎ | ◎ | ◎ | ◎ | Δ |
| | Bleed-out (mg/m²) | | <20 | <20 | <20 | 25 | <20 | <20 |
| Evaluation | Chip mountability | | ○ | ○ | ○ | ○ | ○ | Δ |
| | Bending mountability | | ◎ | ◎ | ○ | ◎ | ◎ | ○ |

| | | | Comparative Example | | | | |
|---|---|---|---|---|---|---|---|
| | | | 17 | 18 | 19 | 20 | 21 |
| Composition · Mass % | Resin | Polyimide G | 51 | 51 | | | |
| | | Polyimide I | | | 57 | | |
| | | Polyimide Q | | | | | 100 |
| | | Epoxy resin A | | | | 75 | 75 |
| | Reactive Compound | PBO | 7 | 7 | 8 | | |
| | | VG3010 | | | | | |
| | Diol | Dual-end OH silicone | | | 5 | | |
| | Flame Retardant | Phosphazene A | | | 30 | 15 | 15 |
| | | Phosphazene B | | | | | |
| | | MGZ-5R | 40 | 40 | | | |
| | Hardener | LA-1356 | | | | 10 | 10 |
| | Others | IRG245 | 2 | 2 | | | |
| | | 2E4MZ | | | | 0.1 | 0.1 |
| Resin layer configuration | | | One-layer | One-layer | One-layer | One-layer | Two-layer |
| Thickness T1(μm) | | | 10 | 60 | 25 | 25 | 12.5 + 15 |
| Parameter | Thickness T2(μm) | | 2 | 50 | 5 | 12 | 15 |
| | Repulsive force (N/mm) | | 0.05 | 0.3 | 0.08 | 0.9 | 1.5 |
| | Surface asperities(μm) | | X | ◎ | ◎ | X | X |
| | Bleed-out (mg/m²) | | <20 | <20 | 110 | <20 | <20 |
| Evaluation | Chip mountability | | X | ○ | ○ | X | X |
| | Bending mountability | | ◎ | X | X | X | X |

In addition, in Table 8, Thickness T1 represents the thickness of the resin composition layer before press. Thickness T2 represents the resin layer minimum thickness on the circuit wiring.

From the results of Table 8, in the flexible substrates prepared by using the copper foil with the resin with the thickness ranging from 15 μm to 40 μm of Examples 32 to 37, obtained were the results that the repulsive force in the flexible portion was in the range of 0.06 N/mm to 0.28 N/mm. Further, the bleed-out amounts were small, adhesion to copper was excellent, and therefore, the evaluation of bending mountability was good in any of the Examples.

Examples 32 to 36 of the resin compositions containing the oxazoline compound were particularly excellent in bending mountability, and Examples 32 to 34 and 36 further containing the polyimide G containing tetramethylene oxide groups in the skeleton were particularly excellent in bending mountability. Further, the flexible substrates using the copper foil with the resin with the film thickness ranging from 15 μm to 25 μm were also excellent in bending mountability particularly.

Further, in Examples 32 to 37, in the region in which the resin composition layer minimum thickness on the wiring was between 5 μm to 30 μm, the asperities were 5 μm or less on the resin layer surface immediately above the through hole with the aspect ratio of 0.9 and immediately above the circuit with the copper thickness of 12 μm and L/S=50/50 μm. Further, in Examples 33 to 36, the asperities were 3 μm or less on the resin layer surface, smoothness was excellent, and chip mountability was also excellent.

Since the multilayer flexible wiring board is decreased in the bending radius and is mounted while being bent together with a mother board, module substrate, display apparatus and the like, from requirements for peeling resistance and connection reliability in the package portion and easiness of assembly operation, low repulsive forces are required in a decrease in the bending radius.

From the above-mentioned results, Examples 32 to 37 provide low repulsive forces in bending with the curvature radius of the flexible portion decreased, and are allowed to thin the film thickness of the resin composition layer of the outer layer substrate laminated on the wiring circuit of the core substrate, and it is thereby understood that it is possible to use suitably to improve bending mountability, and mountability of semiconductor devices in the package portion.

On the other hand, in Comparative Example 17 using the copper foil with the resin with the film thickness of 10 μm, the resin layer minimum thickness of the conductive layer shape was 2 μm, the coating was insufficient, voids were confirmed also inside the through hole, surface smoothness was of poor result, and floating of chips was confirmed in reflow of chip mounting evaluation. Further, in Comparative Example 18 using the copper foil with the resin with the film thickness of 60 μm, surface smoothness was good, but the repulsive force was large, resulting in poor bending mountability.

In Comparative Example 19, surface smoothness was good with the low repulsive force, but delamination occurred in the interface between the resin layer and copper of the inner layer core substrate in the bending mountability evaluation. In the resin composition of Comparative Example 19, bleed-out was confirmed on the surface over time, and it is conceivable that reductions in adhesion to the copper deriving from the bled out component occurred during the temperature cycles of the bending mountability evaluation, not enduring the stress by bending, and that peeling occurred in the interface with copper.

Further, in Comparative Example 20 using the epoxy resin and Comparative Example 21 using the copper foil with the resin of two-layer structure of the epoxy resin and the polyimide Q with high elasticity, since the repulsive forces were high and smoothness of the resin surface degraded, poor results were obtained in both the chip mounting evaluation and bending mounting evaluation.

From these results, it is understood that the resin compositions according to Comparative Examples 17 to 21 are not suitable from the viewpoints of improving bending mountability, and mountability of semiconductor devices in the package portion.

(Embodiment 4)

Examples 38 to 43 according to Embodiment 4 will be described below.

[Phenol Novolac Resin A]

Into a glass reactor provided with a stirring apparatus, condenser and nitrogen introduction tube were charged 404.2 g (4.30 mol) of phenol, and 150.70 g (0.6 mol) of 4,4'-di(chloromethyl)biphenyl, the mixture was reacted at 100° C. for 3 hours, 28.57 g (0.4 mol) of 42% formalin aqueous solution was then added, and subsequently, the mixture was reacted at 100° C. for 3 hours. During the reaction, generated methanol was distilled. After finishing the reaction, the obtained reaction solution was cooled, and was subjected to water washing three times. The oil layer was separated, unreacted phenol was distilled by vacuum distillation, and obtained was 251 g of phenol novolac resin A.

[Polyimide R]

To a three-neck separable flask were attached a nitrogen introduction tube, thermometer, and bulb condenser provided with a water separation trap. In an oil bath at room temperature, in the flask were placed 344 g of 1,3-dimethyl-2-imidazolidinone (DMI), 90 g of toluene, 78.4 g of dimethyl sulfoxide, 48.8 g of 2,2'-bis(3-amino-4-hydroxyphenyl)hexafluoropropane (6FAP), and 112.8 g of polyalkyl ether diamine Baxxodur™ EC302 (made by BASF Company), and the mixture was stirred to be uniform. Further, 120 g of 3,3',4,4'-biphenyltetracarboxylic dianhydride (BPDA) was added gradually, and then, the mixture was heated to 180° C., and heated for 3 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide R varnish was obtained. The weight average molecular weight was 28,000.

The polyimide R varnish was put into distilled water, and was reprecipitated, the obtained precipitate was dried with a vacuum drier, and polyimide R solid was obtained.

[Polyimide R]

To a three-neck separable flask were attached a nitrogen introduction tube, thermometer, and bulb condenser provided with a water separation trap. In an oil bath at room temperature, in the flask were placed triethyleneglycoldimethylether (22.5 g), γ-butyrolactone (52.5 g), toluene (20.0 g), 1.00 g of 4,4'-oxydiphthalic dianhydride (ODPA), and 35.00 g of dual-end acid dianhydride-modified silicone (Brand Name: X-22-2290AS, made by Shin-Etsu Chemical Co., Ltd.), and the mixture was stirred to be uniform. Further, 14.00 g of 2,2'-bis(3-amino-4-hydroxyphenyl)hexafluoropropane (6FAP) was added gradually, and then, the mixture was heated to 180° C., and heated for 2 hours. During the reaction, by-product water was subjected to azeotropy with toluene, and dehydration was carried out under reflux using the bulb condenser provided with the water separation trap. After removing by-product water, reflux was halted, all toluene was removed, and the resultant was cooled to room temperature. Next, the product was press-filtered with a filter of 5 μm, and polyimide S varnish was obtained. The weight average molecular weight was 27,000.

[Evaluation S: Rubber Hardness]

Rubber hardness was measured with a duro-meter (type A) according to JISK6253.

[Evaluation T: Evaluation of Surface Smoothness]

Cross section structural analysis was performed to evaluate surface smoothness on the wiring circuit (average copper wiring thickness 25 μm, wiring pitch 130 μm to 500 μm) and through via (via diameter 100 μmΦ, via depth about 60 μm) of the core substrate of the multilayer flexible wiring board prepared by the method as described in each of Examples 38 to 43. First, the substrate was embedded with an epoxy resin, polishing processing was performed in the cross-sectional direction of the through via and wiring circuit, and then, the evaluation was made by observation with the optical microscope with length measurement function. For surface smoothness, it was assumed that the case where the level difference between the copper wiring circuit and the circuit was within 5 μm was ◯, and that the case of exceeding 5 μm was X.

[Part Mountability]

After printing solder paste (lead-free solder M705, made by Senju Metal Industry Co., Ltd.) in the circuit pattern formed on the outer layer of the multilayer flexible wiring board prepared by the method as described in each of Examples 38 to 43, chip resistors (1005 chips, made by NSI Corporation) were automatically mounted with a chip mounter, part mounting was performed while performing reflow treatment on the maximum temperature arrival conditions of 250° C. for 5 seconds 2 times, and it was assumed that ◯ was the case where any of misalignment in solder mounting, floating of the part and inclination was not recognized by visual inspection, and any abnormality was not recognized in the fillet shape, and that X was the case where some abnormality was recognized in any of items.

[Interlayer Insulation Reliability]

Using circular electrode patterns of 0.5 mmΦ formed in opposite positions of the inner layer and outer layer of the insulating layer of the multilayer flexible wiring board prepared by the method as described in each of Examples 38 to 43, an insulation resistance value was measured when 50 VDC was applied for 1000 hours continuously in a constant temperature and humidity oven of 85° C. and 85% RH. It was assumed that ◯ was the case where the insulation resistance value was $10^6 \Omega$ or more, and that X was the case where the value was less than $10^6 \Omega$.

[Example 38]

As the inner layer core substrate, ESPANEX M (made by Nippon Steel Chemical Co., Ltd., copper foil thickness 12 μm, insulating resin layer thickness 20 μm) was used as a double-sided flexible wiring board. In the double-sided flexible wiring board were formed 100 μmΦ by drill processing and copper plating treatment. Further, a copper wiring circuit (thickness of 28 μm) with a minimum 130 μm pitch was formed.

Next, a resin composition solution was prepared by using 10 g of the phenol novolac resin A, 2 g of 1,3-bis(4,5-dihydro-2-oxazolyl)benzene (PBO) as the compound containing oxazoline groups, 4 g of the phosphazene compound A as the flame retardant, and 40 g of N-methylpyrrolidone as the solvent.

Copper foil with resin to be an outer layer material was obtained by applying the above-mentioned resin composition solution onto electrolytic copper foil (F2-WS, made by Furukawa Circuit Foil Co., Ltd.) with a thickness of 12 μm using the bar coater, and then, performing drying treatment for 12 minutes in an oven heated to 95° C. The copper foil with the resin was laid on the upper and lower surfaces of the core substrate, and the both surfaces were further sandwiched by mold release films to prepare.

As a vacuum laminator apparatus, used was the vacuum press apparatus (made by KITAGAWA SEIKI Co., Ltd.) in which heat resistant silicone rubber with hardness of 50 degrees including glass cloth therein was bonded to the entire surface of each of upper and lower both-side surface plates. The silicone rubber was of the size of 50 cm square. As a lamination method, in a state in which the silicone rubber surface temperature was beforehand heated to 120° C., the layered product was put in the apparatus. After performing vacuuming for 2 minutes without pressurizing, the layered product was pressurized with a pressure of 1 MPa for 5 minutes to laminate. The resin flow amount from the vicinity was about 50 μm.

Next, for connection between the copper foil of the outer layer and the copper foil of the inner layer, after laminating DF on the copper foil of the outer layer, the copper foil in predetermined positions was removed by exposure • development and etching, and conformal masks with 200 μmΦ were formed in portions required for blind vias.

Next, 3 mass % aqueous sodium hydroxide heated to 50° C. was sprayed onto the portions from which the copper foil was removed in the exposed resin composition layer for 45 seconds, it was thereby possible to remove the resin composition layer, and blind vias were formed.

Next, by heating at 180° C. for 1 hour using a cure drying oven, the resin composition layer was cured. Any resin residual was not observed on the side walls and bottoms of the obtained blind vias, blind via formation was good, and the need was eliminated for the desmear step with a potassium permanganate aqueous solution or the like.

Next, plating treatment was performed on the blind vias to establish electric connection with the inner layer core substrate. First, carbon fine particles were attached to the resin cured material layer of the hole inner wall to form a conductive particle layer. As a formation method, after immersing in a carbon black dispersed solution, the dispersion medium was removed with an acidic aqueous solution. Subsequently, electrolytic copper plating was applied to complete electric connection between both surfaces.

Performed next was the same circuit formation step as in the conventional multilayer flexible wiring board. The subsequent steps were also performed by the same method as the conventional method of manufacturing a flexible wiring board.

For resin embeddability in the inner layer core substrate and surface smoothness in the copper wiring circuit of thus manufactured multilayer flexible wiring board, after embedding with an epoxy resin, cross section polishing was performed, and observation was performed with the optical microscope. Table 9 shows the composition of the resin composition, press conditions, resin flow amount and evaluation results.

Voids and the like by embedding failure were not confirmed in resin embedding in the through hole of the inner layer substrate. Further, for surface smoothness, the difference in the substrate thickness between on the copper wiring and between wiring was within 5 μm. Furthermore, solder mountability failure was not observed in the chip resistors subjected to part mounting. Still furthermore, interlayer insulation reliability was evaluated and was good.

As described above, the multilayer flexible substrate prepared in Example 38 was excellent in part mountability and interlayer insulation reliability.

[Example 39]

The double-sided flexible wiring board prepared in Example 38 was used as the core substrate. Next, to the polyimide R solid was added a mixed solvent of γ-butyrolactone: dimethyl sulfoxide (DMSO)=80:20 so that the solid content of the resin composition solution was 40 mass %, and a resin composition solution was prepared so that with the total solid content of the adhesive resin varnish being 100 mass %, in the resin composition solution, the polyimide R was 60 mass %, 1,3-bis(4,5-dihydro-2-oxazolyl)benzene (PBO) was 15 mass % as the compound containing oxazoline groups, the phosphazene compound A and the phosphazene compound B were relatively 6 mass % and 18 mass % as the flame retardant, and that IRGANOX 245 (IRG 245, made by BASF Company) was 1 mass % as the antioxidant.

Copper foil with resin to be an outer layer material was obtained by applying the above-mentioned resin composition solution onto electrolytic copper foil (F2-WS, made by Furukawa Circuit Foil Co., Ltd.) with a thickness of 12 μm using the bar coater, and then, performing drying treatment for 12 minutes in an oven heated to 110° C. The copper foil with the resin was laid on the upper and lower surfaces of the core substrate, and the both surfaces were further sandwiched by mold release films to prepare.

Next, lamination was performed as in Example 38, using the vacuum press apparatus in which heat resistant silicone rubber with hardness of 50 degrees including glass cloth therein was bonded to the entire surface of each of upper and lower both-side surface plates. As a lamination method, in a state in which the silicone rubber surface temperature was beforehand heated to 100° C., the layered product was put in the apparatus. After performing vacuuming for 2 minutes without pressurizing, the layered product was pressurized with a pressure of 1 MPa for 2 minutes to laminate. The resin flow amount from the vicinity was about 80 μm.

Next, for connection between the copper foil of the outer layer and the copper foil of the inner layer, after laminating DF on the copper foil of the outer layer, the copper foil in predetermined positions was removed by exposure • development and etching, and conformal masks with 150 μmΦ were formed in portions required for blind vias.

Next, 3 mass % aqueous sodium hydroxide heated to 50° C. was sprayed onto the portions from which the copper foil was removed in the exposed resin composition layer (alkali soluble resin) for 30 seconds to remove the resin composition layer, and blind vias were formed.

Next, by heating at 180° C. for 1 hour using the cure drying oven, the resin composition layer was cured. Any resin residual was not observed on the side walls and bottoms of the obtained blind vias, blind via formation was good, and the need was eliminated for the desmear step with a potassium permanganate aqueous solution or the like.

Next, plating treatment was performed on the blind vias to establish electric connection with the inner layer core substrate. First, carbon fine particles were attached to the resin cured material layer of the hole inner wall to form a conductive particle layer. As a formation method, after immersing in a carbon black dispersed solution, the dispersion medium was removed with an acidic aqueous solution. Subsequently, electrolytic copper plating was applied to complete electric connection between both surfaces.

Performed next was the same circuit formation step as in the conventional multilayer flexible wiring board. The subsequent steps were also performed by the same method as the conventional method of manufacturing a flexible wiring board.

For uncured adhesive resin embeddability in the inner layer core substrate and surface smoothness on the copper wiring circuit of thus manufactured multilayer flexible wiring board, after embedding with an epoxy resin, cross section polishing was performed, and observation was performed with the optical microscope. Table 9 shows the composition of the resin composition, press conditions, resin flow amount and evaluation results.

Voids and the like by embedding failure were not confirmed in resin embedding in the through hole of the inner layer substrate. Further, for surface smoothness, the difference in the substrate thickness between on the copper wiring and between wiring was within 3 μm. Furthermore, solder mountability failure was not observed in the chip resistors subjected to part mounting. Still furthermore, interlayer insulation reliability was evaluated and was good.

As described above, the multilayer flexible substrate manufactured in Example 39 was excellent in part mountability and interlayer insulation reliability.

[Example 40]

The double-sided flexible wiring board prepared in Example 38 was used as the core substrate. Copper foil with resin to be an outer layer material was obtained by applying the resin composition solution obtained in Example 39 onto electrolytic copper foil (F2-WS, made by Furukawa Circuit Foil Co., Ltd.) with a thickness of 12 μm using the bar coater, and then, performing drying treatment for 12 minutes in an oven heated to 95° C. The copper foil with uncured adhesive resin was laid on the upper and lower surfaces of the core substrate, and the both surfaces were further sandwiched by mold release films to prepare.

Next, lamination was performed as in Example 38, using the vacuum press apparatus in which heat resistant silicone rubber with hardness of 50 degrees including glass cloth therein was bonded to the entire surface of each of upper and lower both-side surface plates. As a lamination method, in a state in which the silicone rubber surface temperature was beforehand heated to 120° C., the layered product was put in the apparatus. After performing vacuuming for 2 minutes without pressurizing, the layered product was pressurized with a pressure of 1 MPa for 2 minutes to laminate. The resin flow amount from the vicinity was about 150 μm.

Next, for connection between the copper foil of the outer layer and the copper foil of the inner layer, after laminating DF on the copper foil of the outer layer, the copper foil in predetermined positions was removed by exposure • development and etching, and conformal masks with 75 μmΦ were formed in portions required for blind vias.

Next, 3 mass % aqueous sodium hydroxide heated to 50° C. was sprayed onto the portions from which the copper foil was removed in the exposed resin composition layer for 20 seconds to remove the resin composition layer, and the blind vias was formed.

Next, by heating at 95° C. for 3 hours and further heating at 180° C. for 1 hour using the cure drying oven, the resin composition layer was cured. Any resin residual was not observed on the side walls and bottoms of the obtained blind vias, blind via formation was good, and the need was eliminated for the desmear step with a potassium permanganate aqueous solution or the like.

Next, plating treatment was performed on the blind vias to establish electric connection with the inner layer core substrate. First, carbon fine particles were attached to the resin cured material layer of the hole inner wall to form a conductive particle layer. As a formation method, after immersing in a carbon black dispersed solution, the dispersion medium was removed with an acidic aqueous solution.

Subsequently, electrolytic copper plating was applied to complete electric connection between both surfaces.

Performed next was the same circuit formation step as in the conventional multilayer flexible wiring board. The subsequent steps were also performed by the same method as the conventional method of manufacturing a flexible wiring board.

For resin embeddability in the inner layer core substrate and surface smoothness on the copper wiring circuit of thus manufactured multilayer flexible wiring board, after embedding with an epoxy resin, cross section polishing was performed, and observation was performed with the optical microscope. Table 9 shows the composition of the resin composition, press conditions, resin flow amount and evaluation results.

Voids and the like by embedding failure were not confirmed in resin embedding in the inner layer through hole. Further, for surface smoothness, the difference in the substrate thickness between on the copper wiring and between wiring was within 5 μm. Furthermore, solder mountability failure was not observed in the chip resistors subjected to part mounting. Still furthermore, interlayer insulation reliability was evaluated and was good.

As described above, the multilayer flexible substrate manufactured in Example 40 was excellent in part mountability and interlayer insulation reliability.

[Example 41]

A substrate was prepared as in Example 40 except that lamination was performed using the vacuum press apparatus in which heat resistant silicone rubber with hardness of 30 degrees including glass cloth therein was bonded to the entire surface of each of upper and lower both-side surface plates. In Example 41, the resin flow amount from the vicinity was about 60 μm after the lamination step.

For resin embeddability in the inner layer core substrate and surface smoothness on the copper wiring circuit of thus manufactured multilayer flexible wiring board, after embedding with an epoxy resin, cross section polishing was performed, and observation was performed with the optical microscope. Table 9 shows the composition of the resin composition, press conditions, resin flow amount and evaluation results.

Voids and the like by embedding failure were not confirmed in resin embedding in the inner layer through hole. Further, for surface smoothness, the difference in the substrate thickness between on the copper wiring and between wiring was within 5 μm. Furthermore, solder mountability failure was not observed in the chip resistors subjected to part mounting. Still furthermore, interlayer insulation reliability was evaluated and was good.

As described above, the multilayer flexible substrate manufactured in Example 41 was excellent in part mountability and interlayer insulation reliability.

[Example 42]

A substrate was prepared as in Example 40 except that lamination was performed using the vacuum press apparatus in which heat resistant silicone rubber with hardness of 70 degrees including glass cloth therein was bonded to the entire surface of each of upper and lower both-side surface plates. In Example 42, the resin flow amount from the vicinity was about 100 μm after the lamination step.

For resin embeddability in the inner layer core substrate and surface smoothness on the copper wiring circuit of thus manufactured multilayer flexible wiring board, after embedding with an epoxy resin, cross section polishing was performed, and observation was performed with the optical microscope. Table 9 shows the composition of the resin composition, press conditions, resin flow amount and evaluation results.

Voids and the like by embedding failure were not confirmed in resin embedding in the inner layer through hole. Further, for surface smoothness, the difference in the substrate thickness between on the copper wiring and between wiring was within 5 μm. Furthermore, solder mountability failure was not observed in the chip resistors subjected to part mounting. Still furthermore, interlayer insulation reliability was evaluated and was good.

As described above, the multilayer flexible substrate manufactured in Example 42 was excellent in part mountability and interlayer insulation reliability.

[Example 43]

The double-sided flexible wiring board prepared in Example 38 was used as the core substrate.

A resin composition solution was prepared so that in the resin composition solution, the polyimide S was 69 mass %, 1,3-bis(4,5-dihydro-2-oxazolyl)benzene (PBO) was 6 mass % as the compound containing oxazoline groups, and that the phosphazene compound A was 25 mass % as the flame retardant. Copper foil with resin to be an outer layer material was obtained by applying the above-mentioned resin composition solution onto electrolytic copper foil (F2-WS, made by Furukawa Circuit Foil Co., Ltd.) with a thickness of 12 μm using the bar coater, and then, performing drying treatment for 12 minutes in an oven heated to 95° C. The copper foil with the resin was laid on the upper and lower surfaces of the core substrate, and the both surfaces were further sandwiched by mold release films to prepare.

As a vacuum laminator apparatus, used was the vacuum press apparatus in which heat resistant silicone rubber with hardness of 50 degrees including glass cloth therein was bonded to the entire surface of each of upper and lower both-side surface plates. The silicone rubber was of the size of 50 cm square. As a lamination method, in a state in which the silicone rubber surface temperature was beforehand heated to 120° C., the layered product was put in the apparatus. After performing vacuuming for 2 minutes without pressurizing, the layered product was pressurized with a pressure of 1 MPa for 2 minutes to laminate. The resin flow amount from the vicinity was about 50 μm.

Next, for connection between the copper foil of the outer layer and the copper foil of the inner layer, after laminating DF on the copper foil of the outer layer, the copper foil in predetermined positions was removed by exposure • development and etching, and conformal masks with 75 μmΦ were formed in portions required for blind vias. Also in a portion to be the flexible portion, the copper foil was removed in the same step.

Next, 3 mass % aqueous sodium hydroxide heated to 50° C. was sprayed onto the portions from which the copper foil was removed in the exposed resin composition layer for 20 seconds to remove the resin composition layer, blind vias were formed, and the alkali soluble resin was removed in the flexible portion.

Next, by heating at 95° C. for 3 hours and further heating at 180° C. for 1 hour using the cure drying oven, the resin composition layer was cured. Any resin residual was not observed on the side walls and bottoms of the obtained blind vias, blind via formation was good, and the need was eliminated for the desmear step with a potassium permanganate aqueous solution or the like.

Next, plating treatment was performed on the blind vias to establish electric connection with the inner layer core substrate. First, carbon fine particles were attached to the resin cured material layer of the hole inner wall to form a conductive particle layer. As a formation method, after immersing in a carbon black dispersed solution, the dispersion medium was removed with an acidic aqueous solution. Subsequently, electrolytic copper plating was applied to complete electric connection between both surfaces. In this step, also in the flexible portion, copper plating was concurrently applied onto the base film.

Performed next was the circuit formation step as in the conventional multilayer flexible wiring board. In this step, copper plating attached to the flexible portion was concurrently removed by etching to form the structure with the outer layer removed. The subsequent steps were performed by the same method as the conventional method of manufacturing a flexible wiring board.

For resin embeddability in the inner layer core substrate and surface smoothness on the copper wiring circuit of thus manufactured multilayer flexible wiring board, after embedding with an epoxy resin, cross section polishing was performed, and observation was performed with the optical microscope. Table 9 shows the composition of the resin composition, press conditions, resin flow amount and evaluation results.

Voids and the like by embedding failure were not confirmed in resin embedding in the inner layer through hole. Further, for surface smoothness, the difference in the substrate thickness between on the copper wiring and between wiring was within 5 µm. Furthermore, solder mountability failure was not observed in the chip resistors subjected to part mounting. Still furthermore, interlayer insulation reliability was evaluated and was good.

As described above, the multilayer flexible substrate having the flexible portion prepared in Example 43 was excellent in part mountability and interlayer insulation reliability.

Comparative Example 22

The double-sided flexible wiring board prepared in Example 38 was used as the core substrate. As copper foil with resin to be an outer layer material, the resin composition solution used in Example 43 was applied onto a polyester film with a thickness of 12 µm using a die coater, and was dried at 95° C. for 30 minutes, and the film with a film thickness of 25 µm was prepared. The laminated film was laid on the rough surface side of electrolytic copper foil (thickness 12 µm, F1-WS/made by Furukawa Circuit Foil Co., Ltd.) and was laminated at 90° C. with 0.5 MPa for 1 minute using a vacuum press, and a single-sided flexible substrate was prepared. A dry film was laminated on the copper foil, the copper foil in predetermined positions was removed by ferric chloride etching after performing exposure and development, and circular conformal masks with 75 µmΦ were formed in portions. Further, 3 mass % aqueous sodium hydroxide was sprayed onto the portions from which the copper foil was removed for 30 seconds to dissolve and remove the resin composition layer, and blind vias were formed. Next, after peeling off the polyester film on the backside, by heating at 180° C. for 1 hour using the cure drying oven, the resultant with the resin composition layer cured was prepared.

Next, the single-sided flexible substrate with the blind vias formed was positioned in a respective predetermined position of each of upper and lower both sides of the core substrate. Using the vacuum press apparatus in which heat resistant silicone rubber with hardness of 50 degrees without including a reinforcing material therein was bonded to the entire surface of each of upper and lower both-side surface plates, lamination was performed at 120° C. with 4.0 MPa for 5 minutes to bond, and a multilayer flexible substrate was prepared. The resin flow amount from the vicinity was about 1.3 mm.

Next, blind via plating was performed in the same manner as in the multilayer flexible wiring board to complete electric connection. Performed next was the same circuit formation step as in the conventional multilayer flexible wiring board.

Table 9 shows the composition of the resin composition, press conditions, resin flow amount and evaluation results.

In evaluations of uncured adhesive resin embeddability in the inner layer core substrate and surface smoothness on the copper wiring circuit of thus manufactured multilayer flexible wiring board, voids were confirmed in resin embedding in the through hole of the inner layer substrate. Further, also for surface smoothness, the difference in the substrate thickness between on the copper wiring and between wiring was 10 µm or more. Furthermore, in a part of the chip resistors subjected to part mounting, fillet failure was confirmed in the solder mounting portion. Still furthermore, interlayer insulation reliability was evaluated and was failure. It is presumed that by using the rubber material without including the reinforcing material, following capability of the surface was not sufficient in pressurizing, and that it was not possible to provide smoothness. Further, it is presumed that the resin flow amount was large, a portion with the film thickness being extremely thin existed inside the surface, and that interface insulation failure thereby occurred.

[Comparative Example 23]

The double-sided flexible wiring board prepared in Example 38 was used as the core substrate. As copper foil with resin to be an outer layer material, the resin composition solution used in Example 39 was applied onto a polyester film with a thickness of 12 µm using the die coater, and was dried at 95° C. for 30 minutes, and the film with a film thickness of 25 µm was prepared. The laminated film was laid on the rough surface side of electrolytic copper foil (F1-WS) (made by Furukawa Circuit Foil Co., Ltd.) with a thickness of 12 µm, and was laminated at 90° C. with 0.5 MPa for 1 minute using the vacuum press, and a single-sided flexible substrate was prepared. A dry film was laminated on the copper foil, the copper foil in predetermined positions was removed by ferric chloride etching after performing exposure and development, and circular conformal masks with 75 µmφ were formed in portions. Further, 3 mass % aqueous sodium hydroxide was sprayed onto the portions from which the copper foil was removed for 30 seconds to dissolve and remove the resin composition layer, and blind vias were formed. Next, after peeling off the polyester film on the backside, by heating at 180° C. for 1 hour using the cure drying oven, the resultant with the resin composition layer cured was prepared.

Next, the single-sided flexible substrate with the blind vias formed was positioned in a respective predetermined position of each of upper and lower both sides of the core substrate. Using the vacuum press apparatus in which heat resistant silicone rubber with hardness of 50 degrees without including a reinforcing material therein was bonded to the entire surface of each of upper and lower both-side surface plates, lamination was performed at 120° C. with 4.0 MPa for 5 minutes to bond, and a multilayer flexible substrate was prepared. The resin flow amount from the vicinity was about 1.5 mm. Next, blind via plating was performed in the same manner as in the multilayer flexible wiring board to complete electric connection. Performed next was the same circuit formation step as in the conventional multilayer flexible wiring board.

Table 9 shows the composition of the resin composition, press conditions, resin flow amount and evaluation results.

In evaluations of resin embeddability in the inner layer core substrate and surface smoothness on the copper wiring circuit of thus manufactured multilayer flexible wiring board, voids were confirmed in resin embedding in the through hole of the inner layer substrate. Further, also for surface smoothness, the difference in the substrate thickness between on the copper wiring and between wiring was 10 μm or more. Furthermore, in a part of the chip resistors subjected to part mounting, fillet failure was confirmed in the solder mounting portion. Still furthermore, interlayer insulation reliability was evaluated and was failure.

[Comparative Example 24]

The double-sided flexible wiring board prepared in Example 38 was used as the core substrate. As copper foil with resin to be an outer layer material, the resin composition solution used in Example 39 was applied onto a polyester film with a thickness of 12 μm using the die coater, and was dried at 95° C. for 30 minutes, and the film with a film thickness of 25 μm was prepared. The laminated film was laid on the rough surface side of electrolytic copper foil (F1-WS) (made by Furukawa Circuit Foil Co., Ltd.) with a thickness of 12 μm, and was laminated at 90° C. with 0.5 MPa for 1 minute using the vacuum press, and a single-sided flexible substrate was prepared. A dry film was laminated on the copper foil, the copper foil in predetermined positions was removed by ferric chloride etching after performing exposure and development, and circular conformal masks with 75 μmΦ were formed in portions. Further, 3 mass % aqueous sodium hydroxide was sprayed onto the portion from which the copper foil was removed for 30 seconds to dissolve and remove the resin composition layer, and blind vias were formed. Next, after peeling off the polyester film on the backside, by heating at 180° C. for 1 hour using the cure drying oven, the resultant with the resin composition layer cured was prepared.

Next, the single-sided flexible substrate with the blind vias formed was positioned in a respective predetermined position of each of upper and lower both sides of the core substrate. Then, without placing the reinforcing material or rubber on upper and lower both-side SUS surface plates of the vacuum press apparatus, lamination was performed at 120° C. with 4.0 MPa for 5 minutes to bond, and a multilayer flexible substrate was prepared. The resin flow amount from the vicinity was about 2.5 mm. Next, blind via plating was performed in the same manner as in the multilayer flexible wiring board to complete electric connection. Performed next was the same circuit formation step as in the conventional multilayer flexible wiring board.

Table 9 shows the composition of the resin composition, press conditions, resin flow amount and evaluation results.

In evaluations of resin embeddability in the inner layer core substrate and surface smoothness on the copper wiring circuit of thus manufactured multilayer flexible wiring board, voids were confirmed in resin embedding in the through hole of the inner layer substrate. Further, also for surface smoothness, the difference in the substrate thickness between on the copper wiring and between wiring was 10 μm or more. Furthermore, in a part of the chip resistors subjected to part mounting, fillet failure was confirmed in the solder mounting portion. Still furthermore, interlayer insulation reliability was evaluated and was failure. It is presumed that when pressurization was performed with SUS surface plates without using the reinforcing material and the rubber material, following capability of the surface was not achieved at all, and that it was not possible to provide smoothness. Further, it is presumed that the resin flow amount was large, a portion with the film thickness being extremely thin existed inside the surface, and that interface insulation failure thereby occurred.

TABLE 9

|  |  |  | Example |  |  |  |  |  | Comparative Example |  |  |
|---|---|---|---|---|---|---|---|---|---|---|---|
|  |  |  | 38 | 39 | 40 | 41 | 42 | 43 | 22 | 23 | 24 |
| Composition · Mass % | Polyimide | Polyimide R |  | 60 | 60 | 60 | 60 |  |  | 60 | 60 |
|  |  | Polyimide S |  |  |  |  |  | 69 | 69 |  |  |
|  | Novolac | Phenol novolac A | 63 |  |  |  |  |  |  |  |  |
|  | Crosslinking agent | PBO | 12 | 15 | 15 | 15 | 15 | 6 | 6 | 15 | 15 |
|  | Flame Retardant | Phosphazene A | 25 | 6 | 6 | 6 | 6 | 25 | 25 | 6 | 6 |
|  |  | Phosphazene B |  | 18 | 18 | 18 | 18 |  |  | 18 | 18 |
|  | Other | IRG245 |  | 1 | 2 | 2 | 2 |  |  | 2 | 2 |
| Press | Temperature(° C.) |  | 120 | 100 | 120 | 100 | 100 | 100 | 120 | 120 | 120 |
|  | Pressure(MPa) |  | 1.0 | 1.0 | 1.0 | 1.0 | 1.0 | 1.0 | 4.0 | 4.0 | 4.0 |
|  | Time(sec) |  | 300 | 120 | 120 | 120 | 120 | 120 | 300 | 300 | 300 |
|  | Reinforcing material |  | With | With | With | With | With | With | Without | Without | Without |
|  | Rubber hardness |  | 50 | 50 | 50 | 30 | 70 | 50 | 50 | 50 | SUS |
| Resin flow amount(mm) |  |  | 0.05 | 0.08 | 0.15 | 0.06 | 0.1 | 0.05 | 1.3 | 1.5 | 2.5 |
| Evaluation | Surface smoothness(μm) |  | ○ | ◎ | ○ | ○ | ○ | ○ | X | X | X |
|  | Part mountability |  | ○ | ○ | ○ | ○ | ○ | ○ | X | X | X |
|  | Interlayer insulation |  | ○ | ○ | ○ | ○ | ○ | ○ | X | X | X |

INDUSTRIAL APPLICABILITY

The present invention is capable of being suitably used particularly for surface protective films of semiconductor devices, interlayer insulating films, bonding sheets, protective insulating films for printed wiring boards and substrates for printed wiring boards.

The present application is based on Japanese Patent Application No. 2012-010515 filed on Jan. 20, 2012, Japanese Patent Application No. 2012-71172 filed on Mar. 27, 2012, and Japanese Patent Application No. 2012-252578 filed on Nov. 16, 2012. Entire contents thereof and entire contents of Japanese Unexamined Patent Publication No. 2002-114981 and International Publication No. 2005/019231 Pamphlet cited in the present Description are expressly incorporated by reference herein.

The invention claimed is:

1. A resin composition containing:
   (A) a polyimide having acidic functional groups; and
   (B) a compound having functional groups that react with the acidic functional groups,
   wherein (a) a solution rate of the resin composition in 3 mass % aqueous sodium hydroxide at 45° C. is 0.95 or more after a heat history of 90° C. for 10 minutes with the solution rate before the heat history assumed to be 1,
   wherein (b) the solution rate of the resin composition in 3 mass % aqueous sodium hydroxide at 45° C. ranges from 0.001 μm/sec to 0.02 μm/sec after a heat history of 180° C. for 60 minutes,
   wherein (c) a bleed-out amount of the resin composition is 50 mg/m$^2$ or less in storing at 40° C. for 2 weeks after the heat history of 180° C. for 60 minutes, and
   wherein (d) a thermogravimetric decrease at 260° C. is 2.0% or less in measuring on a temperature rising condition of 10° C./min from 40° C. by thermogravimetric analysis (TG), and
   wherein the resin composition includes a flame retardant, the flame retardant including a phosphorus-containing compound.
   wherein the phosphorus-containing is a phosphazene.

2. The resin composition according to claim 1, wherein the solution rate of the resin composition in 3 mass % aqueous sodium hydroxide at 45° C. is 0.10 μm/sec or more before the heat history.

3. The resin composition according to claim 1, wherein the acidic functional groups of the polyimide (A) are of structure containing phenolic hydroxyl groups.

4. The resin composition according to claim 1, wherein the compound (B) is of structure containing oxazoline groups.

5. A resin composition solution wherein the solution is obtained by dissolving the resin composition according to claim 1 in an organic solvent.

6. A layered product comprising:
   a substrate; and
   the resin composition according to claim 1 provided on the substrate.

7. The layered product according to claim 6, wherein the substrate is a carrier film.

8. The layered product according to claim 6, further comprising:
   a cover film provided on the resin composition.

9. The layered product according to claim 6, wherein the substrate is a conductive material.

10. The layered product according to claim 9, wherein the conductive material is copper foil.

11. A multilayer printed wiring board comprising:
    a substrate having wiring; and
    the resin composition according to claim 1 provided to cover the wiring.

12. The multilayer printed wiring board according to claim 11, wherein the board is in the shape of a roll.

13. A resin composition containing:
    (A-1) a polyimide having a structure expressed by following general formula (1) as a polyimide having phenolic hydroxyl groups;
    (B-1) an oxazoline compound, and
    a flame retardant, the flame retardant including a phosphorus-containing compound, wherein the phosphorus-containing compound is a phosphazene, and

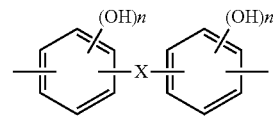

formula (1)

wherein In formula (1), X represents a single bond or —C(CF$_3$)$_2$—, and n represents an integer of from 1 to 4.

14. The resin composition according to claim 13, wherein the polyimide has a structure expressed by following general formula (2),

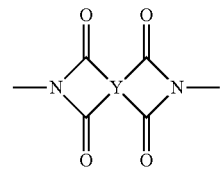

formula (2)

wherein In formula (2), Y represents a tetravalent organic group containing an aromatic group and/or an alicyclic group.

15. The resin composition according to claim 13, wherein a ratio (hydroxyl group/oxazoline group) of the hydroxyl groups that the polyimide has to the oxazoline groups that the oxazoline compound (B-1) has is in the range of 4.0 to 0.5.

16. The resin composition according to claim 13, wherein the polyimide further has a structure of following general formula (3),

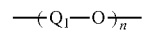

formula (3)

wherein in formula (3), Q$_1$ represents an alkylene group with the carbon number of from 1 to 18, m is an integer of 1 or more, and Q$_1$ may be different from one another for each repetition unit of m.

17. The resin composition according to claim 16, wherein the structure of general formula (3) is contained in an amount of 25 to 55 mass % relative to all mass of the polyimide.

18. The resin composition according to claim 16, wherein the composition contains a structure in which Q$_1$ in the general formula (3) in the polyimide is a linear tetramethylene group.

19. The resin composition according to claim 13, wherein the polyimide is terminally blocked with a terminal blocking agent comprised of a monoamine derivative or a carboxylic acid derivative.

20. The resin composition according to claim 13, wherein a bleed-out amount is 50 mg/m$^2$ or less in storing at 40° C. for 2 weeks after a heat history of 180° C. for 60 minutes.

21. The resin composition according to claim 13, wherein a content of (C) a polyfunctional hydroxyl group-containing compound having two or more hydroxyl groups ranges from 0 to 3 mass %.

* * * * *